US012707652B2

(12) United States Patent
Lin et al.

(10) Patent No.: US 12,707,652 B2
(45) Date of Patent: Aug. 11, 2026

(54) CAPACITOR AND METHOD FOR FORMING THE SAME

(71) Applicants: TAIWAN SEMICONDUCTOR MANUFACTURING COMPANY, LTD., Hsinchu (TW); NATIONAL YANG MING CHIAO TUNG UNIVERSITY, Hsinchu City (TW)

(72) Inventors: Hsin-Cheng Lin, Taipei City (TW); Tao Chou, New Taipei City (TW); Chee-Wee Liu, Taipei City (TW)

(73) Assignees: TAIWAN SEMICONDUCTOR MANUFACTURING COMPANY, LTD., Hsinchu (TW); NATIONAL YANG MING.CHIAO TUNG UNIVERSITY, Hsinchu City (TW)

( * ) Notice: Subject to any disclaimer, the term of this patent is extended or adjusted under 35 U.S.C. 154(b) by 653 days.

(21) Appl. No.: 18/153,831

(22) Filed: Jan. 12, 2023

(65) Prior Publication Data

US 2024/0243165 A1 Jul. 18, 2024

(51) Int. Cl.
*H01L 23/522* (2006.01)
*H10D 1/00* (2025.01)
*H10D 1/68* (2025.01)
*H10W 20/40* (2026.01)

(52) U.S. Cl.
CPC ............ *H10D 1/042* (2025.01); *H10D 1/714* (2025.01); *H10D 1/716* (2025.01); *H10W 20/496* (2026.01)

(58) Field of Classification Search
CPC ........ H10D 1/042; H10D 1/176; H10D 1/174; H10D 1/714; H10W 20/496
See application file for complete search history.

(56) References Cited

U.S. PATENT DOCUMENTS

2005/0104110 A1* 5/2005 Yeo ........................ H10D 1/716 257/306
2009/0273882 A1* 11/2009 Park ....................... H10D 1/694 361/305
2013/0005110 A1* 1/2013 Yoon ...................... H10D 1/716 438/381
2020/0176535 A1* 6/2020 Eom .................. H10K 59/1213
2021/0313116 A1* 10/2021 Verma .................... H01G 4/012
2023/0019692 A1* 1/2023 Gardner ................. H10B 12/05

OTHER PUBLICATIONS

Lili Cheng et al., "Robust BEOL MIMCAP for Long and Controllable TDDB Lifetime", Mar. 2019 IEEE International Reliability Physics Symposium (IRPS).

(Continued)

*Primary Examiner* — John A Bodnar
(74) *Attorney, Agent, or Firm* — Maschoff Brennan

(57) ABSTRACT

A method includes forming a sacrificial multi-layer stack including first, second, and third sacrificial layers stacked in a vertical direction on a substrate; removing the first sacrificial layer to form a first space; depositing a first dielectric layer and a first electrode material in the first space; removing the second sacrificial layer to form a second space; depositing a second dielectric layer and a second electrode material in the second space; removing the third sacrificial layer to form a third space; depositing a third dielectric layer and a third electrode material in the third space.

20 Claims, 73 Drawing Sheets

(56) References Cited

OTHER PUBLICATIONS

Chit Hwei Ng et al., "MIM Capacitor Integration for Mixed-Signal/RF Applications", IEEE Transactions on Electron Devices, vol. 52, No. 7, Jul. 2005, pp. 1399-1409.
C.-Y. Lin et al., "Reliability Characteristics of a High Density Metal-Insulator-Metal Capacitor on Intel's 10+ Process" Apr. 2020 IEEE International Reliability Physics Symposium (IRPS).
Sheikh Rashel Al Ahmed et al., "Characterization of Low-Dielectric Constant Silicon Carbonitride (SiCN) Dielectric Films for Charge Trapping Nonvolatile Memories", ECS Transactions, vol. 69, No. 3, Sep. 2015, pp. 99-109.
T R Lenka et al., "AlGaN/GaN-based HEMT on SiC substrate for microwave characteristics using different passivation layers", PRAMANA—journal of physics, vol. 79, No. 1, Jul. 2012, pp. 151-163.
Jalal Azadmanjiri et al., "A review on hybrid nanolaminate materials synthesized by deposition techniques for energy storage applications" Journal of Materials Chemistry A, 2014, vol. 2, pp. 3695-3708.
Kai Ni et al., "A Novel Ferroelectric Superlattice Based Multi-Level Cell Non-Volatile Memory", Dec. 2019 IEEE International Electron Devices Meeting (IEDM), pp. 28.8.1-28.8.4.
M. Venkata Ramana et al., "Nanocrystalline Pb(Zr0.52Ti0.48)O3 Ferroelectric Ceramics: Mechanical and Electrical Properties", Journal of Nanomaterials, vol. 2010, Article ID 783043, p. 1-8; Mar. 2010.
G. Alarcó n-Flores et al., "Low interface states and high dielectric constant Y203 films on Si substrates", Journal of Vacuum Science & Technology B: Microelectronics and Nanometer Structures Processing, Measurement, and Phenomena 24, Jul. 2006, pp. 1873-1877.
Takashi Hayashi et al., "Film Thickness Dependence of Dielectric Properties of BaTiO3 Thin Films Prepared by Sol-Gel Method", Japanese Journal of Applied Physics, vol. 33, No. 9S, 1994, pp. 5277-5280.

* cited by examiner

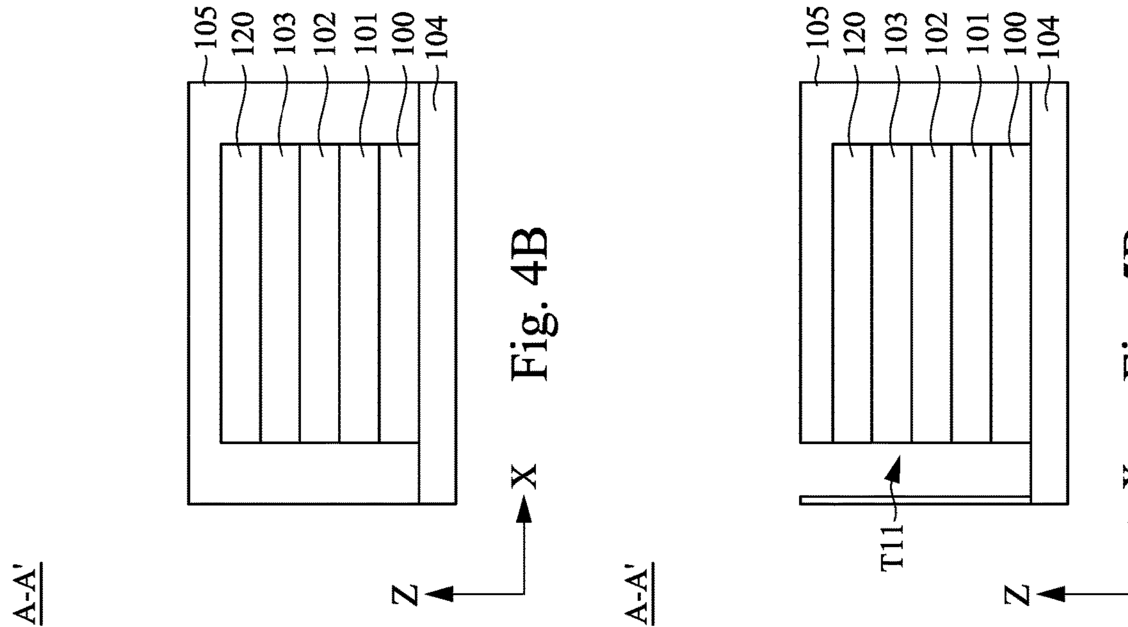
Fig. 4B
Fig. 5B
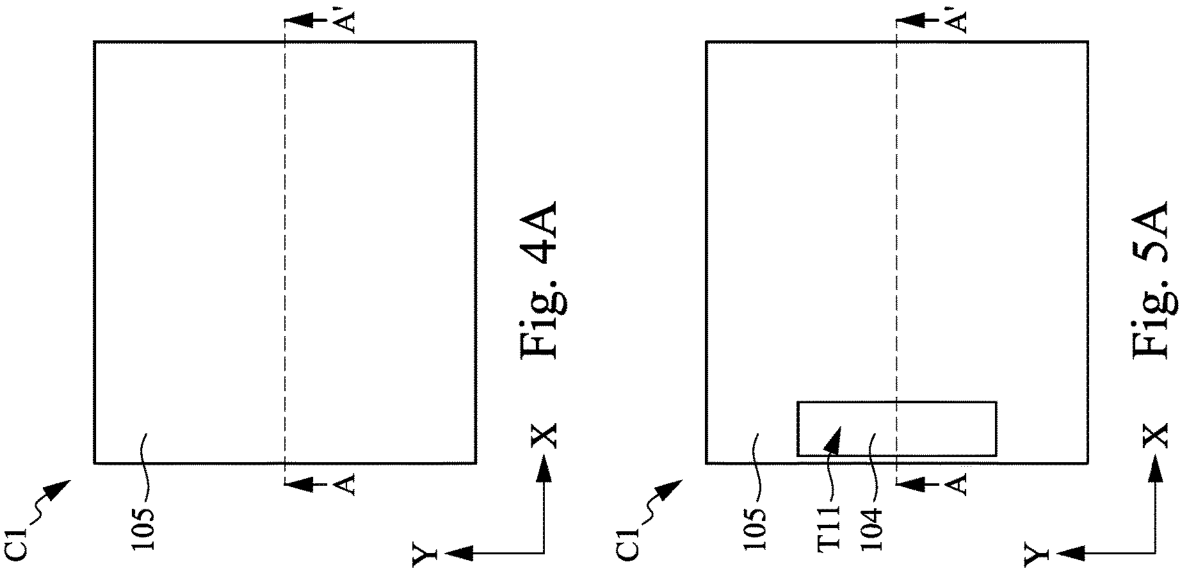
Fig. 4A
Fig. 5A

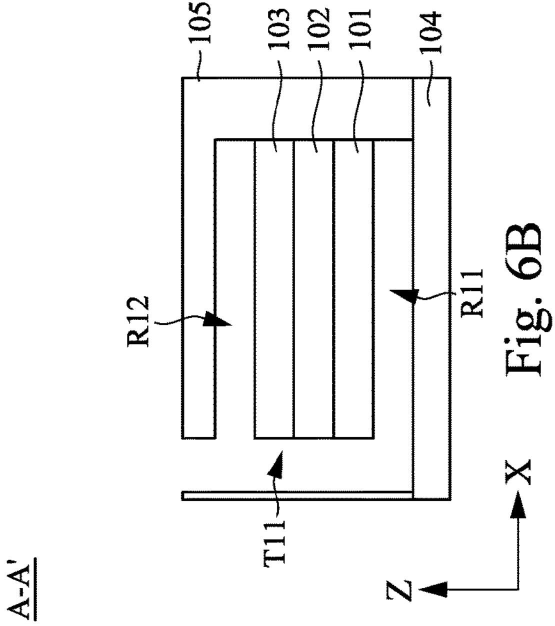
Fig. 6B
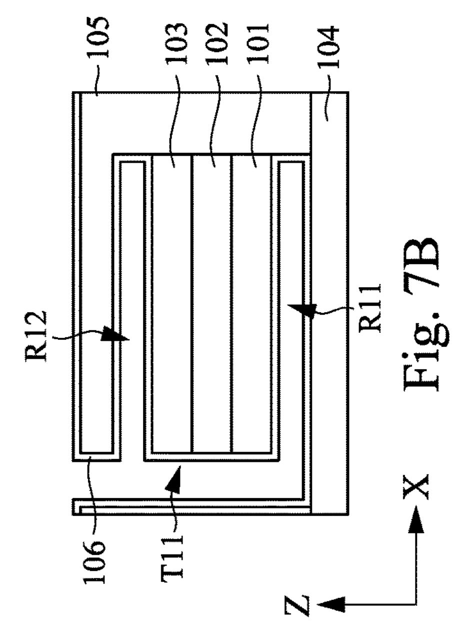
Fig. 7B
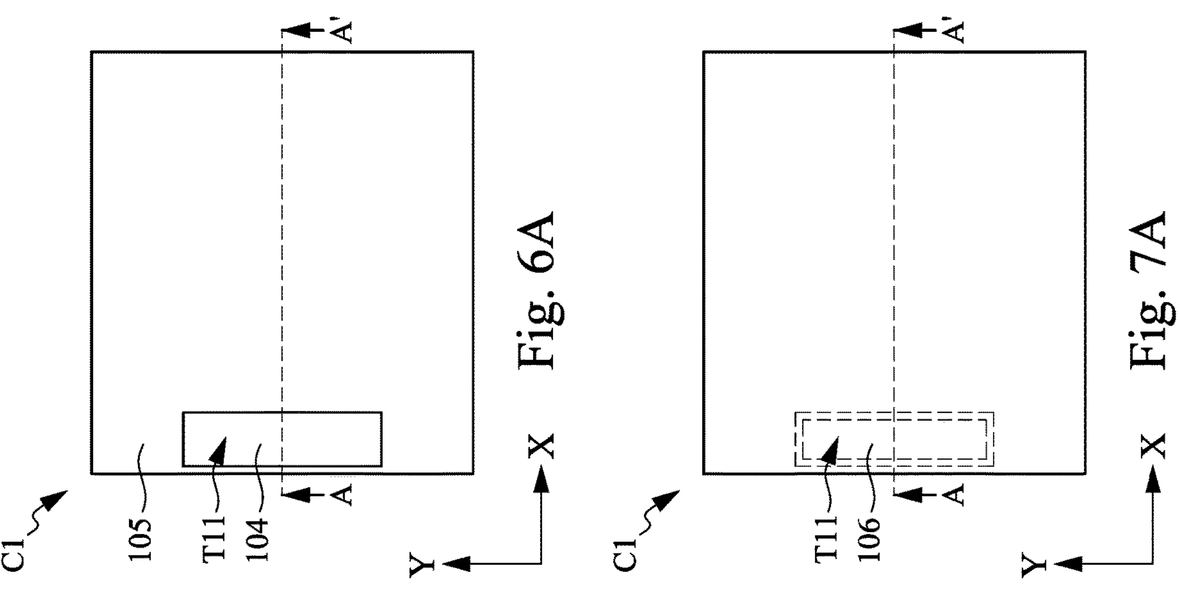
Fig. 6A
Fig. 7A

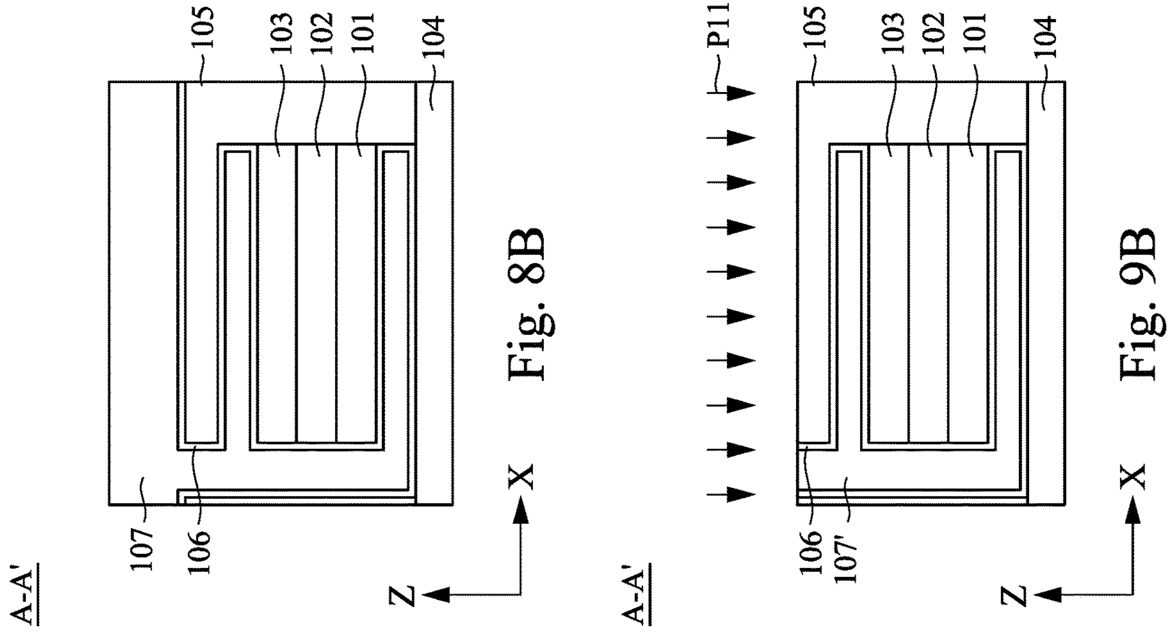
A-A'
107
106
105
103
102
101
104
Z
X
Fig. 8B
A-A'
P11
106
107'
105
103
102
101
104
Z
X
Fig. 9B
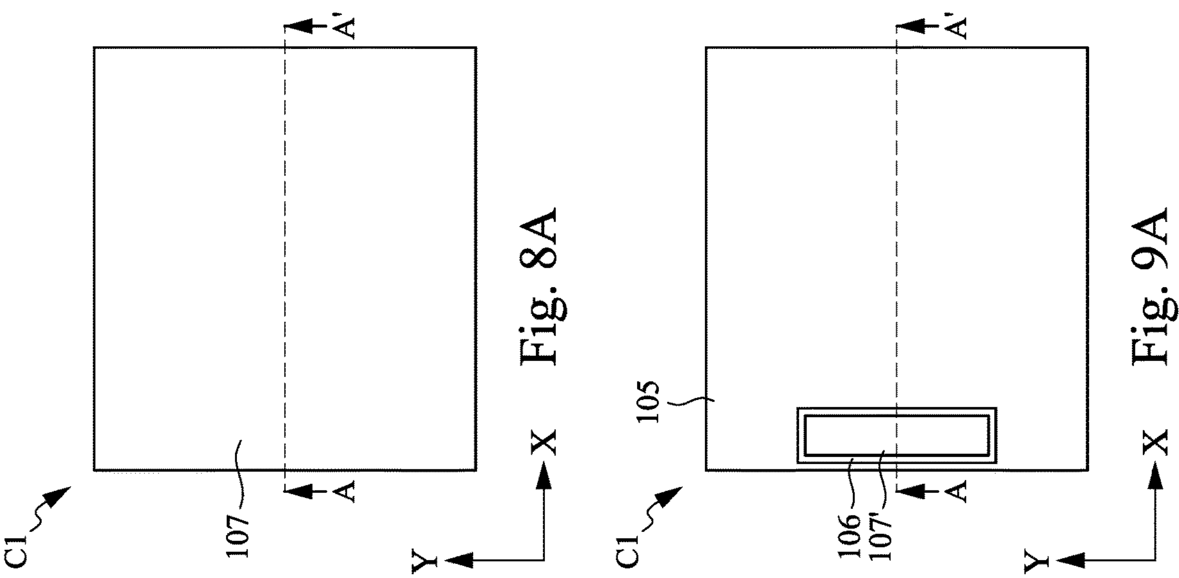
C1
107
A
A'
Y
X
Fig. 8A
C1
106
107'
105
A
A'
Y
X
Fig. 9A

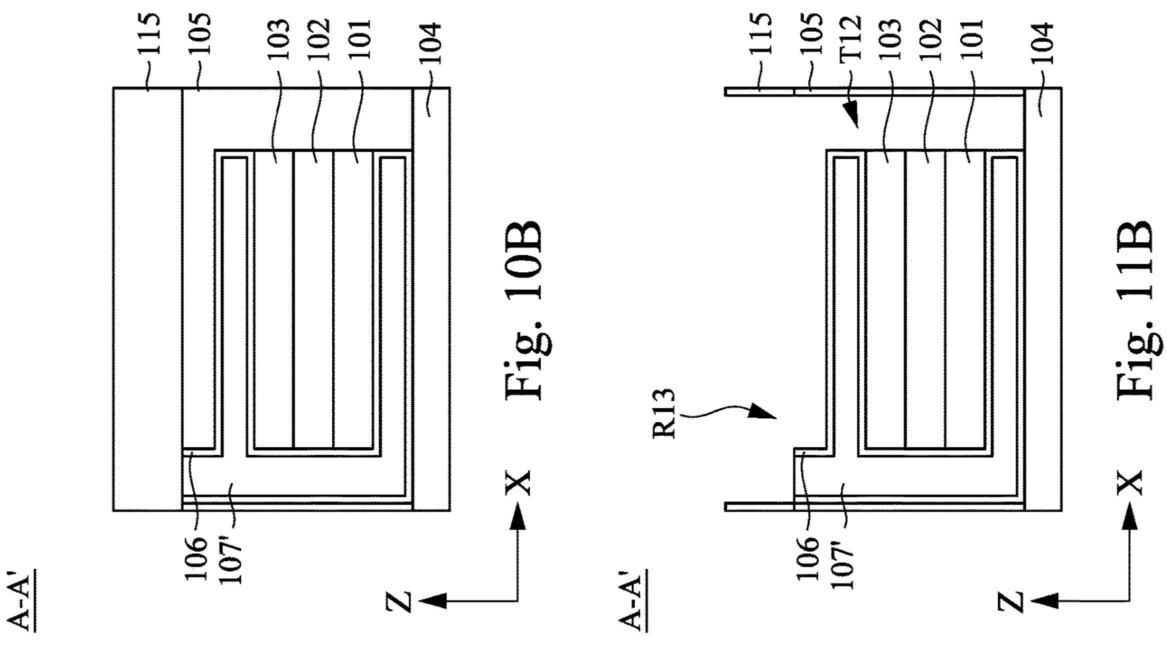
Fig. 10B
Fig. 11B
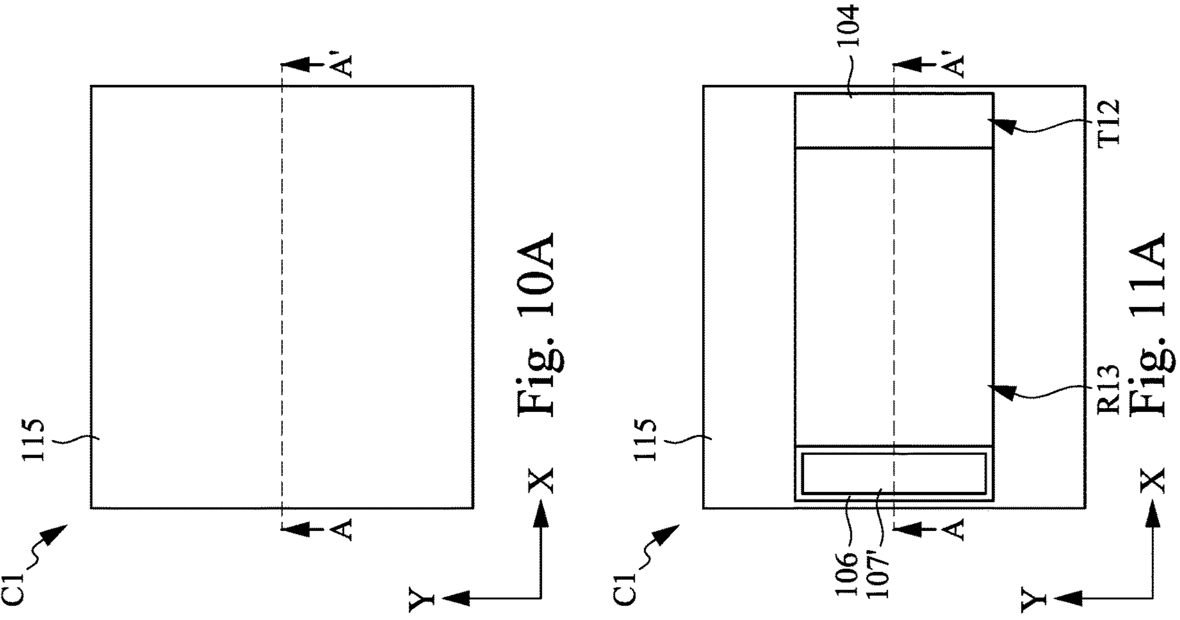
Fig. 10A
Fig. 11A

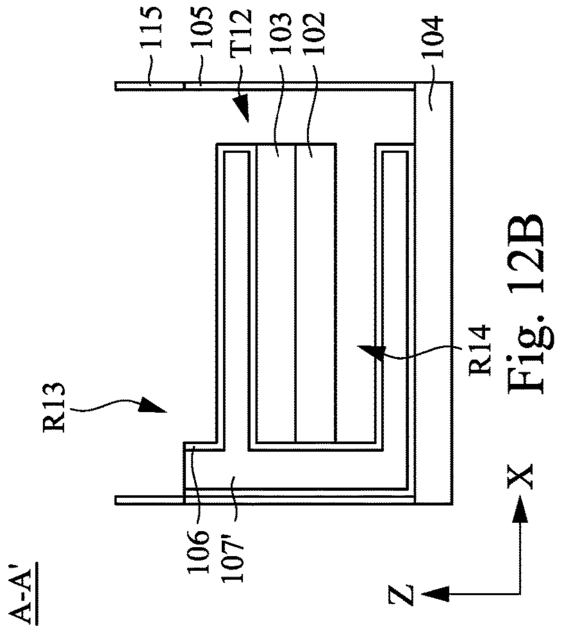
Fig. 12B
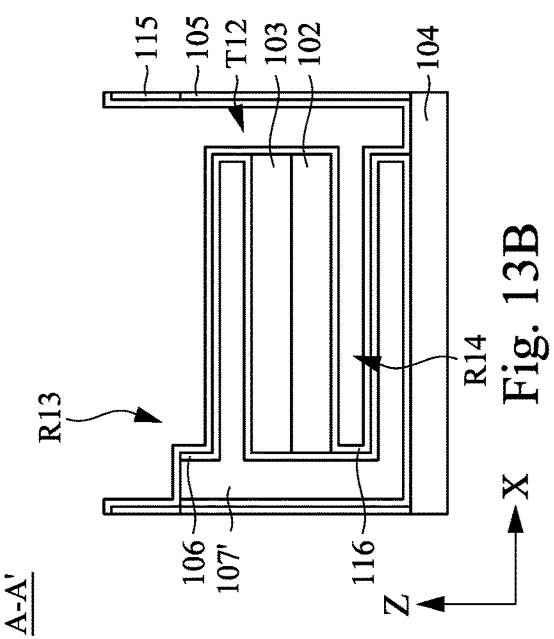
Fig. 13B
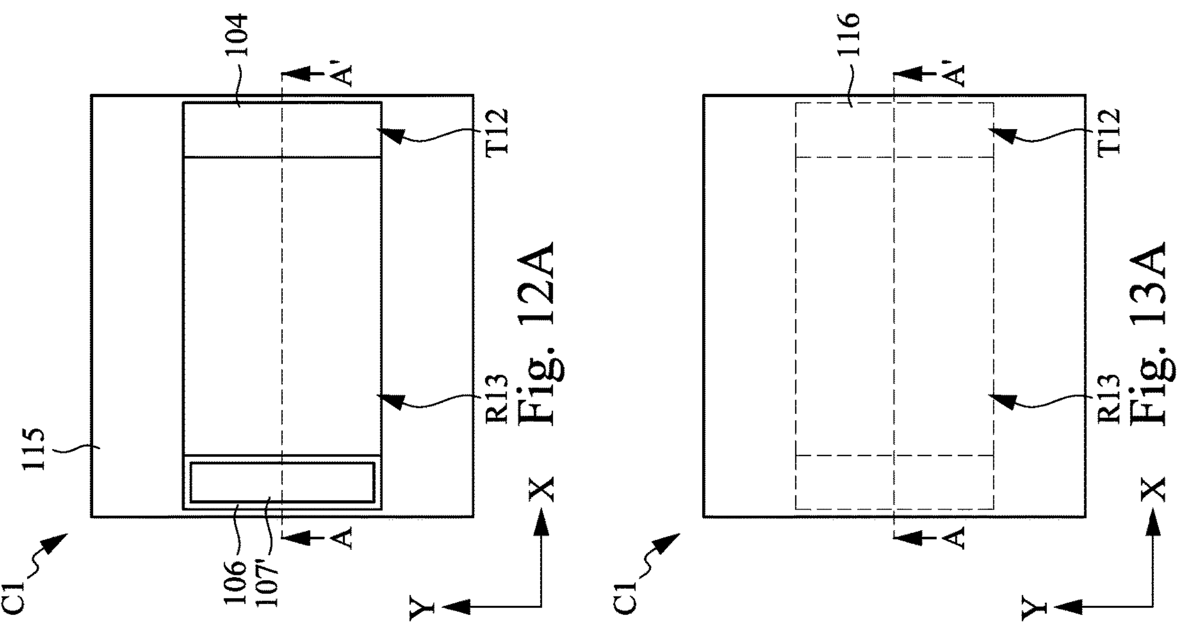
Fig. 12A
Fig. 13A

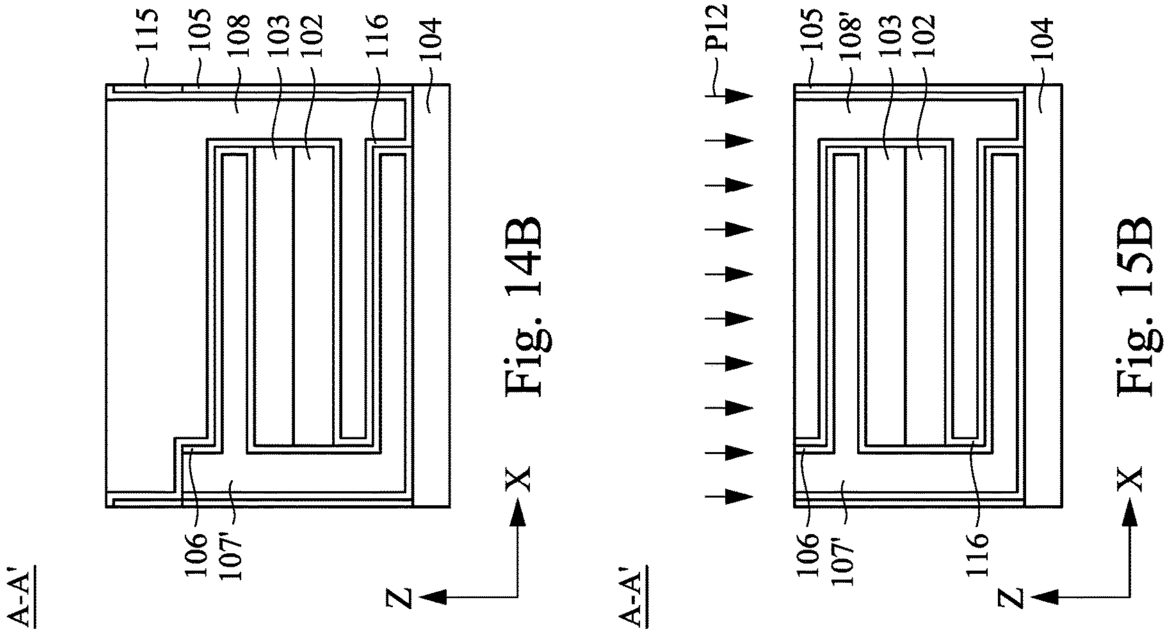
Fig. 14B
Fig. 15B
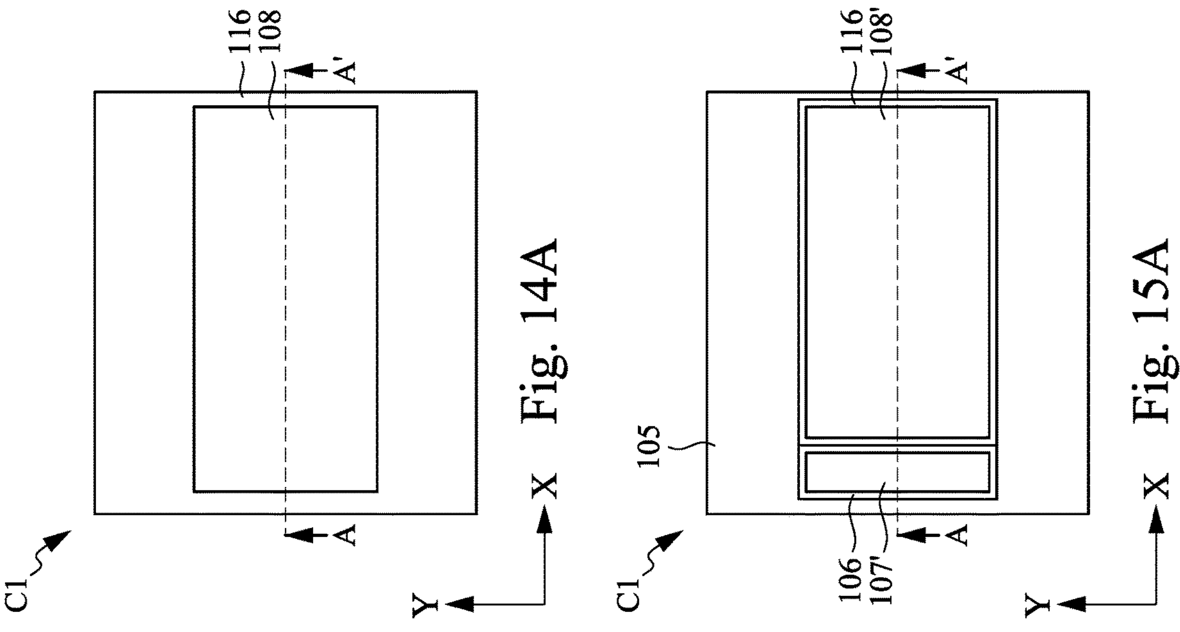
Fig. 14A
Fig. 15A

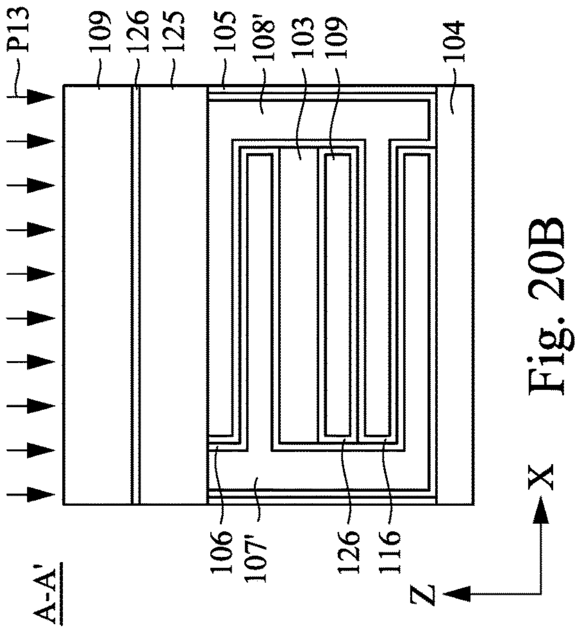
Fig. 20B
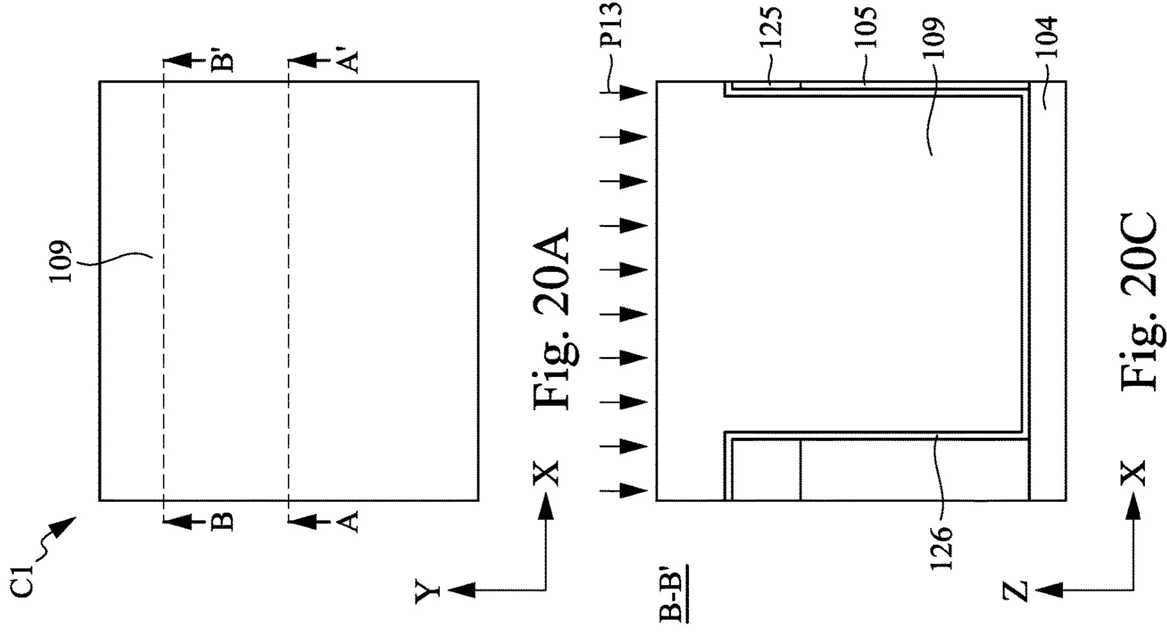
Fig. 20A
Fig. 20C

A-A'
111
108'
110'
109'
104
112b
112a
O11
106
107'
136
126
116
Z
X

C-C'
111
110'
104
112d
O11
136
Z
X

C1
111
O11
112c
112b
112d
B'
A'
C'
B
A
C
112a
Y
X

B-B'
111
109'
104
112c
O11
126
Z
X

CAPACITOR AND METHOD FOR FORMING THE SAME

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 29D illustrate schematic views of intermediate stages in the formation of a vertically stacked multi-layer MIM capacitor in an integrated circuit in accordance with some embodiments of the present disclosure.

FIGS. 30A to 57D illustrate schematic views of intermediate stages in the formation of a vertically stacked multi-layer MIM capacitor in an integrated circuit in accordance with some embodiments of the present disclosure.

DETAILED DESCRIPTION

Figure 1:
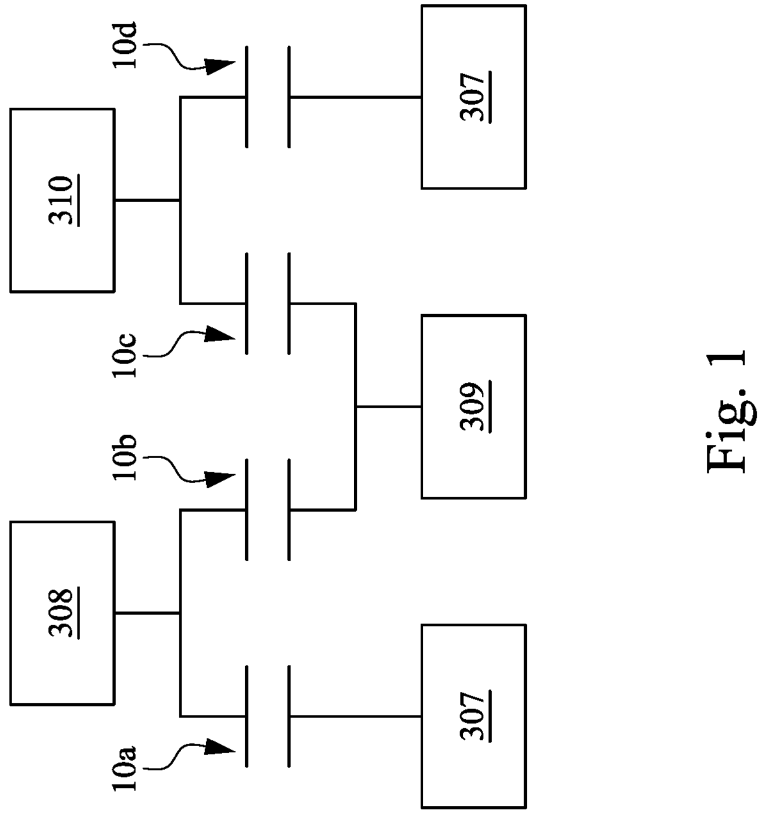
FIG. 1 is a schematic diagram illustrating a capacitor circuit formed by a plurality of electrodes in a vertically stacked multi-layer MIM capacitor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to improve the capacitance of a metal-insulator-metal (MIM) capacitor in the integrated circuit (IC) structure, the MIM capacitor may be in the form of a multi-layer structure with a plurality of through vias penetrating thereof to increase the capacitance. However, the MIM capacitor in the form of the multi-layer structure with the through vias penetrating thereof may need additional through vias to connect the electrode layers therein, and each layer of the MIM capacitor may need at least one patterning process to form thereof, which will result in additional costs and increase the space occupied by the related components in the MIM capacitor.

Therefore, the present disclosure in various embodiments provides a vertically stacked multi-layer MIM capacitor that includes vertically stacked interleaved electrodes. An advantage is that the vertically stacked interleaved electrodes of the capacitor can increase the overlap area therebetween, such that the capacitance of the capacitor can be improved. Another advantage is that vertically stacked multi-layer MIM capacitor can include multiple electrodes that can adjust capacitance depending on providing different voltage potentials to the electrodes thereof.

Figures 2A, 2B:
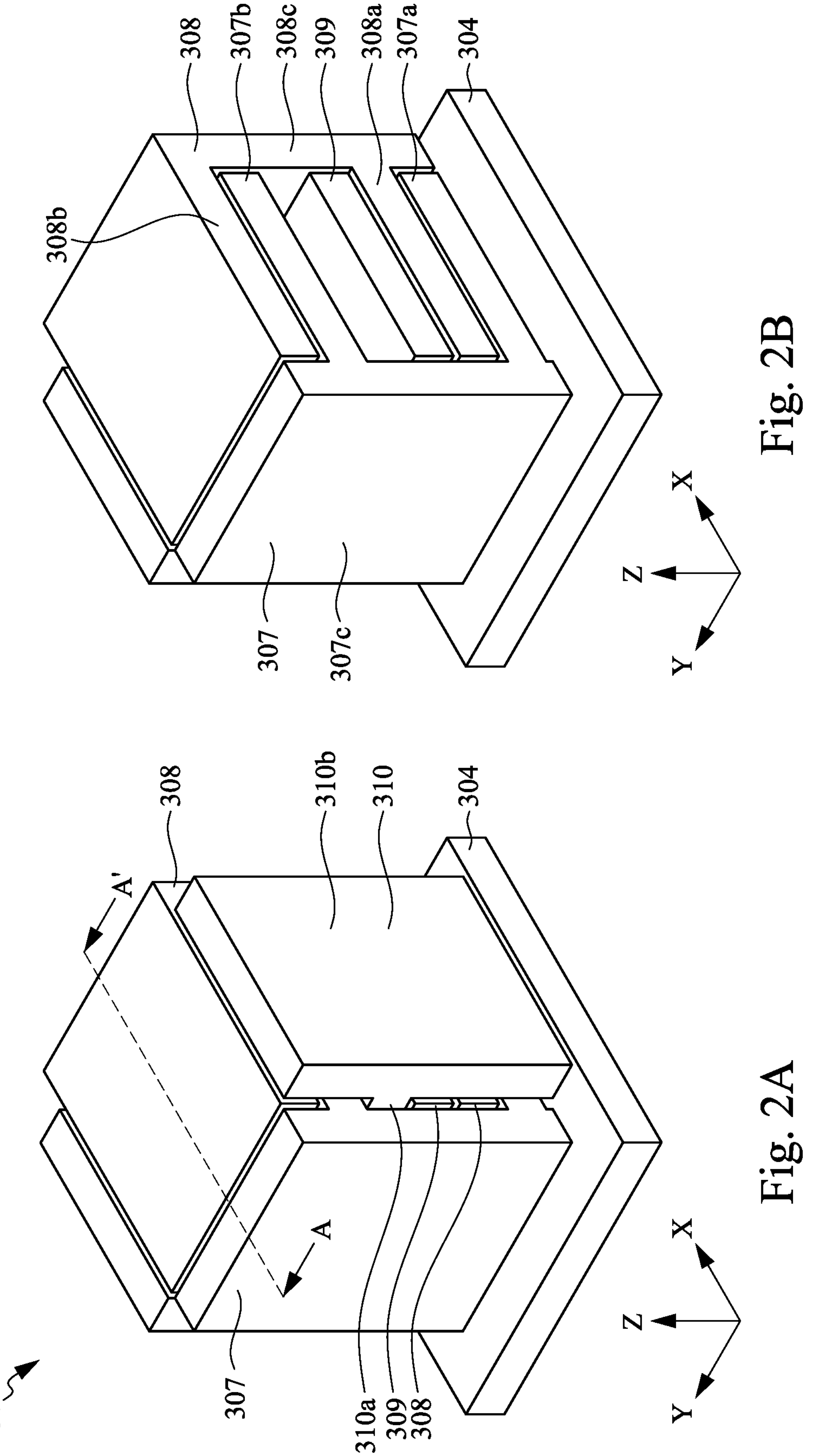
FIGS. 2A-2F illustrate schematic views of a vertically stacked multi-layer MIM capacitor in accordance with some embodiments of the present disclosure.
Figures 2C, 2D:
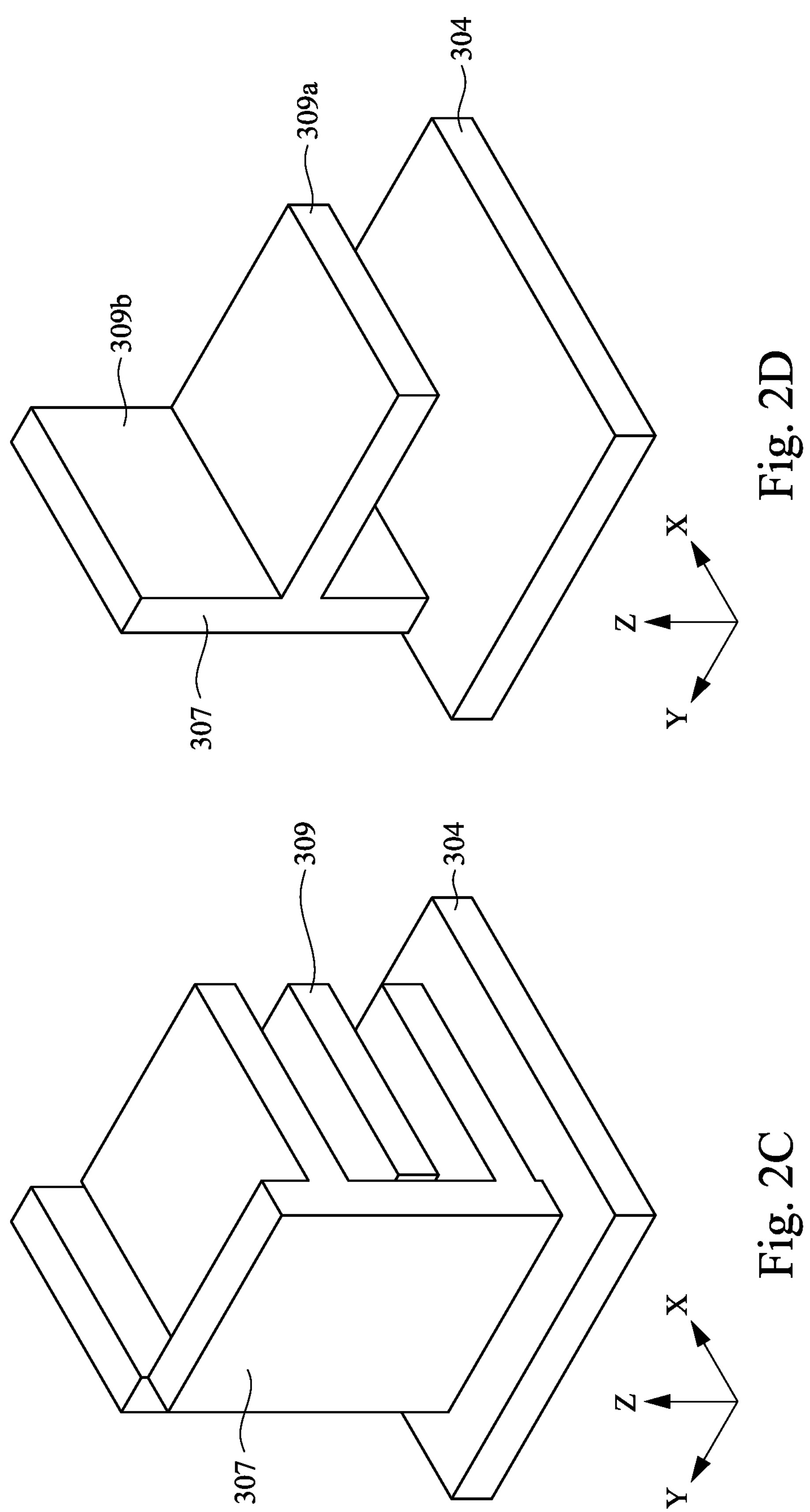
Figure 2F:
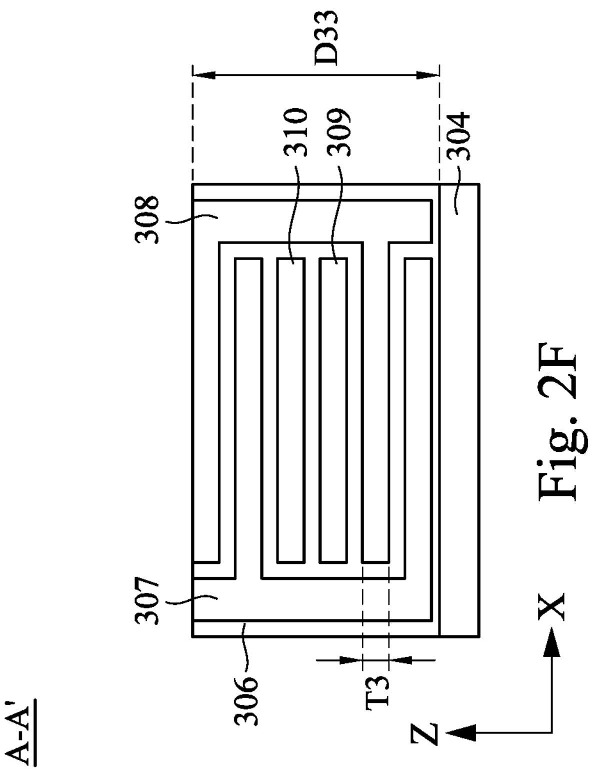

Reference is made to FIGS. 1 to 2F. FIG. 1 is a schematic diagram illustrating a capacitor circuit 10 formed by a plurality of electrodes in a vertically stacked multi-layer MIM capacitor C0 (see FIG. 2A) in accordance with some embodiments of the present disclosure. FIGS. 2A-2D illustrate perspective views of different combinations of electrodes 307, 308, 309, and 310 in the vertically stacked multi-layer MIM C0 on a dielectric layer 304 in accordance with some embodiments of the present disclosure. FIG. 2E illustrates a top view of the vertically stacked multi-layer MIM C0 in FIG. 2A. FIG. 2F illustrates a cross-sectional view obtained from the reference cross-sections A-A' in FIG. 2A. In FIG. 1, the capacitor circuit 10 may include multiple capacitors, such as capacitors 10*a*, 10*b*, 10*c*, and 10*d*. Referring to FIGS. 2A-2D, the capacitor 10*a* can be formed by the electrodes 307 and 308, the capacitor 10*b* can be formed by the electrodes 308 and 309, the capacitor 10*c* can be formed by the electrodes 309 and 310, and the capacitor 10*d* can be formed by the electrodes 310 and 307. The capacitance formed by the capacitors 10*a*, 10*b*, 10*c*, and 10*d* may be in correlation with the voltage potentials providing to the electrodes 307, 308, 309, and 310 (see FIGS. 2A-2D) of the vertically stacked multi-layer MIM C0, and thus the voltage potentials can be selected depending on a desired capacitance of the capacitor circuit 10. Therefore, the total capacitance of the capacitor circuit 10 can be tuned by adjusting one or more of the capacitance of the capacitors 10*a*, 10*b*, 10*c*, and 10*d*.

As shown in FIGS. 2A-2F, the vertically stacked multi-layer MIM C0 may include the electrodes 307, 308, 309, and 310 and an insulator 306 (see FIG. 2F) sandwiched between any two of the electrodes 307, 308, 309, and 310. In other words, any two of the electrodes 307, 308, 309, and 310 can be spaced apart from each other by the insulator 306 (see FIG. 2F). In some embodiments, the insulator 306 may have a thickness in a range from about 0.1 nm to about 100 nm, such as about 0.1, 1, 10, or 100 nm. In some embodiments, the vertically stacked multi-layer MIM capacitor C0 may have a lateral dimension D31 (see FIG. 2E) in X-direction and in a range from about 1 nm to about 10 mm, such as about 1 nm, 10 nm, 100 nm, 1 μm, 10 μm, 100 μm, 1 mm, or 10 mm. In some embodiments, the vertically stacked multi-layer MIM capacitor C0 may have a lateral dimension D32 (see FIG. 2E) in Y-direction and in a range from about 1 nm to about 10 mm, such as about 1 nm, 10 nm, 100 nm, 1 μm, 10 μm, 100 μm, 1 mm, or 10 mm. In some embodiments, the vertically stacked multi-layer MIM capacitor C0 may have a vertical dimension D33 (see FIG. 2F) in Z-direction and in a range from about 1 nm to about 10 mm, such as about 1 nm, 10 nm, 100 nm, 1 μm, 10 μm, 100 μm, 1 mm, or 10 mm. In some embodiments, from the top view, the vertically stacked multi-layer MIM capacitor C0 may be a cylinder, cuboid, thin film, or any suitable geometry, with or without rounded corners.

Figure 2E:
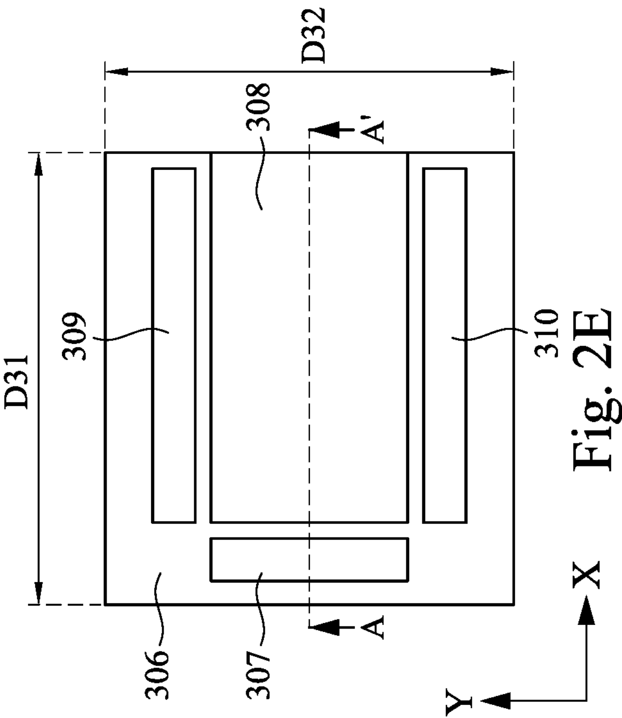

This is described in greater detail with reference to FIG. 2B, the electrode 307 can include two lateral portions 307*a* and 307*b* and one vertical portion 307*c*. The lateral portions 307*a* and 307*b* can laterally extend from the vertical portion 307*c* in X-direction, and the vertical portion 307*c* can laterally extend in Y-direction from the top view as shown in FIG. 2E. The electrode 308 can include two lateral portions 308*a* and 308*b* and interleaving with the lateral portions 307*a*, 307*b* and one vertical portion 308*c*. The lateral portions 308*a* and 308*b* can laterally extend from the vertical portion 308*c* in X-direction and toward the vertical portion 307*c* of the electrode 307, and the vertical portion 308*c* can laterally extend in Y-direction. With reference to FIGS. 2A and 2D, the electrode 309 can include one lateral portion 309*a* interposing the lateral portion 308*a* of the electrode 308 and the lateral portions 307*b* of the electrode 307 and include one vertical portion 309*b*. The lateral portion 309*a* can laterally extend from the vertical portion 309*b* in Y-direction, and the vertical portion 309*b* can laterally extend in X-direction from the top view as shown in FIG. 2E. With reference to FIG. 2A, the electrode 310 can include one lateral portion 310*a* interposing the lateral portion 109*a* of the electrode 309 and the lateral portions 307*b* of the electrode 307 and one vertical portion 310*b*. The lateral portion 309*a* can laterally extend from the vertical portion 309*b* in Y-direction and toward the vertical portion 308*b* of the electrode 308, and the vertical portion 309*b* can laterally extend in X-direction from the top view as shown in FIG. 2E. In some embodiments, at least two of the lateral portions 307*a*, 307*b*, 308*a*, 308*b*, 309*a*, and 310*a* may have different thicknesses. In some embodiments, at least two of the lateral portions 307*a*, 307*b*, 308*a*, 308*b*, 309*a*, and 310*a* may have a same thickness. The capacitance formed by the electrodes 307, 308, 309, and 310 may be in correlation with a thickness T3 (see FIG. 2F) of the electrodes 307, 308, 309, and 310, and thus the thickness T3 can be selected depending on a desired capacitance of the vertically stacked multi-layer MIM capacitor C0. By way of example and not limitation, the lateral portions 307*a*, 307*b*, 308*a*, 308*b*, 309*a*, and/or 310*a* may have the thickness T3 in a range from about 0.1 nm to about 1 μm, such as about 0.1, 1, 10, 100, or 1000 nm.

Therefore, the present disclosure in various embodiments provides a vertically stacked multi-layer MIM capacitor C0 that includes vertically stacked interleaved lateral portions 307*a*, 307*b*, 308*a*, 308*b*, 309*a*, and 310*a* (see FIGS. 2A-2D). An advantage is that the capacitor C0 including vertically stacked interleaved electrodes can increase the overlap area therebetween, such that the capacitance of the capacitor C0 can be improved. In addition, the capacitor C0 may include multiple electrodes that can adjust capacitance depending on providing different voltage potentials to the electrodes.

In some embodiments, the electrodes 307, 308, 309, and/or 310 of the capacitance of the capacitor C0 may be made of, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the dielectric layer 306 of the capacitance of the capacitor C0 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 306 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In some embodiments, the capacitance of the capacitor C0 may be formed on the dielectric layer 304. In some embodiments, the dielectric layer 304 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), polyimide, other suitable materials, or combinations thereof.

Reference is made to FIGS. 3A to 29D. FIGS. 3A to 29D illustrate schematic views of intermediate stages in the formation of a vertically stacked multi-layer MIM capacitor C1 in an integrated circuit in accordance with some embodiments of the present disclosure. FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 29A are top views of the integrated circuit in accordance with some embodiments of the present disclosure. FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, and 29B are cross-sectional views obtained from a vertical plane corresponding to line A-A' in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 29A, respectively. FIGS. 16C, 17C, 18C, 19C, 20C, 21C, 26C, 27C, 28C, and 29C are cross-sectional views obtained from a vertical plane corresponding to line B-B' in FIGS. 16A, 17A, 18A, 19A, 20A, 21A, 26A, 27A, 28A, and 29A, respectively. FIGS. 21D, 22C, 23C, 24C, 25C, 26D, 27D, 28D, and 29D are cross-sectional views obtained from a vertical plane corresponding to line C-C' in FIGS. 21A, 22A, 23A, 24A, 25A, 26A, 27A, 28A, and 29A, respectively.

Figure 3B:
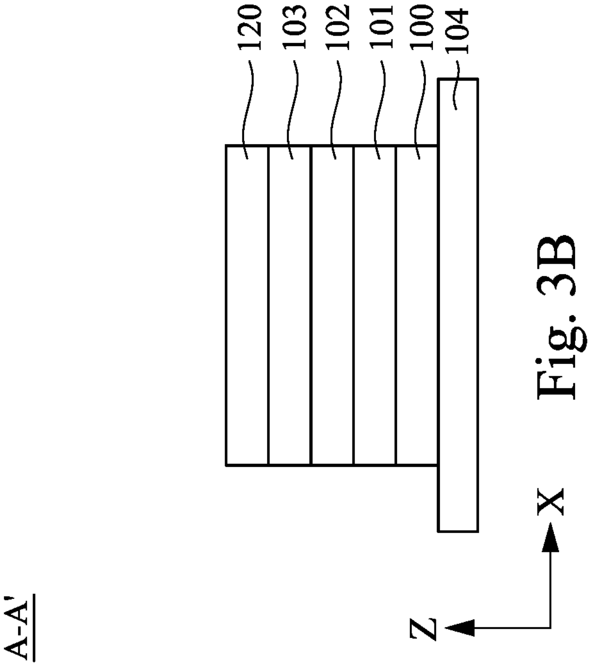
Figure 3A:
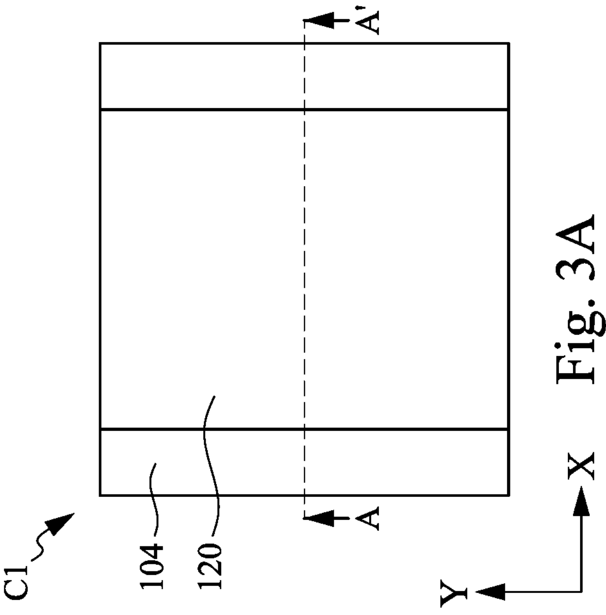

Reference is made to FIGS. 3A and 3B. A sacrificial multi-layer stack including sacrificial layers 100, 101, 102, 103, and 120 is formed over a dielectric layer 104 in sequence. In some embodiments, the dielectric layer 104 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), polyimide, other suitable materials, or combinations thereof. In some embodiments, the dielectric layer 104 may be made of low-K dielectric materials. In some embodiments, the dielectric layer 104 may be formed using flowable chemical vapor deposition (FCVD), spin-on coating, CVD, ALD, high-density plasma chemical vapor deposition (HDPCVD), LPCVD, the like, or a combination thereof. In some embodiments where FCVD is used to form the dielectric layer 104, a silicon-and nitrogen-containing precursor (for example, trisilylamine (TSA) or disilylamine (DSA)) is used, and hence the resulting dielectric layer 104 is flowable (jelly-like).

In some embodiments, as will be subsequently described in greater detail, the sacrificial layers 100, 101, 102, 103, and 120 will be removed in sequence as shown in FIGS. 6B, 13B, 18B, and 23B. In some embodiments, the sacrificial multi-layer stack includes five layers of the sacrificial layers. It should be appreciated that the sacrificial multi-layer stack may include any number of the sacrificial layer. By way of example but not limiting the present disclosure, a number of the sacrificial layers in the sacrificial multi-layer stack may be in a range from about 3 to about 1000.

The semiconductor material of the sacrificial layer 100 may be a material that has a different etching selectivity than the etching of the sacrificial layers 101, 102, and 103, and substantially has a same etching selectivity as the etching of the sacrificial layer 120. In other words, the sacrificial layers 100 may be formed of a different material than the sacrificial layers 101, 102, and 103, and may be formed of a same material as the sacrificial layer 120. For example, the sacrificial layer 100 may be formed of a first semiconductor material, and the sacrificial layers 101, 102, and 103 may be formed of second, third, and fourth semiconductor materials different from the first sacrificial layers 100, and the sacrificial layer 120 may be formed of the first semiconductor material as the sacrificial layer 100. In some embodiments, the sacrificial layer 100, 101, 102, 103, and/or 120 may be made of semiconductor materials selected from, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like.

By way of example but not limiting the present disclosure, the semiconductor materials of the sacrificial layers 100 and 120 may be silicon, and the semiconductor materials of the sacrificial layers 101, 102, and 103 may be silicon germanium (e.g., $Si_xGe_{1-x}$) and have germanium atomic concentrations different from each other. In some embodiments, the sacrificial layer 101 may have a higher germanium atomic concentration than the sacrificial layer 100, the sacrificial layer 102 may have a higher germanium atomic concentration than the sacrificial layer 101, and the sacrificial layer 103 may have a higher germanium atomic concentration than the sacrificial layer 102. For example, the sacrificial layer 100 may have a germanium atomic concentration less than about 10%, such as about 1, 2, 3, 4, 5, 6, 7, 8, 9, or 10%, the sacrificial layer 101 may have a germanium atomic concentration in a range from about 5% to about 35%, such as about 10, 15, 20, 25, 30, or 35%, the sacrificial layer 102 may have a germanium atomic concentration in a range from about 35% to about 65%, such as about 35, 40, 45, 50, 55, 60, or 65%, and the sacrificial layer 103 may have a germanium atomic concentration in a range from about 65% to about 95%, such as about 65, 70, 75, 80, 85, 90, or 95%. In some embodiments, the sacrificial layer 100 may be free of germanium. In some embodiments, each of the sacrificial layers 100, 101, 102, 103, and 120 in the sacrificial multi-layer stack may be grown by a process such as vapor phase epitaxy (VPE) or molecular beam epitaxy (MBE), deposited by a process such as chemical vapor deposition (CVD) or atomic layer deposition (ALD), or the like. Subsequently, the sacrificial multi-layer stack is patterned by using suitable photolithography and etching techniques, resulting in a fin-like stack.

Reference is made to FIGS. 4A and 4B. A dielectric material 105 is deposited over the sacrificial multi-layer stack. In some embodiments, the dielectric material 105 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 105 may be deposited using any suitable method, such as CVD, physical vapor deposition (PVD), ALD, PEALD, PECVD, SACVD, FCVD, spin-on, and/or the like, or a combination thereof. In some embodiments, the dielectric material 105 can be interchangeably referred to a hard mask layer.

Reference is made to FIGS. 5A and 5B. A capacitor trench T11 is formed to extend through the dielectric material 105 to expose a sidewall of the sacrificial multi-layer stack, such that the sacrificial layers 100, 101, 102, 103, and 120 are exposed from the capacitor trench T11. For example, a patterned mask (not shown) may be formed over the dielectric material 105 and used to etch the dielectric material 105 to form a capacitor trench T11 that extends through the dielectric material 105 by using photolithography and etching techniques to expose a first sidewall of the sacrificial multi-layer stack. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). In some embodiments, the capacitor trench T11 may have a rectangular profile extending along Y-direction from the top view. After the formation of the capacitor trench T11, the patterned mask can be removed by a suitable technique, such as a wet clean process, an ashing process, or the like. In some embodiments, the capacitor trench T11 can be interchangeably referred to a capacitor opening.

Reference is made to FIGS. 6A and 6B. The sacrificial layers 100 and 120 (see FIG. 5B) in the sacrificial multi-layer stack are removed in one or more etching process, so that the capacitor recesses R11 and R12 are formed over the dielectric layer 104. The capacitor recesses R11 can expose a bottom surface of the sacrificial layer 101, and the capacitor recesses R12 can expose a top surface of the sacrificial layer 103. In some embodiments, the sacrificial layers 100 and 120 may be removed by an anisotropic dry etch process. For example, the etching process may include a dry etch process using reaction gas(es) that selectively etch the sacrificial layers 100 and 120 at faster rates than the dielectric layer 104, the dielectric material 105, and the sacrificial layers 101, 102, and 103. In some embodiments, when the sacrificial layers 100 and 120 as shown in FIG. 5B are formed of silicon, the second sacrificial layers 101, 102, and 103 may be formed of silicon germanium. In some embodiments, the capacitor recesses R11 and R12 can be interchangeably referred to capacitor electrode spaces that inherit the shapes of the first sacrificial layers 100 and 120.

Reference is made to FIGS. 7A and 7B. A dielectric layer 106 is blanket formed over the dielectric material 105 and in the capacitor trench T11 and the capacitor recesses R11 and R12. In some embodiments, the dielectric layer 106 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 106 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 106 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 106 may be a multi-layer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 106 may be deposited using any suitable method, such as CVD, physical vapor deposition (PVD), ALD, PEALD, PECVD, SACVD, FCVD, spin-on, and/or the like, or a combination thereof.

Reference is made to FIGS. 8A and 8B. A conductive material 107 is deposited over the dielectric layer 106. An interface between the dielectric layer 106 and the conductive material 107 can be smooth or rough. In some embodiments, the conductive material 107 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 107 may be deposited using any suitable method, such as CVD, physical vapor deposition (PVD), ALD, PEALD, PECVD, SACVD, FCVD, spin-on, and/or the like, or a combination thereof.

Reference is made to FIGS. 9A and 9B. A planarization process P11 (e.g., CMP) is performed to remove the excessive dielectric layer 106 and the conductive material 107 (see FIG. 8B) above the top surface of the dielectric material 105 to form an electrode 107' of a vertically stacked multi-layer MIM capacitor C1 (see FIGS. 26A-26D) in the capacitor trench T11 (see FIG. 7B) and the capacitor recesses R11 and R12 (see FIG. 7B). The dielectric material 105 may also act as an etch stop layer for etching the dielectric layer 106 and the conductive material 107.

Reference is made to FIGS. 10A and 10B. A hard mask layer 115 may be formed over the dielectric material 105 and used to etch the dielectric material 105 to form a capacitor trench T12 (see FIG. 11B) that extends through the dielectric material 105 and exposes the underlying dielectric layer 104. In some embodiments, the hard mask layer 115 may be made of the same material as the dielectric material 105, thereby resulting in a substantially indistinguishable interface between the hard mask layer 115 and the dielectric material 105. In some embodiments, the hard mask layer 115 may be made of a different material than the dielectric material 105. In some embodiments, the dielectric material 115 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 115 may be deposited using any suitable method, such as CVD, physical vapor deposition (PVD), ALD, PEALD, PECVD, SACVD, FCVD, spin-on, and/or the like, or a combination thereof.

Reference is made to FIGS. 11A and 11B. The hard mask layer 115 may be patterned and then be used to etch the dielectric material 105. The hard mask layer 115 may be patterned by a lithography process including include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

After the formation of the patterned hard mask layer 115, the dielectric material 105 can be etched through the patterned hard mask layer 115 to form the capacitor trench T12 and a capacitor recess R13 over the dielectric layer 106. The etching process may include dry etching, wet etching, and/or other etching methods (e.g., reactive ion etching). For example, the etching process may include a dry etch process using reaction gas(es) that selectively etch the dielectric material 105 at a faster rate than the dielectric layer 104, the dielectric layer 106, and the electrode 107', and the sacrificial layers 101, 102, and 103. The capacitor trench T12 can expose a second sidewall of the sacrificial multi-layer stack opposite to or different from the first sidewall shown in FIG. 5B. That is, the sacrificial layers 101, 102, and 103 can be exposed from the capacitor trench T12. In some embodiments, the capacitor trench T12 may have a rectangular profile extending along Y-direction from the top view. In some embodiments, the capacitor trench T12 can be interchangeably referred to a capacitor opening. In some embodiments, after the forming of the capacitor trench T12, the patterned hard mask layer 115 can be removed by a suitable technique, such as a wet clean process, an ashing process, or the like.

Reference is made to FIGS. 12A and 12B. The sacrificial layer 101 (see FIG. 11B) is moved in one or more etching process through the capacitor trench T12, so that a capacitor recess R14 is formed. The capacitor recesses R14 can expose a bottom surface of the sacrificial layer 102. In some embodiments, the sacrificial layer 101 can be removed by suitable etching techniques, such as dry etching, wet etching, and/or other etching methods (e.g., reactive ion etching). In some embodiments, the sacrificial layer 101 can be removed by an anisotropic dry etch process. For example, the etching process may include a dry etch process using reaction gas(es) that selectively etch the sacrificial layer 101 at a faster rate than the dielectric layer 104, the dielectric layer 106, the electrode 107', and the sacrificial layers 102 and 103. In some embodiments, the capacitor recesses R14 can be interchangeably referred to a capacitor electrode space that inherits the shape of the sacrificial layer 101.

Reference is made to FIGS. 13A and 13B. A dielectric layer 116 is blanket formed over the hard mask layer 115 and in the capacitor trench T12 and the capacitor recesses R13 and R14. In some embodiments, the dielectric layer 116 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 116 may include hafnium oxide (HfO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_5$), strontium titanium oxide ($SrTiO_3$, STO), barium titanium oxide ($BaTiO_2$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_2N_4$), oxynitrides (SiON), any suitable materials, or combinations thereof. In some embodiments, the dielectric layer 116 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 116 may be a multi-layer structure including, such as a silicon oxide layer (e.g., SiO layer), a first high-k material layer (e.g., $HfO_2$ layer), and a second high-k material layer (e.g., $ZrO_2$ layer). In some embodiments, the dielectric layer 116 may be made of the same material as the dielectric layer 106, thereby resulting in a substantially indistinguishable interface between the dielectric layers 106 and 116. In some embodiments, the dielectric layer 116 may be made of a different material than the dielectric layer 106. In some embodiments, the dielectric layer 116 may be deposited using any suitable method, such as CVD, physical vapor deposition (PVD), ALD, PEALD, PECVD, SACVD, FCVD, spin-on, and/or the like, or a combination thereof.

Reference is made to FIGS. 14A and 14B. A conductive material 108 is deposited over the dielectric layer 116. An interface between the dielectric layer 116 and the conductive material 108 can be smooth or rough. In some embodiments, the conductive material 108 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 108 may be made of the same material as the electrode 107'. In some embodiments, the conductive material 108 may be made of a different material than the electrode 107'. In some embodiments, the conductive material 108 may be deposited using any suitable method, such as CVD, physical vapor deposition (PVD), ALD, PEALD, PECVD, SACVD, FCVD, spin-on, and/or the like, or a combination thereof.

Reference is made to FIGS. 15A and 15B. A planarization process P12 (e.g., CMP) is performed to remove the excessive dielectric layer 116 and the conductive material 108 (see FIG. 14B) above the dielectric material 105 to form an electrode 108' of the vertically stacked multi-layer MIM capacitor C1 (see FIGS. 26A-26D) in the capacitor trench T12 (see FIG. 13B) and the capacitor recesses R13 and R14 (see FIG. 13B). The dielectric material 105 may also act as an etch stop layer for etching the dielectric layer 116 and the conductive material 108.

Figure 16B:
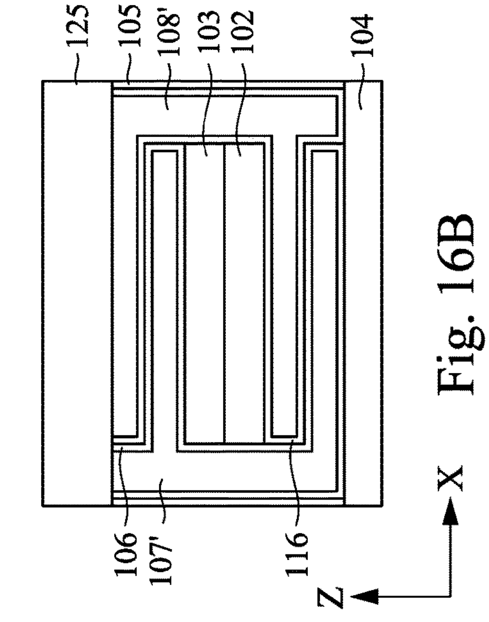
Figure 16A:
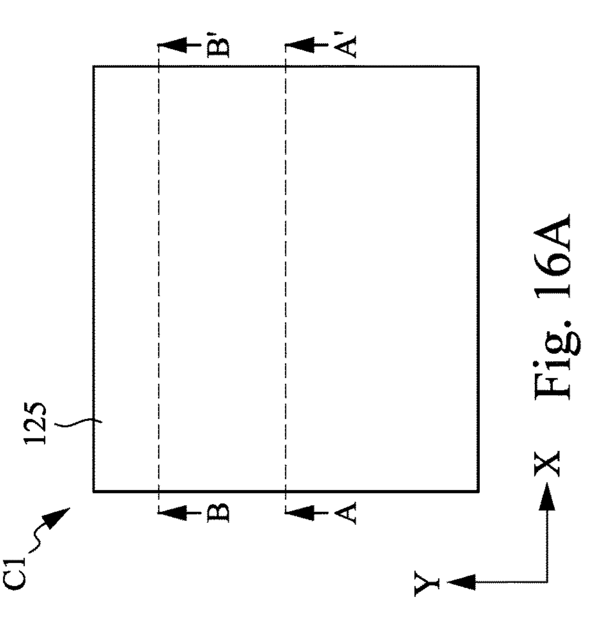
Figure 16C:
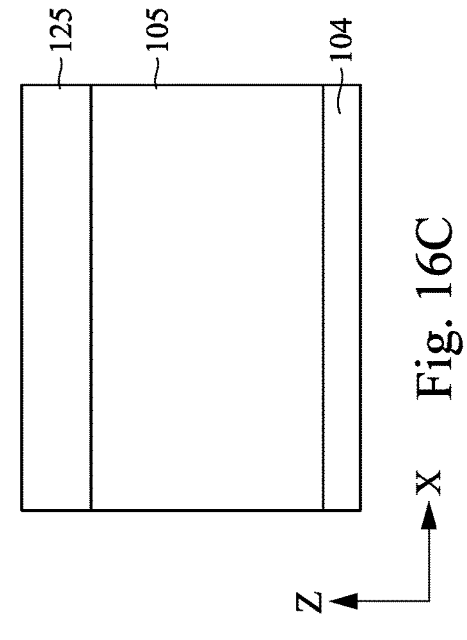

Reference is made to FIGS. 16A, 16B, and 16C. A hard mask layer 125 is deposited over the dielectric material 105 and used to etch the dielectric material 105 to form a capacitor trench T13 (see FIG. 17C) that extend through the dielectric material 105 and exposes the underlying dielectric layer 104. In some embodiments, the hard mask layer 125 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), polyimide, other suitable materials, or combinations thereof. In some embodiments, the dielectric materials used to form the hard mask layer 125 may be deposited using any suitable method, such as CVD, physical vapor deposition (PVD), ALD, PEALD, PECVD, SACVD, FCVD, spin-on, and/or the like, or a combination thereof. In some embodiments, the hard mask layer 125 can be interchangeably referred to a hard mask layer. In some embodiments, the hard mask layer 125 may be made of the same material as the dielectric material 105, thereby resulting in a substantially indistinguishable interface between the hard mask layer 125 and the dielectric material 105. In some embodiments, the hard mask layer 125 may be made of a different material than the dielectric material 105.

Figure 17B:
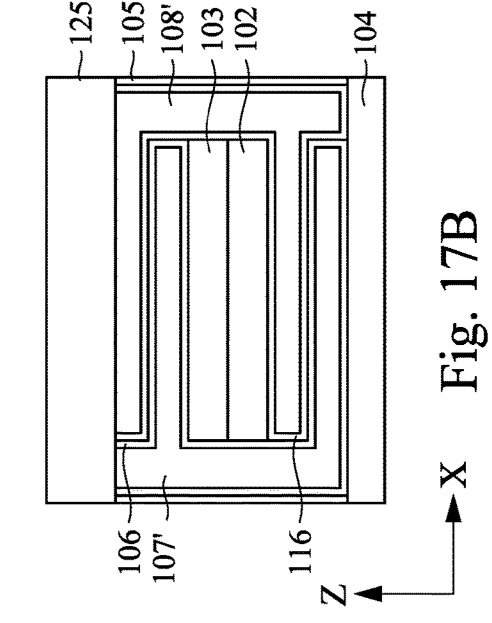
Figure 17A:
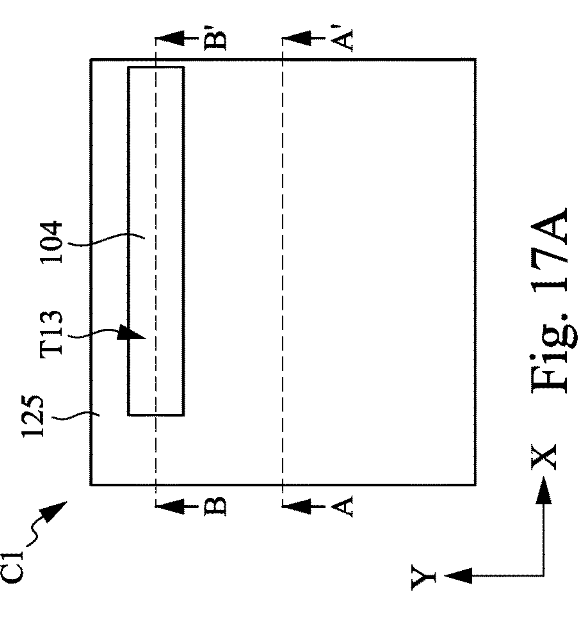
Figure 17C:
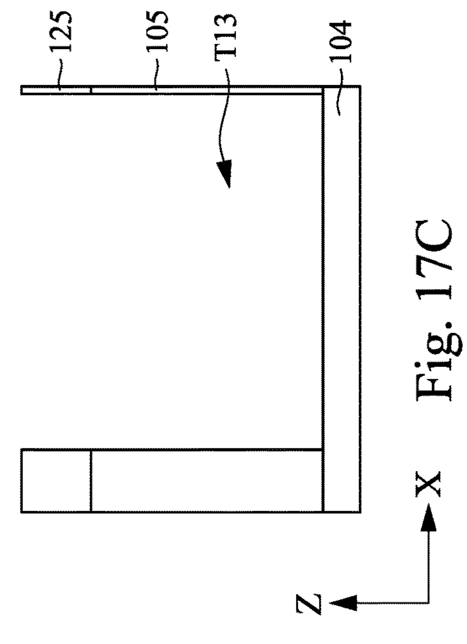

Reference is made to FIGS. 17A, 17B, and 17C. The hard mask layer 125 may be patterned and then be used to etch the dielectric material 105. The hard mask layer 125 may be patterned by a lithography process including include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

After the formation of the patterned hard mask layer 125, the dielectric material 105 can be etched through the patterned hard mask layer 125 to form the capacitor trench T13 (see FIG. 17C) that exposes the dielectric layer 104. The etching process may include dry etching, wet etching, and/or other etching methods (e.g., reactive ion etching). For example, the etching process may include a dry etch process using reaction gas(es) that selectively etch the dielectric material 105 at a faster rate than the dielectric layer 104, the dielectric layers 106 and 116, and the electrodes 107' and 108', and the sacrificial layers 102 and 103. The capacitor trench T13 (see FIG. 17C) can expose a third sidewall of the sacrificial multi-layer stack different from the first and second sidewalls shown in FIGS. 5B and 11B. That is, the sacrificial layers 102 and 103 can be exposed from the capacitor trench T13 (see FIG. 17C). In some embodiments, the capacitor trench T13 may have a rectangular profile extending along X-direction from the top view. In some embodiments, the capacitor trench T13 (see FIG. 17C) can be interchangeably referred to a capacitor opening. In some embodiments, after the forming of the capacitor trench T13, the patterned hard mask layer 125 can be removed by a suitable technique, such as a wet clean process, an ashing process, or the like.

Figure 18B:
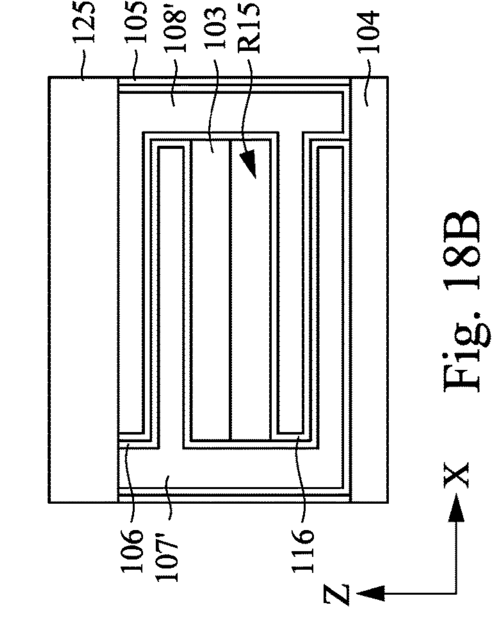
Figure 18A:
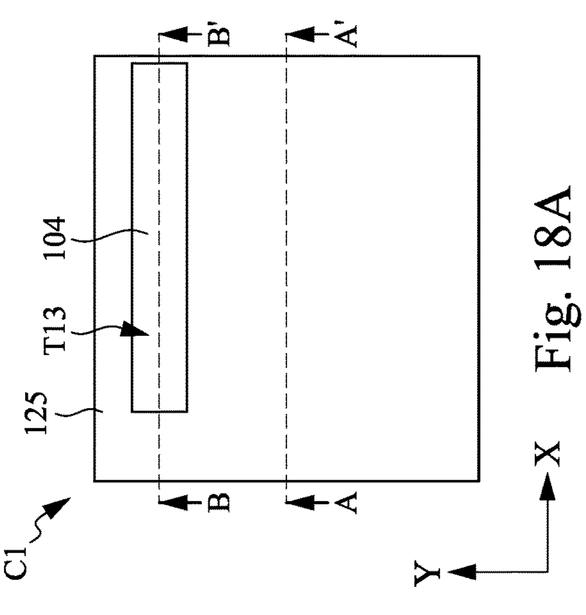
Figure 18C:
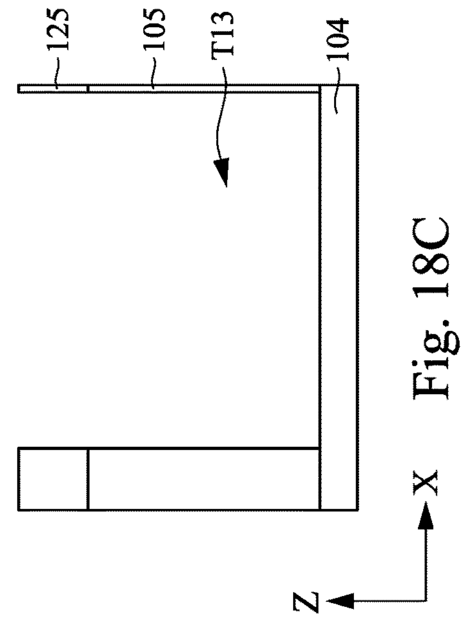

Reference is made to FIGS. 18A, 18B, and 18C. The sacrificial layer 102 (see FIG. 17B) is moved in one or more etching process through the capacitor trench T13 (see FIG. 18C), so that a capacitor recess R15 (see FIG. 18B) is formed. The capacitor recesses R15 (see FIG. 18B) can expose a bottom surface of the sacrificial layer 103. In some embodiments, the sacrificial layer 102 can be removed by suitable etching techniques, such as dry etching, wet etching, and/or other etching methods (e.g., reactive ion etching). In some embodiments, the sacrificial layer 102 can be removed by an anisotropic dry etch process. For example, the etching process may include a dry etch process using reaction gas(es) that selectively etch the sacrificial layer 102 at a faster rate than the dielectric layer 104, the dielectric layers 106 and 116, the electrodes 107' and 108', and the sacrificial layer 103. In some embodiments, the capacitor recesses R15 (see FIG. 18B) can be interchangeably referred to a capacitor electrode space that inherits the shape of the sacrificial layer 102.

Figure 19B:
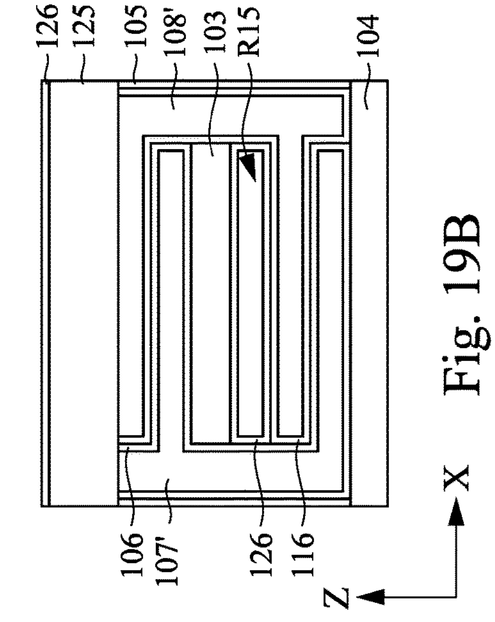
Figure 19A:
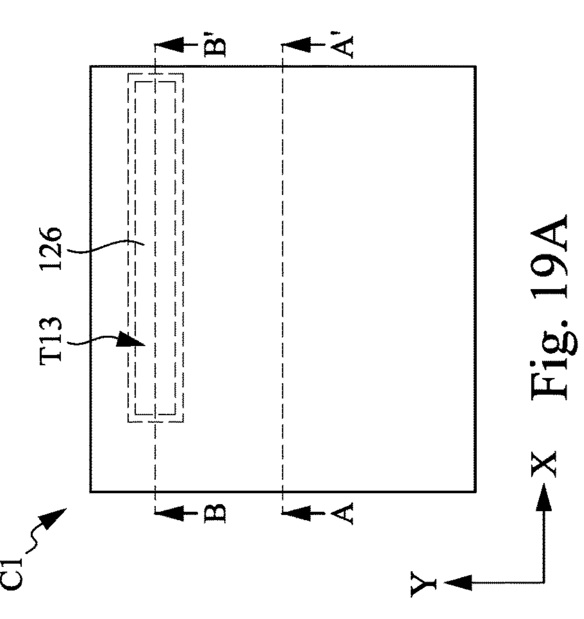
Figure 19C:
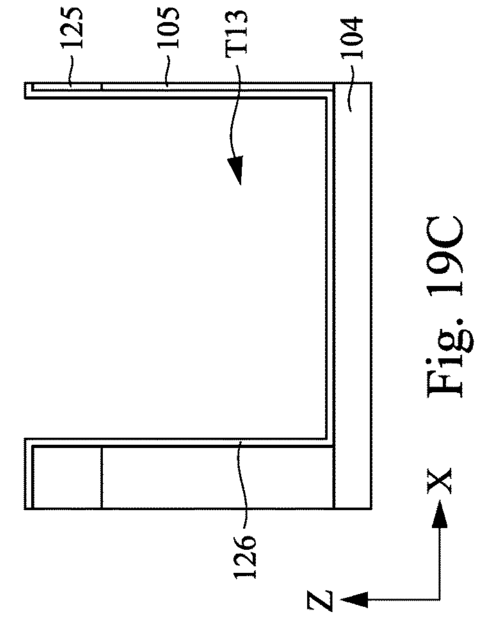
Figure 21B:
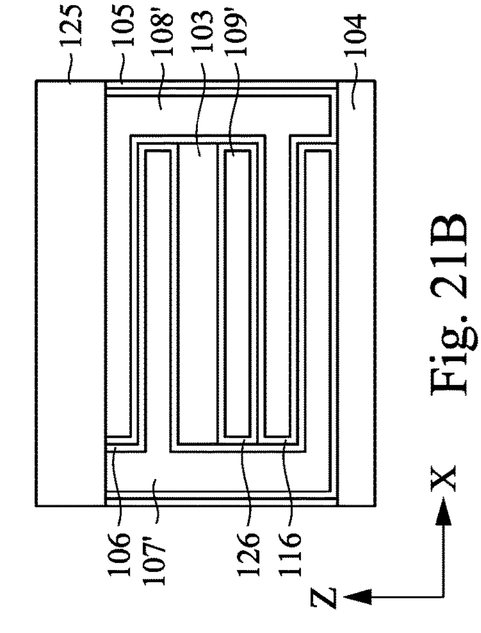
Figure 21D:
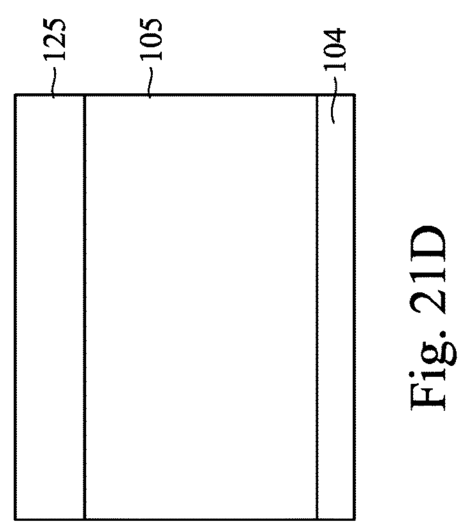
Figure 21A:
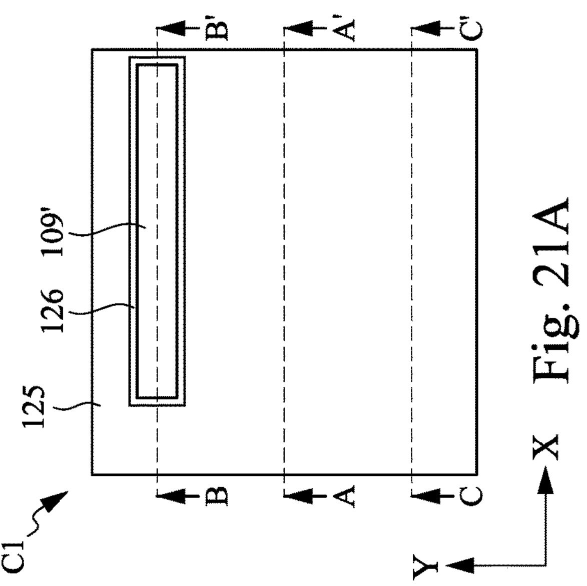
Figure 21C:
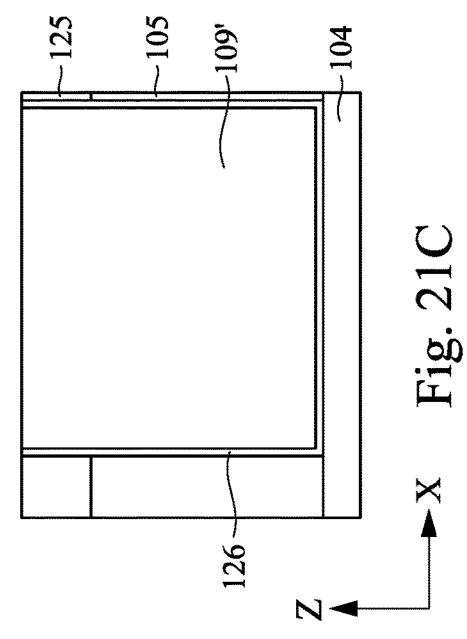

Reference is made to FIGS. 19A, 19B, and 19C. A dielectric layer 126 is blanket formed over the hard mask layer 125 and in the capacitor trench T13 and the capacitor recesses R15. In some embodiments, the dielectric layer 126 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 126 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 126 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 126 may be a multilayer structure including, such as a silicon oxide layer (e.g., $SiO_2$ layer), a first high-k material layer (e.g., HfO layer), and a second high-k material layer (e.g., $ZrO_2$ layer). In some embodiments, the dielectric layer 126 may be made of a same material as the dielectric layer 106 and/or the dielectric layer 116, thereby resulting in a substantially indistinguishable interface between at least two of the dielectric layers 106, 116, and 126. In some embodiments, the dielectric layer 126 may be made of a different material than the dielectric layer 106 and/or the dielectric layer 116. In some embodiments, the dielectric layer 126 may be deposited using any suitable method, such as CVD, physical vapor deposition (PVD), ALD, PEALD, PECVD, SACVD, FCVD, spin-on, and/or the like, or a combination thereof.

Reference is made to FIGS. 20A, 20B, and 20C. A conductive material 109 is deposited over the dielectric layer 126. An interface between the dielectric layer 126 and the conductive material 109 can be smooth or rough. In some embodiments, the conductive material 109 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 109 may be made of the same material as the electrodes 107' and/or the electrodes 108'. In some embodiments, the conductive material 109 may be made of a different material than the electrode 107' and/or the electrode 108'. In some embodiments, the conductive material 109 may be deposited using any suitable method, such as CVD, physical vapor deposition (PVD), ALD, PEALD, PECVD, SACVD, FCVD, spin-on, and/or the like, or a combination thereof.

Reference is made to FIGS. 21A, 21B, 21C, and 21D. A planarization process P13 (e.g., CMP) is performed to remove the excessive dielectric layer 126 and the conductive material 109 (see FIG. 14B) above the hard mask layer 125 to form an electrode 109' of the vertically stacked multi-layer MIM capacitor C1 (see FIGS. 26A-26D) in the capacitor trench T13 (see FIG. 19C) and the capacitor recesses R15 (see FIG. 19B). The hard mask layer 125 may also act as an etch stop layer for etching the dielectric layer 126 and the conductive material 109.

Figure 22B:
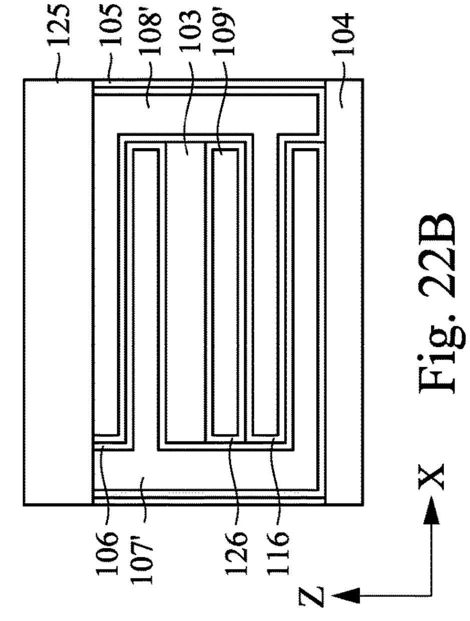
Figure 22A:
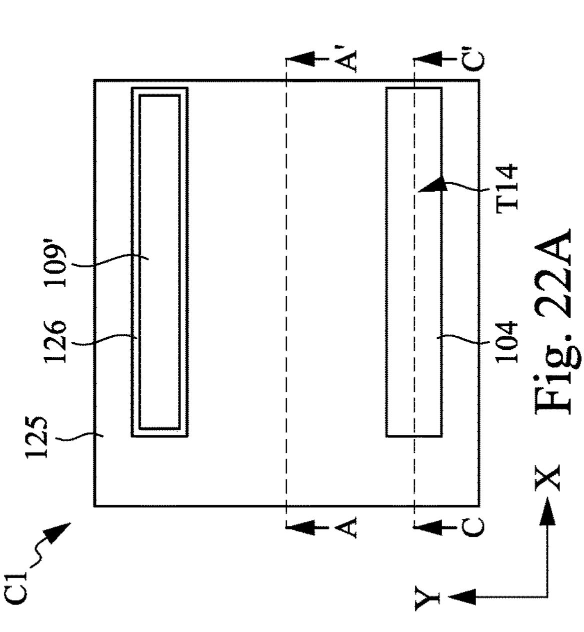
Figure 22C:
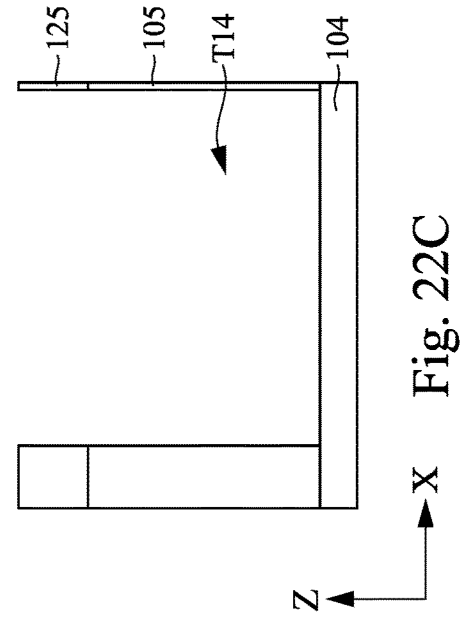

Reference is made to FIGS. 22A, 22B, and 22C. The hard mask layer 125 may be further patterned and then be used to etch the dielectric material 105 to form the capacitor trench T14 (see FIG. 22C) that exposes the dielectric layer 104. The etching process may include dry etching, wet etching, and/or other etching methods (e.g., reactive ion etching). For example, the etching process may include a dry etch process using reaction gas(es) that selectively etch the dielectric material 105 at a faster rate than the dielectric layer 104, the dielectric layers 106, 116, and 126, and the electrodes 107', 108', and 109' and the sacrificial layer 103. The capacitor trench T14 (see FIG. 22C) can expose a fourth sidewall of the sacrificial multi-layer stack different from the first, second, and third sidewalls shown in FIGS. 5B, 11B, and 17C. That is, the sacrificial layer 103 can be exposed from the capacitor trench T14, and the fourth sidewall of the sacrificial multi-layer stack is opposite to the third sidewall of the sacrificial multi-layer stack. In some embodiments, the capacitor trench T14 may have a rectangular profile extending along X-direction from the top view (see FIG. 22A). In some embodiments, the capacitor trench T14 (see FIG. 22C) can be interchangeably referred to a capacitor opening. In some embodiments, after the forming of the capacitor trench T14, the patterned hard mask layer 125 can be removed by a suitable technique, such as a wet clean process, an ashing process, or the like.

Figure 23B:
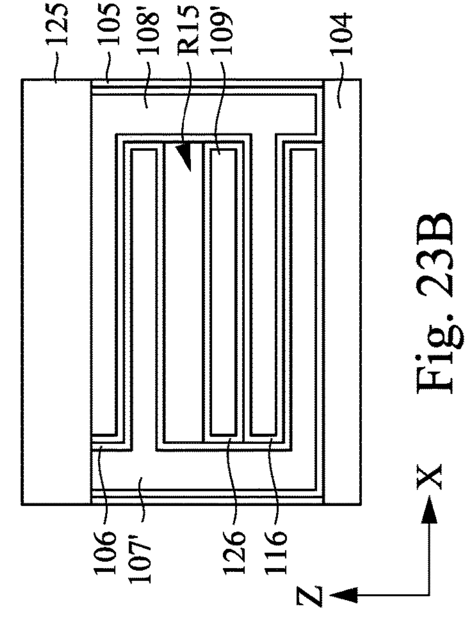
Figure 23A:
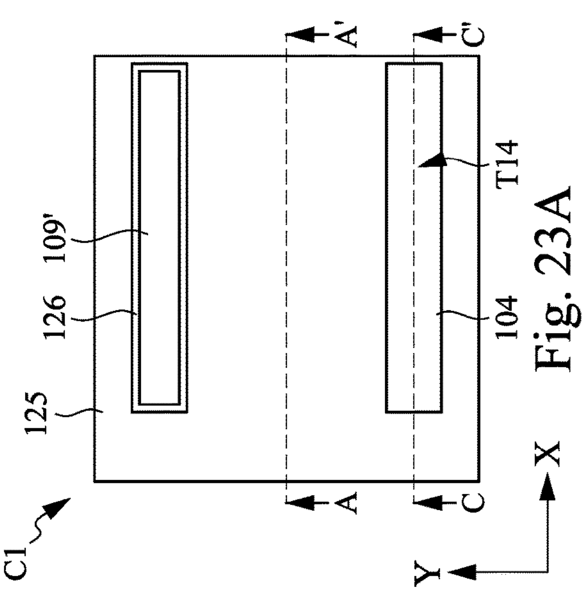
Figure 23C:
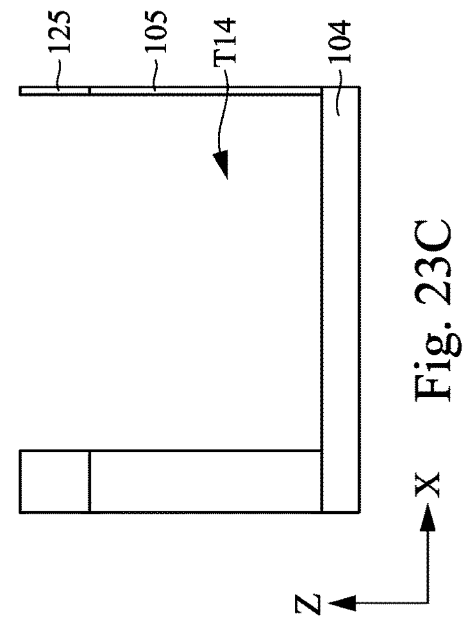

Reference is made to FIGS. 23A, 23B, and 23C. The sacrificial layer 103 (see FIG. 22B) is moved in one or more etching process through the capacitor trench T14 (see FIG. 23C), so that a capacitor recess R16 (see FIG. 23B) is formed. In some embodiments, the sacrificial layer 103 can be removed by suitable etching techniques, such as dry etching, wet etching, and/or other etching methods (e.g., reactive ion etching). In some embodiments, the sacrificial layer 103 can be removed by an anisotropic dry etch process. For example, the etching process may include a dry etch process using reaction gas(es) that selectively etch the sacrificial layer 103 at a faster rate than the dielectric layer 104, the dielectric layers 106, 116, and 126, and the electrodes 107', 108', and 109'. In some embodiments, the capacitor recesses R16 (see FIG. 23B) can be interchangeably referred to a capacitor electrode space that inherits the shape of the sacrificial layer 103.

Figure 24B:
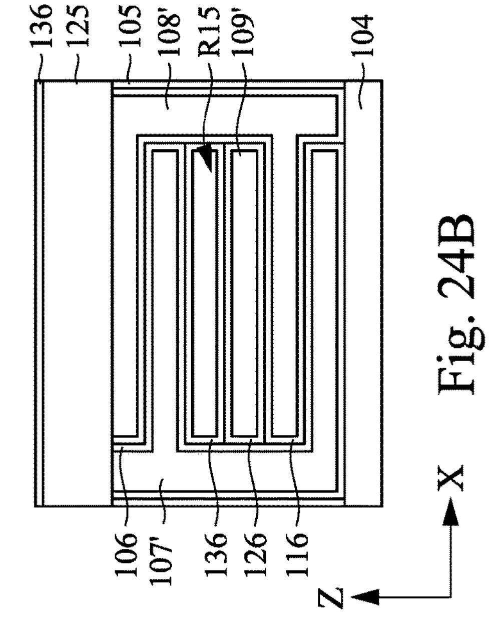
Figure 24A:
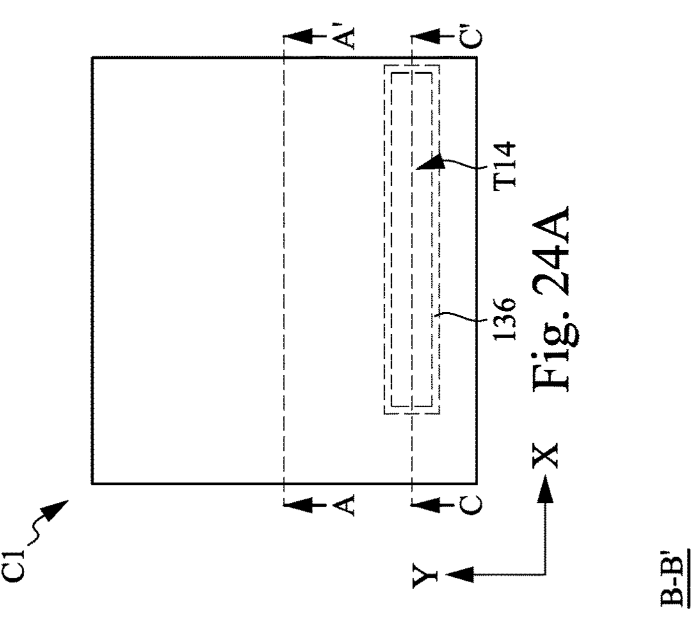
Figure 24C:
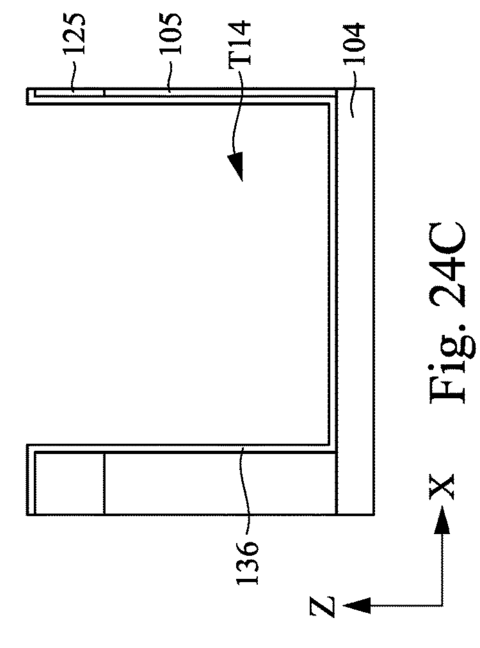

Reference is made to FIGS. 24A, 24B, and 24C. A dielectric layer 136 is blanket formed over the hard mask layer 125 and in the capacitor trench T14 (see FIG. 24C) and the capacitor recesses R16 (see FIG. 24B). In some embodiments, the dielectric layer 136 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 136 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 136 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 136 may be a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 136 may be made of a same material as the dielectric layer 106, the dielectric layer 116, and/or the dielectric layer 126, thereby resulting in a substantially indistinguishable interface between at least two of the dielectric layers 106, 116, 126, and 136. In some embodiments, the dielectric layer 136 may be made of a different material than the dielectric layer 106, the dielectric layer 116, and/or the dielectric layer 126. In some embodiments, the dielectric layer 136 may be deposited using any suitable method, such as CVD, physical vapor deposition (PVD), ALD, PEALD, PECVD, SACVD, FCVD, spin-on, and/or the like, or a combination thereof.

Figure 25B:
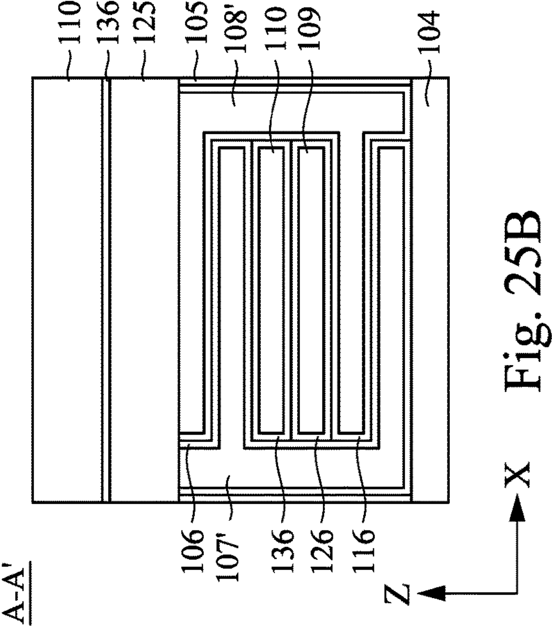
Figure 25A:
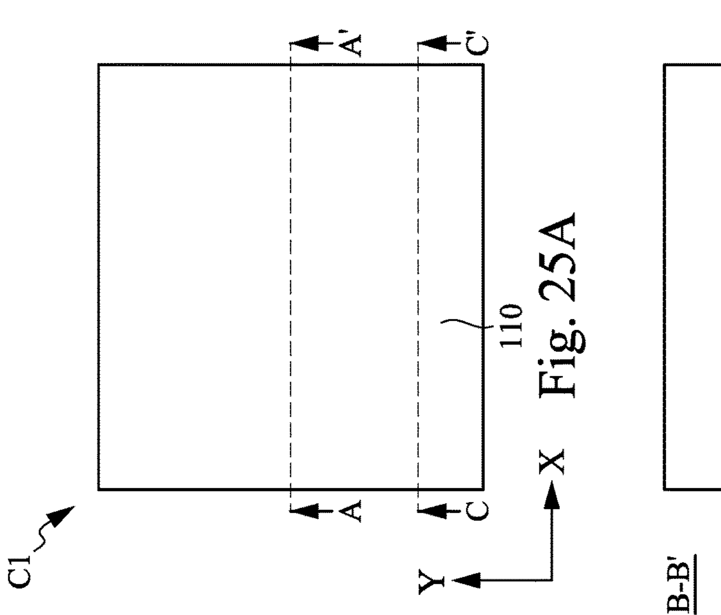
Figure 25C:
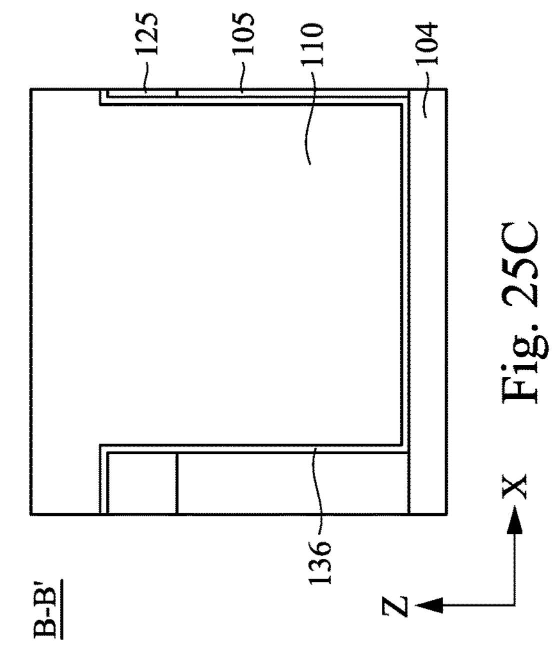

Reference is made to FIGS. 25A, 25B, and 25C. A conductive material 110 is deposited over the dielectric layer 136. An interface between the dielectric layer 136 and the conductive material 110 can be smooth or rough. In some embodiments, the conductive material 110 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 110 may be made of the same material as the electrodes 107', the electrodes 108', and/or the electrodes 109'. In some embodiments, the conductive material 110 may be made of a different material than the electrode 107', the electrode 108', and/or the electrode 109'. In some embodiments, the conductive material 110 may be deposited using any suitable method, such as CVD, physical vapor deposition (PVD), ALD, PEALD, PECVD, SACVD, FCVD, spin-on, and/or the like, or a combination thereof.

Reference is made to FIGS. 26A, 26B, 26C, and 26D. A planarization process P14 (e.g., CMP) is performed to remove the excessive dielectric layer 136 and the conductive material 110 (see FIG. 25C) above the hard mask layer 125 to form an electrode 110' of the vertically stacked multi-layer MIM capacitor C1 in the capacitor trench T14 (see FIG. 24C) and the capacitor recesses R16 (see FIG. 24B). The hard mask layer 125 may also act as an etch stop layer for etching the dielectric layer 136 and the conductive material 110. In some embodiments, the dielectric layers 106, 116, 126, and 136 can be collectively referred to as an insulator 106' of the vertically stacked multi-layer MIM capacitor C1. As a result of this method, the vertically stacked multi-layer MIM capacitor C1 may include the electrodes 107', 108', 109', and 110' and the insulator 106' sandwiched between any two of the electrodes 107', 108', 109', and 110'. In other words, any two of the electrodes 107', 108', 109', and 110' can be spaced apart from each other by the insulator 106'. In some embodiments, the insulator 106' may have a thickness in a range from about 0.1 nm to about 100 nm, such as about 0.1, 1, 10, or 100 nm. In some embodiments, the vertically stacked multi-layer MIM capacitor C1 may have a lateral dimension D11 (see FIG. 26B) in X-direction and in a range from about 1 nm to about 10 mm, such as about 1 nm, 10 nm, 100 nm, 1 μm, 10 μm, 100 μm, 1 mm, or 10 mm. In some embodiments, the vertically stacked multi-layer MIM capacitor C1 may have a lateral dimension D12 (see FIG. 26A) in Y-direction and in a range from about 1 nm to about 10 mm, such as about 1 nm, 10 nm, 100 nm, 1 μm, 10 μm, 100 μm, 1 mm, or 10 mm. In some embodiments, the vertically stacked multi-layer MIM capacitor C1 may have a vertical dimension D13 (see FIG. 26C) in Z-direction and in a range from about 1 nm to about 10 mm, such as about 1 nm, 10 nm, 100 nm, 1 μm, 10 μm, 100 μm, 1 mm, or 10 mm. In some embodiments, from a top view, the vertically stacked multi-layer MIM capacitor C1 may be a cylinder, cuboid, thin film, or any suitable geometry, with or without rounded corners.

Figure 26A:
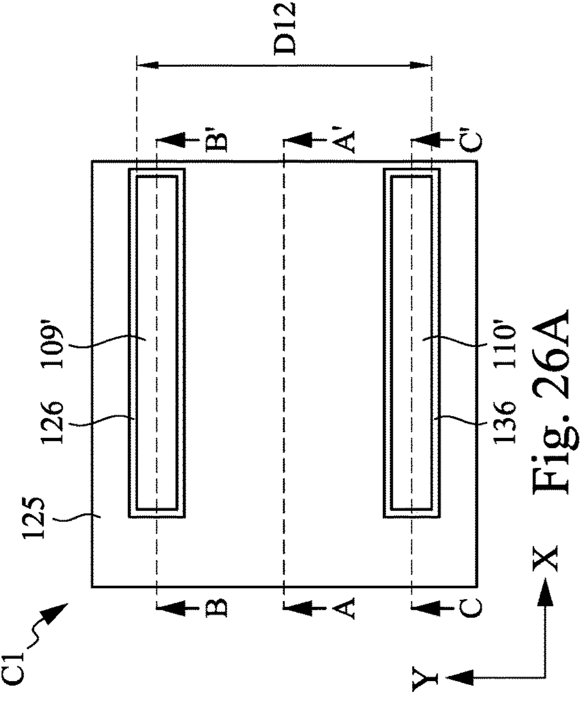
Figure 26B:
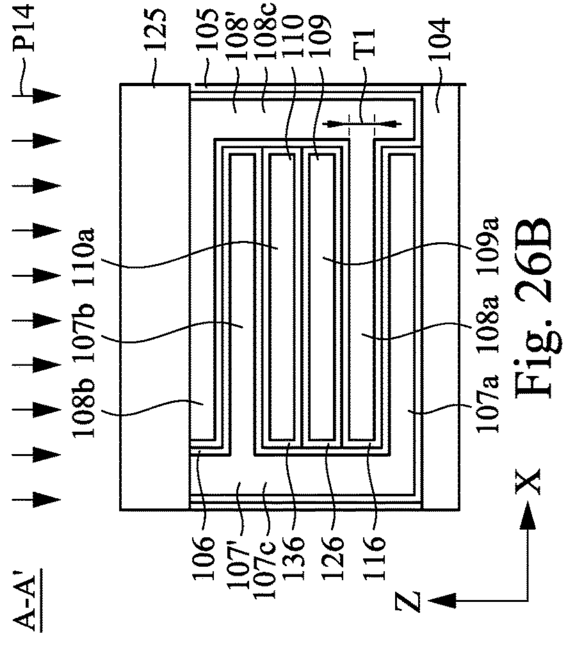
Figure 26C:
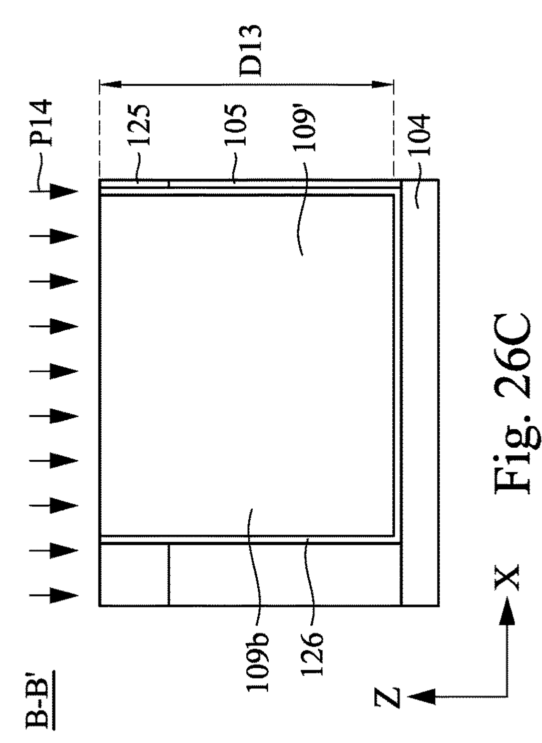
Figure 26D:
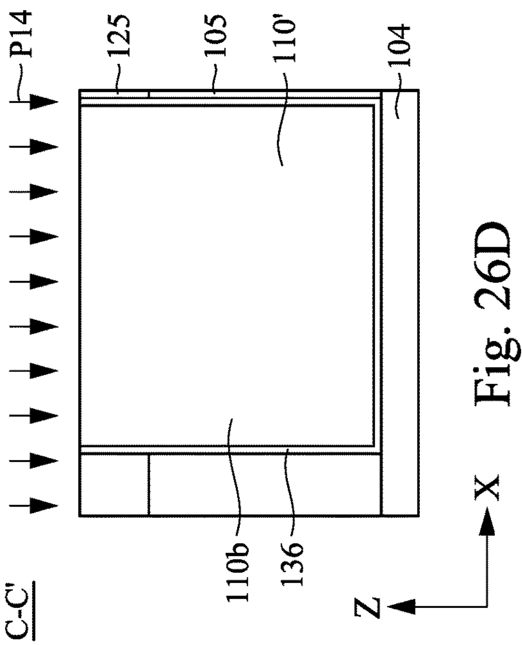
Figure 27A:
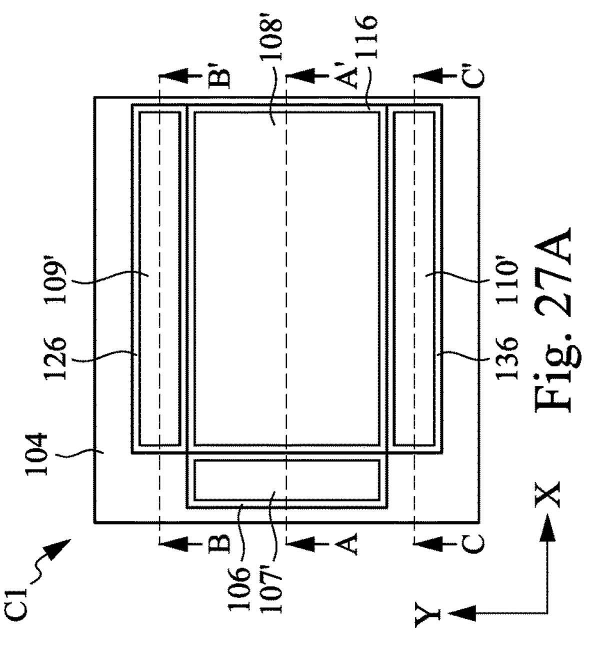
Figure 27B:
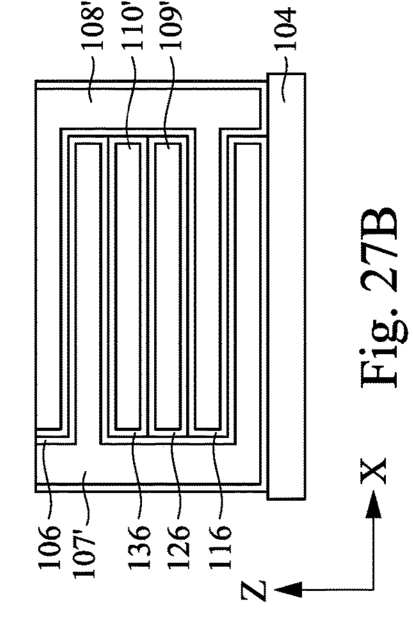
Figure 27C:
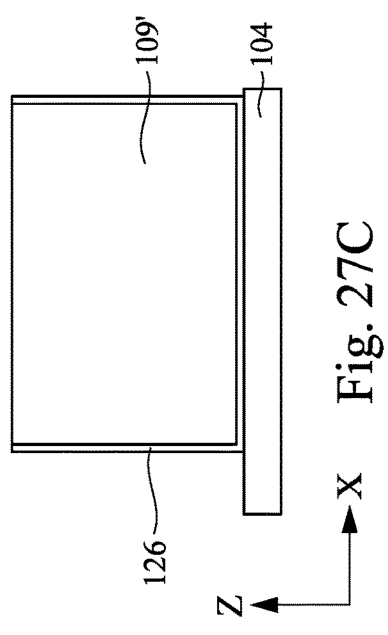
Figure 27D:
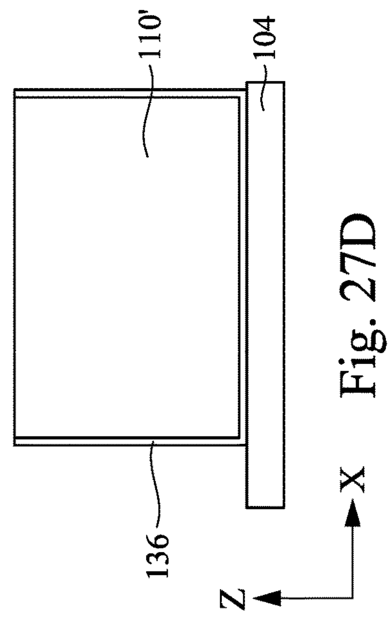
Figure 28B:
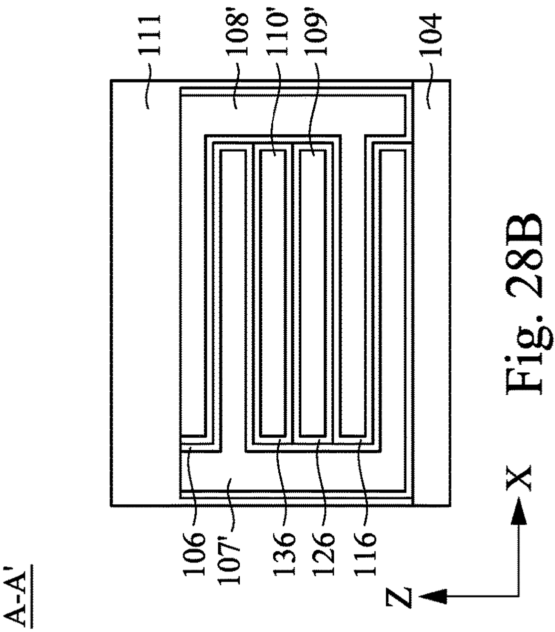
Figure 28D:
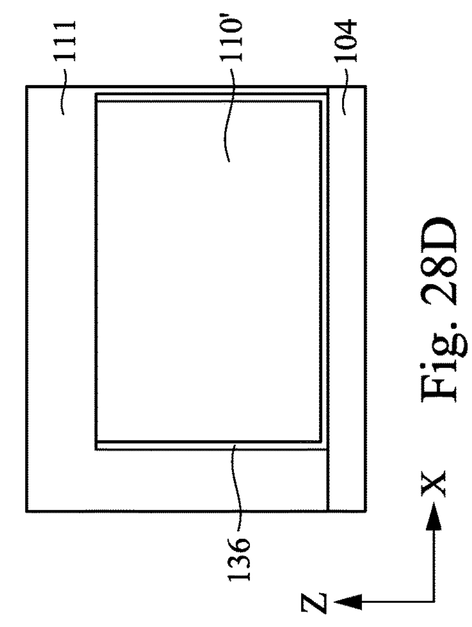
Figure 28A:
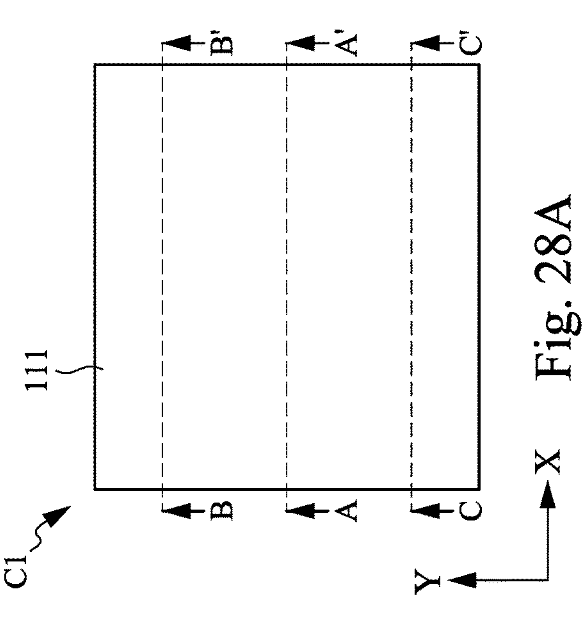
Figure 28C:
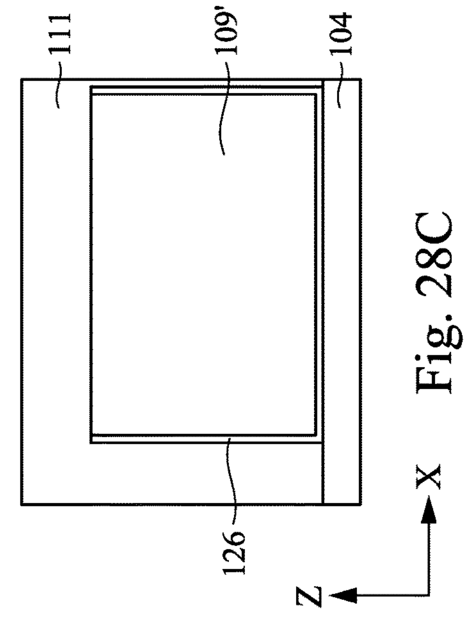

This is described in greater detail with reference to FIG. 26B, after the planarization process P14, the electrode 107' can include two lateral portions 107*a* and 107*b* formed in the capacitor recesses R11 and R12 (see FIG. 6B) and one vertical portion 107*c* formed in the capacitor trench T11 (see FIG. 6B). The lateral portions 107*a* and 107*b* can laterally extend from the vertical portion 107*c* in X-direction from the cross-sectional view, and the vertical portion 107*c* can laterally extend in Y-direction from the top view. The electrode 108' can include two lateral portions 108*a* and 108*b* formed in the capacitor recesses R14 and R13 (see FIG. 13B) and interleaving with the lateral portions 107*a* and 107*b* and one vertical portion 108*c* formed in the capacitor trench T12 (see FIG. 13B). The lateral portions 108*a* and 108*b* can laterally extend from the vertical portion 108*c* in X-direction and toward the vertical portion 107*c* of the electrode 107' from the cross-sectional view, and the vertical portion 108*c* can laterally extend in Y-direction from the top view. The electrode 109' can include one lateral portion 109*a* (see FIG. 26B) formed in the capacitor recesses R15 (see FIG. 19B) and interposing the lateral portion 108*a* of the electrode 108' and the lateral portions 107*b* of the electrode 107' and one vertical portion 109*b* (see FIGS. 26A and 26C) formed in the capacitor trench T13 (see FIG. 19C). The lateral portion 109*a* can laterally extend from the vertical portion 109*b* in Y-direction, and the vertical portion 109*b* can laterally extend in X-direction from the top view. The electrode 110' can include one lateral portion 110*a* (see FIG. 26B) formed in the capacitor recesses R16 (see FIG. 24B) and interposing the lateral portion 109*a* of the electrode 109' and the lateral portions 107*b* of the electrode 107' and one vertical portion 110*b* (see FIGS. 26A and 26D) formed in the capacitor trench T14 (see FIG. 24C). The lateral portion 109*a* can laterally extend from the vertical portion 109*b* in Y-direction and toward the vertical portion 108*b* of the electrode 108' from the cross-sectional view, and the vertical portion 109*b* can laterally extend in X-direction from the top view. In some embodiments, at least two of the lateral portions 107*a*, 107*b*, 108*a*, 108*b*, 109*a*, and 110*a* may have different thicknesses. In some embodiments, at least two of the lateral portions 107*a*, 107*b*, 108*a*, 108*b*, 109*a*, and 110*a* may have a same thickness. By way of example and not limitation, the lateral portions 107*a*, 107*b*, 108*a*, 108*b*, 109*a*, and/or 110*a* may have a thickness T1 (see FIG. 26B) in a range from about 0.1 nm to about 1 μm, such as about 0.1, 1, 10, 100, or 1000 nm.

Therefore, the present disclosure in various embodiments provides a vertically stacked multi-layer MIM capacitor C1 that includes vertically stacked interleaved lateral portions 107*a*, 107*b*, 108*a*, 108*b*, 109*a*, and 110*a*. An advantage is that the capacitor C1 including vertically stacked interleaved electrodes can increase the overlap area therebetween, such that the capacitance of the capacitor C1 can be improved. In addition, the capacitor C1 may include multiple electrodes that can adjust capacitance depending on providing different voltage potentials to the electrodes.

Reference is made to FIGS. 27A, 27B, 27C, and 27D. The dielectric material 105 and the hard mask layer 125 (see FIGS. 26B-26D) surrounding the vertically stacked multi-layer MIM capacitor C1 are moved in one or more etching process. In some embodiments, the dielectric material 105 and the hard mask layer 125 can be removed by suitable etching techniques, such as dry etching, wet etching, and/or other etching methods (e.g., reactive ion etching).

Reference is made to FIGS. 28A, 28B, 28C, and 28D. A dielectric material 111 is deposited over the vertically stacked multi-layer MIM capacitor C1. In some embodiments, the dielectric material 111 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 111 may be deposited using any suitable method, such as CVD, physical vapor deposition (PVD), ALD, PEALD, PECVD, SACVD, FCVD, spin-on, and/or the like, or a combination thereof. In some embodiments, the dielectric material 111 may be made of a different material than the dielectric material 105 and/or the hard mask layer 125. By way of example but not limiting the present disclosure, the dielectric material 111 may be made of silicon oxide, and the dielectric material 105 and/or the hard mask layer 125 may be made of silicon oxycarbide (SiOC).

Reference is made to FIGS. 29A, 29B, 29C, and 29D. A plurality of source/drain contact openings O11 are formed down through the dielectric material 111 to expose the electrodes 107', 108', 109', and 110'. Subsequently, a conductive material is deposited over the dielectric material 111 to fill the capacitor contact openings O11. Subsequently, a planarization process (e.g., CMP) is performed to remove the excess conductive material from above a top surface of the dielectric material 111. The remaining conductive material fills the capacitor contact openings O11 and serves as capacitor contacts 112*a*, 112*b*, 112*c*, and 112*d*. The capacitor contacts 112*a*, 112*b*, 112*c*, and 112*d* land on the electrodes 107', 108', 109', and 110' of the vertically stacked multi-layer MIM capacitor C1. The capacitor contact 112*a* may be used to provide the first voltage potential to the electrode 107', the capacitor contact 112*b* may be used to provide the second voltage potential to the electrode 108', the capacitor contact 112*c* may be used to provide the third voltage potential to the electrode 109', and the capacitor contact 112*d* may be used to provide the fourth voltage potential to the electrode 110'. In some embodiments, at least two of the first, second, third, and fourth voltage potential can be different from each other. In some embodiments, the conductive material may be deposited using any suitable method, such as CVD, physical vapor deposition (PVD), ALD, PEALD, PECVD, SACVD, FCVD, spin-on, and/or the like, or a combination thereof. In some embodiments, the conductive material may include TiN, TaN, Ti, Ta, Cu, Al, Ag, W, Ir, Ru, Pt, combinations thereof, or other suitable conductive materials.

Figure 29B:
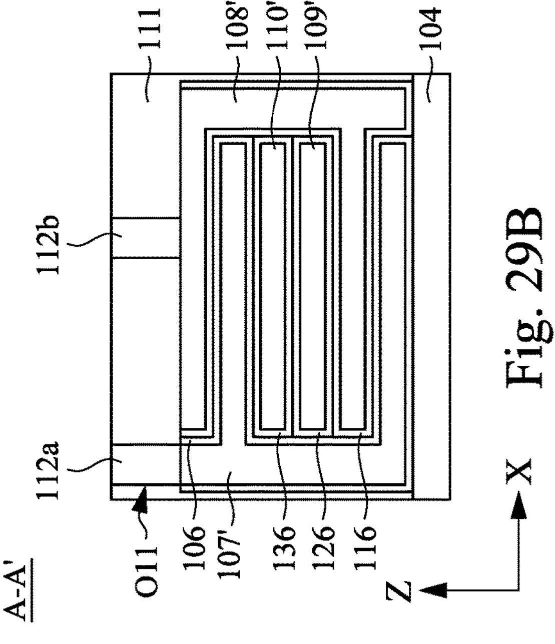
Figure 29D:
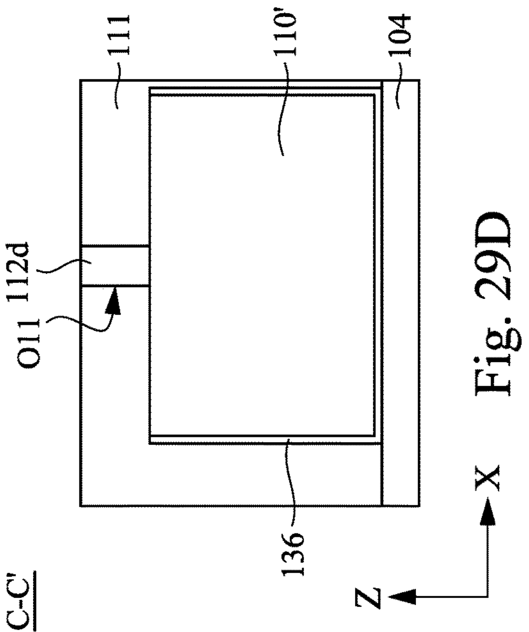
Figure 29A:
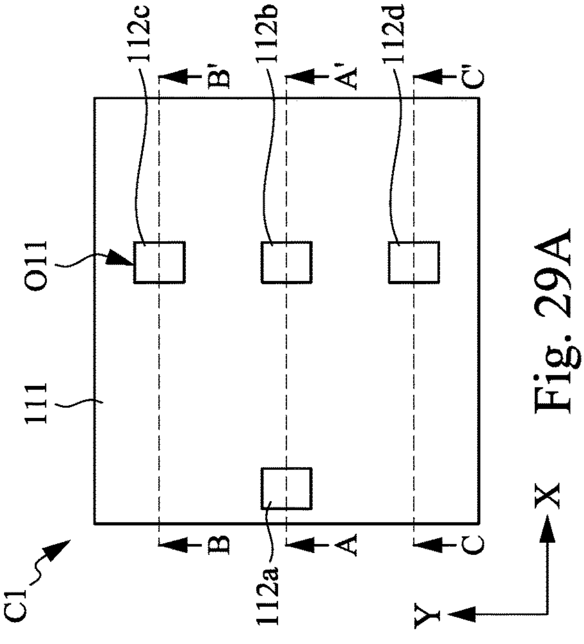
Figure 29C:
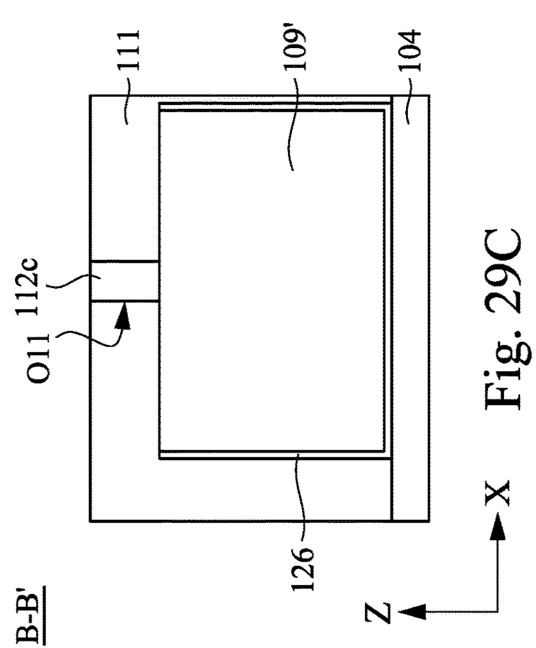
Figure 29E:
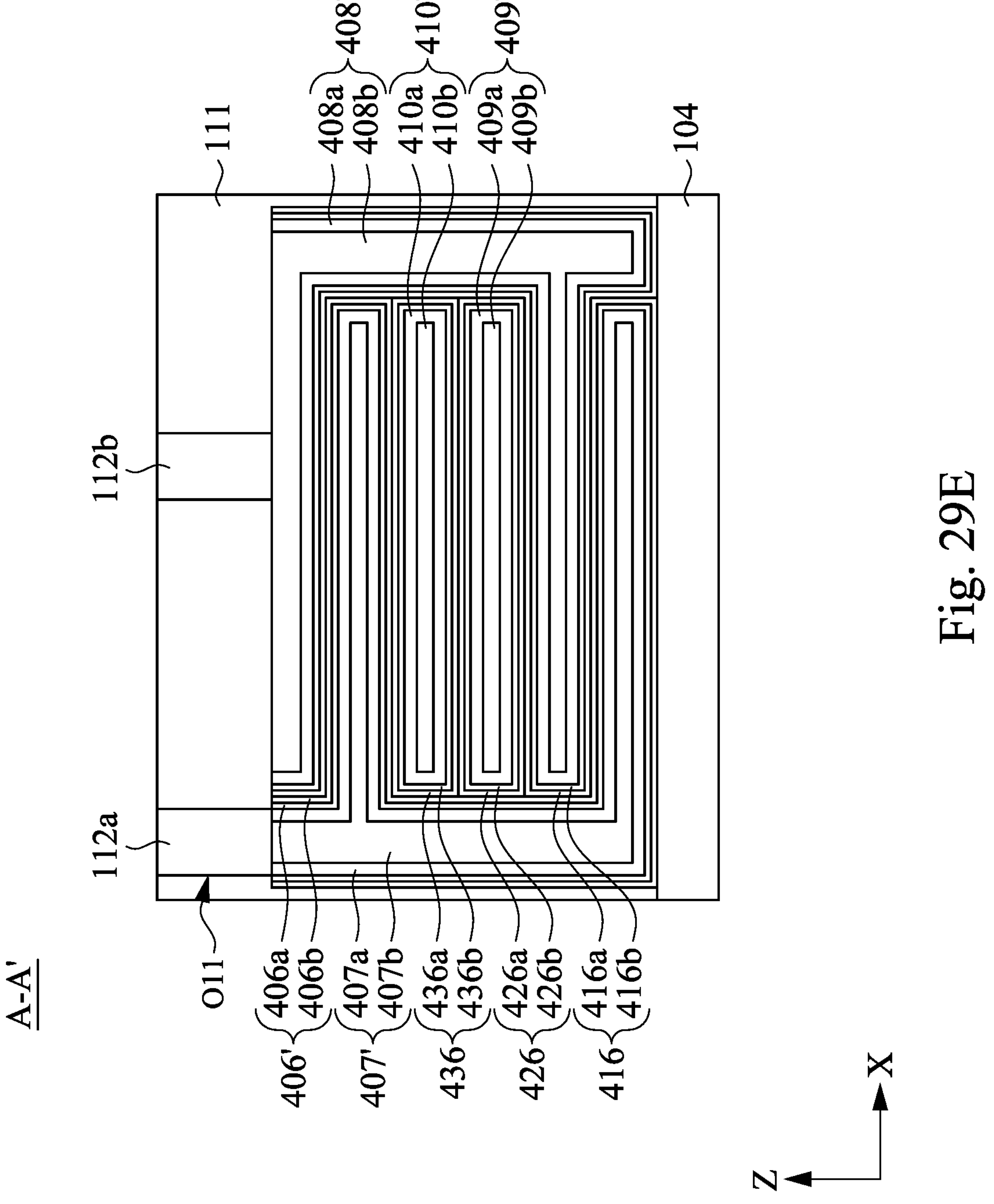
FIGS. 29E, 29F, and 29G illustrate schematic views of a vertically stacked multi-layer MIM capacitor corresponding to FIGS. 29B, 29C, and 29D.
Figure 29F:
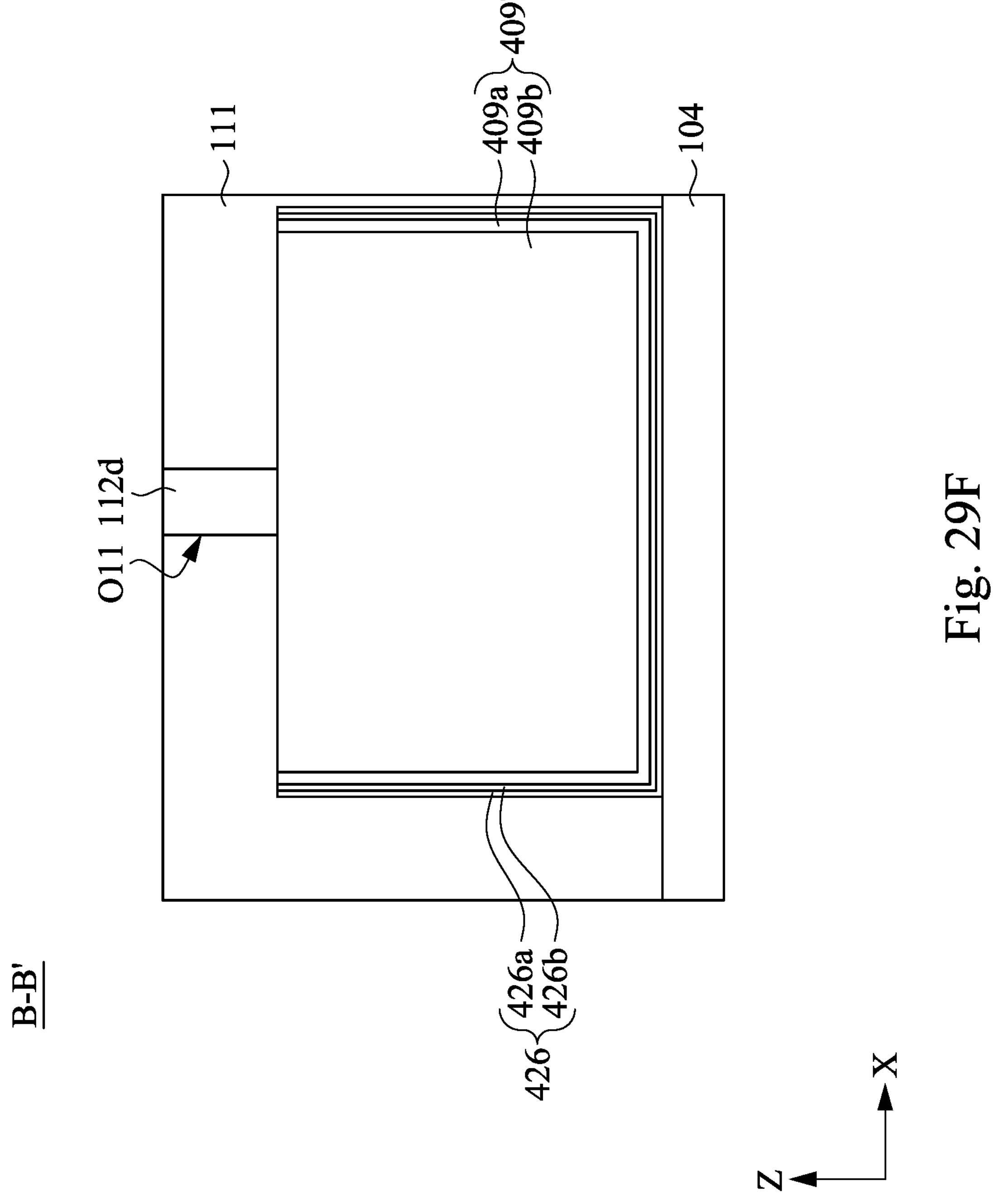
Figure 29G:
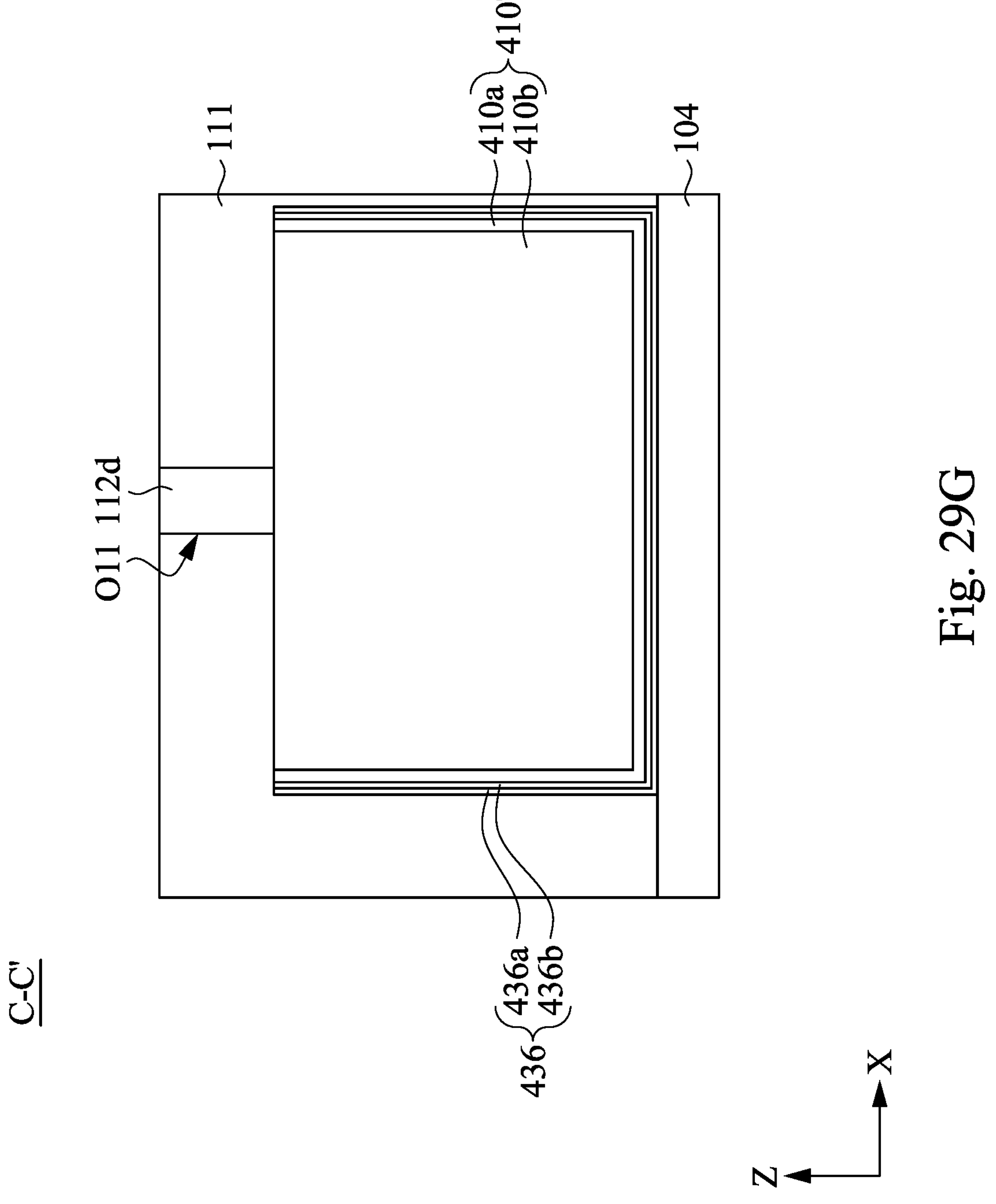
Figures 30A, 30B:
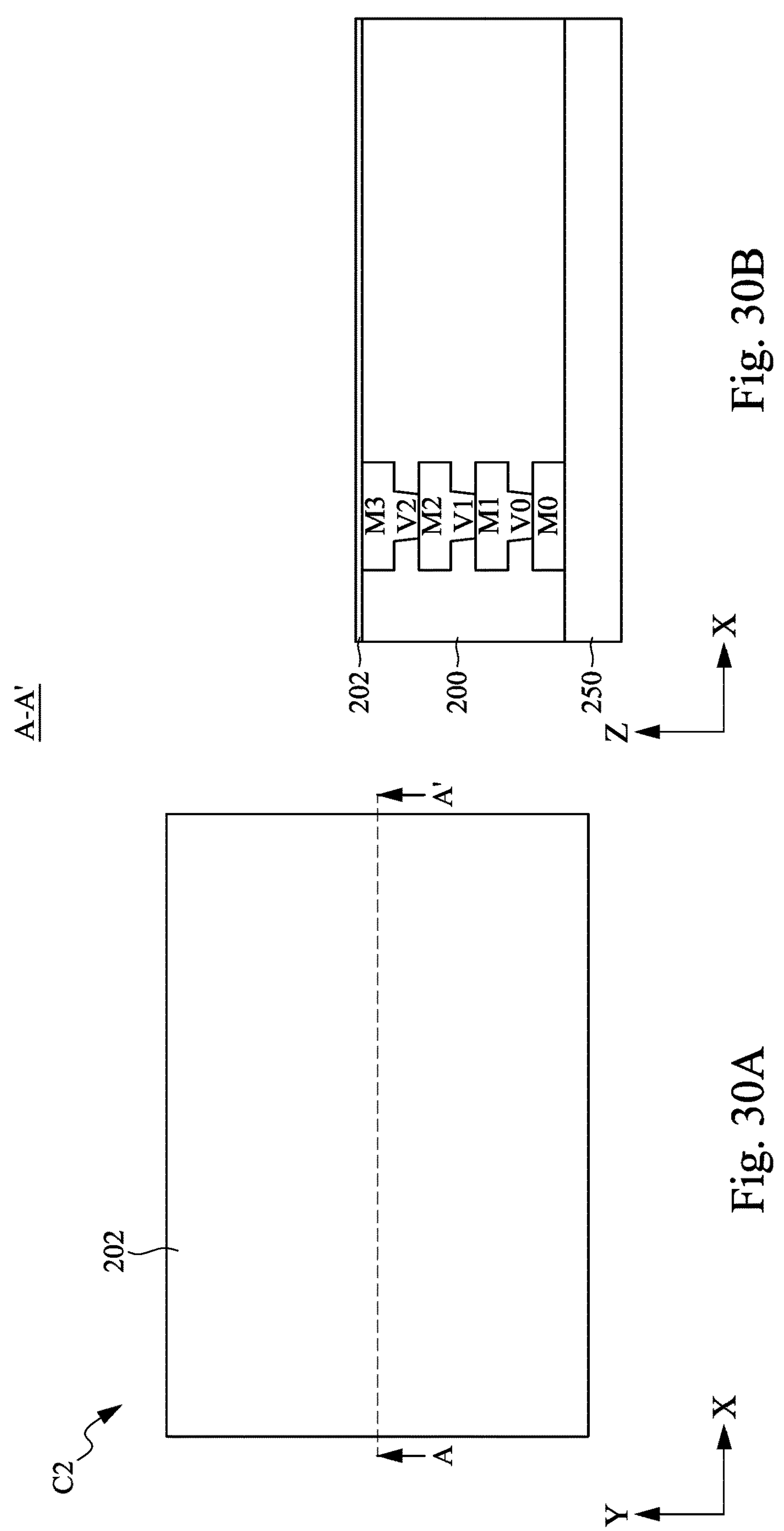
Figures 31A, 31B:
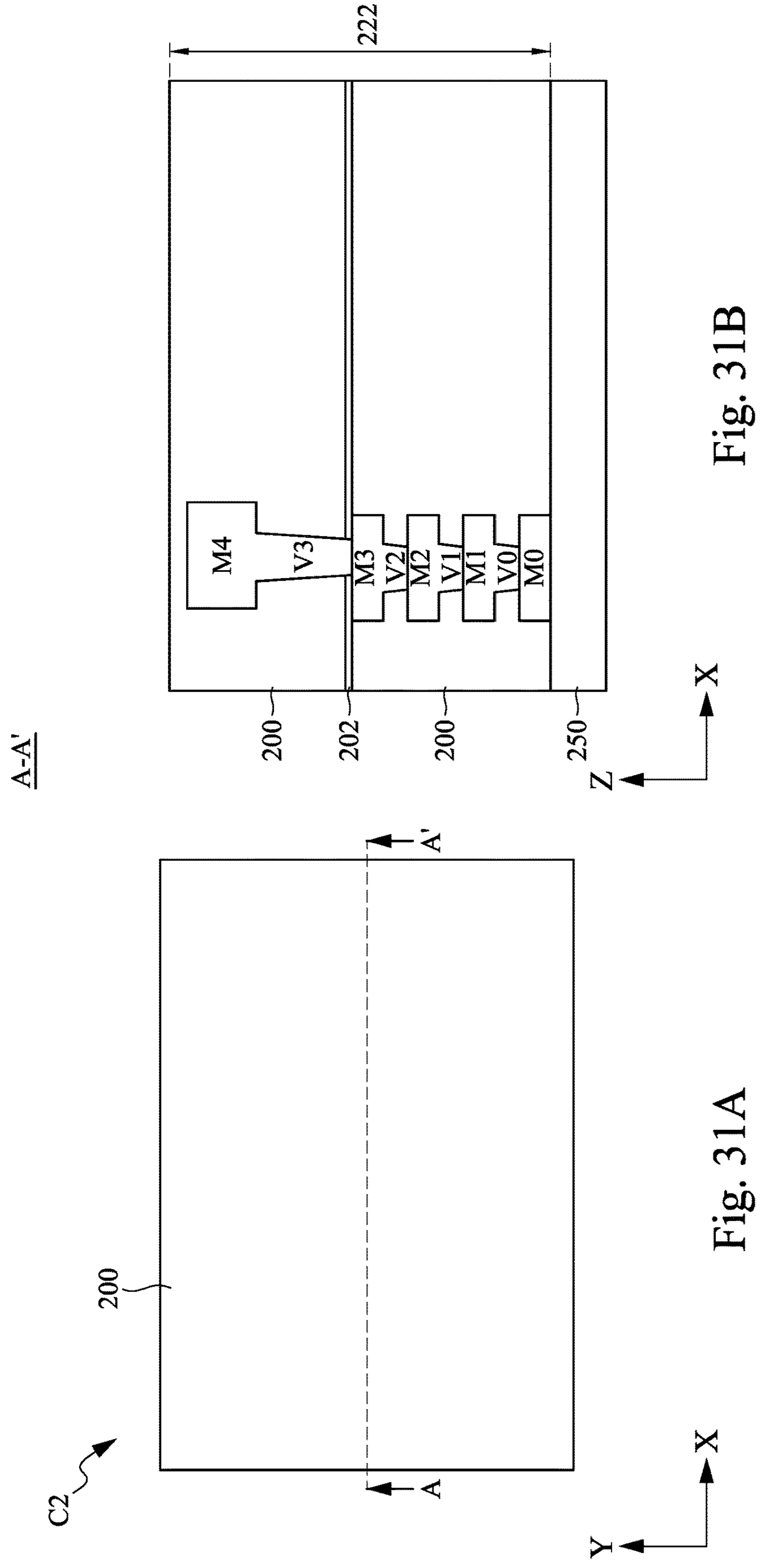

Reference is made to FIGS. 29E, 29F, and 29G. FIGS. 29E, 29F, and 29G illustrate schematic views of a vertically stacked multi-layer MIM capacitor corresponding to FIGS. 29B, 29C, and 29D. The structure and function of the components and their relationships in the semiconductor structure are substantially the same as the semiconductor structure shown in FIGS. 29B, 29C, and 29D, and the related detailed descriptions may refer to the foregoing paragraphs, and are not described again herein. It is noted that, the difference between the present embodiment and the embodiment in FIGS. 29B, 29C, and 29D is in that the dielectric layers 406, 416, 426, and 436 which can be a multilayer structure, and the electrodes 407', 408', 409', and 410' which can be a multilayer structure. For example, the dielectric layer 406 may include layers 406*a* and 406*b* having different materials from each other, the dielectric layer 416 may include layers 416*a* and 416*b* having different materials from each other, the dielectric layer 426 may include layers 426*a* and 426*b* having different materials from each other, and the dielectric layer 436 may include layers 436*a* and 436*b* having different materials from each other. The electrodes 407' may include layers 407*a* and 407*b* having different materials from each other, the electrodes 408' may include layers 408*a* and 408*b* having different materials from each other, the electrodes 409' may include layers 409*a* and 409*b* having different materials from each other, and the electrodes 410' may include layers 410*a* and 410*b* having different materials from each other. Other embodiments may contain more layers in at least one of the dielectric layers 406, 416, 426, and 436 and the electrodes 407', 408', 409', and 410'.

In some embodiments, the layers 406*a*, 406*b*, 416*a*, 416*b*, 426*a*, 426*b*, 436*a*, and/or 436*b* may be made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 136 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In some embodiments, the layers 407*a*, 407*b*, 408*a*, 408*b*, 409*a*, 409*b*, 410*a*, and/or 410*b* may be made of, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof.

In some embodiments, the vertically stacked multi-layer MIM capacitor of the present disclosure can be integrated in FEOL or arbitrary metal layers of BEOL. Specifically, the IC fabrication process can be divided into three modules, in which each module may include all or some of the following operations: patterning (e.g., photolithography and etch); implantation; metal and dielectric material deposition; wet or dry clean; and planarization (e.g., etch-back process or chemical mechanical planarization). The three modules can be categorized as front end of the line (FEOL), middle of the line (MOL)/middle end of the line (MEOL), and back end of the line (BEOL).

In FEOL, various transistors are formed. For example, FEOL includes the formation of source/drain regions, a gate structure, and spacers on sides of the gate structure. The source/drain regions can be doped substrate regions formed with an implantation process after the gate structure formation. The gate structure includes a metal gate electrode, which can include two or more metal layers. The gate dielectric can include a high dielectric constant (high-k) material (e.g., greater than 3.9, which is the dielectric constant of silicon oxide). The metals in the gate electrode set the work function of the gate, in which the work functions can be different between P-type transistors and N-type transistors. The gate dielectric provides electrical isolation between the metal gate electrode and a channel formed between the source and the drain regions when the transistor is in operation.

In MEOL, low level interconnects (contacts) are formed and may include two layers of contacts on top of each other. The MEOL interconnects can have smaller critical dimensions (CDs; e.g., line width) and are spaced closer together compared to their BEOL counterparts. The MEOL contact layers serve to electrically connect the various regions of the transistors, i.e., the source/drain and metal gate electrode, to higher level interconnects in BEOL. A first layer of contacts in MEOL, known as “trench silicide (TS)” or “trench contacts (TC),” are formed over the source and drain regions on either side of the gate structure. In the TS, or TC, configuration, the silicide is formed in the trench and after the trench formation. The silicide lowers the resistance between the source and drain regions and the metal contacts. The gate structure and the first layer of contacts are considered to be on the same “level.” The second layers of contacts are formed over the gate electrode and TS. MEOL contacts are embedded in a dielectric material, or a dielectric stack of materials, that ensures their electrical isolation.

In BEOL, an interlayer dielectric (ILD) layer is deposited over the MEOL contacts. The formation of high level interconnects in BEOL involves patterning a hard mask (HM) layer and subsequently etching through the HM layer to form holes and trenches in the ILD layer. The ILD layer can be a low-k material. Low-k materials can have a dielectric constant below 3.9, which is the dielectric constant of silicon oxide (SiO2). Low-k materials in BEOL can reduce unwanted parasitic capacitance and minimize resistance-capacitance (RC) delays. BEOL interconnects include two types of conductive lines: the vertical interconnect access lines (vias) and the lateral lines (lines). The vias run through the ILD layer in the vertical direction and create electrical connections to layers above or below the ILD layer. Lines are laid in the lateral direction within the ILD layer to connect a variety of components within the same ILD layer. An interconnect layer can have one or more vias and one or more lines. BEOL may include multiple interconnect layers (e.g., up to 9 or more) with vias and lines of increasing CD size (e.g., line width) and line pitch. Each interconnect layer is aligned to the previous interconnect layer to ensure proper via and line connectivity.

Reference is made to FIGS. 30A to 57D. FIGS. 30A to 57D illustrate schematic views of intermediate stages in the formation of a vertically stacked multi-layer MIM capacitor C2 in an integrated circuit in accordance with some embodiments of the present disclosure. FIGS. 30A, 31A, 32A, 33A, 34A, 35A, 36A, 37A, 38A, 39A, 40A, 41A, 42A, 43A, 44A, 45A, 46A, 47A, 48A, 49A, 50A, 51A, 52A, 53A, 54A, 55A, 56A, and 57A are top views of the integrated circuit in accordance with some embodiments of the present disclosure. FIGS. 30A, 31A, 32A, 33A, 34A, 35A, 36A, 37A, 38A, 39A, 40A, 41A, 42A, 43A, 44A, 45A, 46A, 47A, 48A, 49A, 50A, 51A, 52A, 53A, 54A, 55A, 56A, and 57A are cross-sectional views obtained from a vertical plane corresponding to line A-A' in FIGS. 30B, 31B, 32B, 33B, 34B, 35B, 36B, 37B, 38B, 39B, 40B, 41B, 42B, 43B, 44B, 45B, 46B, 47B, 48B, 49B, 50B, 51B, 52B, 53B, 54B, 55B, 56B, and 57B, respectively. FIGS. 44C, 45C, 46C, 47C, 48C, 49C, 55C, 56C, and 57C are cross-sectional views obtained from a vertical plane corresponding to line B-B' in FIGS. 44A, 45A, 46A, 47A, 48A, 49A, 55A, 56A, and 57A, respectively. FIGS. 49D, 50C, 51C, 52C, 53C, 54C, 55D, 56D, and 57D are cross-sectional views obtained from a vertical plane corresponding to line B-B' in FIGS. 49A, 50A, 51A, 52A, 53A, 54A, 55A, 56A, and 57A, respectively.

Reference is made to FIGS. 30A, 30B, 31A, and 31B. An interconnect structure 222 (see FIG. 31B) is formed over a substrate 250. In some embodiments, the substrate 250 may include silicon. Alternatively, the substrate 250 may include germanium, silicon germanium, gallium arsenide or other appropriate semiconductor materials. Also alternatively, the substrate 250 may include an epitaxial layer. For example, the substrate 250 may have an epitaxial layer overlying a bulk semiconductor. Further, the substrate 250 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 250 may include a semiconductor-on-insulator (SOI) structure. Also alternatively, the substrate 250 may include a buried dielectric layer, such as a buried oxide (BOX) layer, such as that formed by separation by implantation of oxygen (SIMOX) technology, wafer bonding, SEG, or another appropriate method.

The interconnect structure 222 may include, for example, five metallization layers, labeled as M0 through M4, with three layers of metallization vias or interconnects, labeled as V1 through V3. Other embodiments may contain more or fewer metallization layers and corresponding more or fewer number of vias. The metal line illustrated here just for an example, and the metal line may be otherwise oriented (rotated 90 degrees or at other orientations). Each of metallization layers M0-M4 connected by interconnects V1-V3, with M0 connecting the stack to a source/drain contact of a transistor formed in the substrate 250. Also included in integrated circuit is a plurality of inter-metal dielectric (IMD) layers. In some embodiments, the plurality of IMD layers can be collectively referred to as an IMD structure 200. The IMD structure may provide electrical insulation as well as structural support for the various features of the integrated circuit during many fabrication process steps. An etch stop layer 202 may be formed above one of the metallization layers, such as the metallization layer M3, prior to the forming of the interconnect V3.

In some embodiments, the metallization layers and metallization vias may be made of a conductive material including, such as TiN, TaN, Ti, Ta, Cu, Al, Ag, W, Ir, Ru, Pt, combinations thereof, or other suitable conductive materials. In some embodiments, the conductive material used to form the metallization layers and metallization vias may be deposited using any suitable method, such as CVD, physical vapor deposition (PVD), ALD, PEALD, PECVD, SACVD, FCVD, spin-on, and/or the like, or a combination thereof. In some embodiments, the IMD structure 200 may be made of a dielectric material including, such as silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric material used to form the IMD structure 200 may be deposited using any suitable method, such as CVD, physical vapor deposition (PVD), ALD, PEALD, PECVD, SACVD, FCVD, spin-on, and/or the like, or a combination thereof. In some embodiments, the dielectric material 105 can be interchangeably referred to a hard mask layer. In some embodiments, the etch stop layer 202 may include $Si_3N_4$, $SiO_x$, SiON, SiC, SiBN, SiCBN, other suitable dielectric materials, or combinations thereof. In some embodiments, the etch stop layer 202 may be made of a different material than the IMD structure 200. By way of example, if the IMD structure 200 is made of silicon oxide, the etch stop layer 202 may be made of a dielectric material different from silicon oxide, such as silicon nitride. In some embodiments, the etch stop layer 202 can be formed using, for example, plasma enhanced CVD, low pressure CVD, ALD or other suitable techniques.

Figures 32A, 32B:
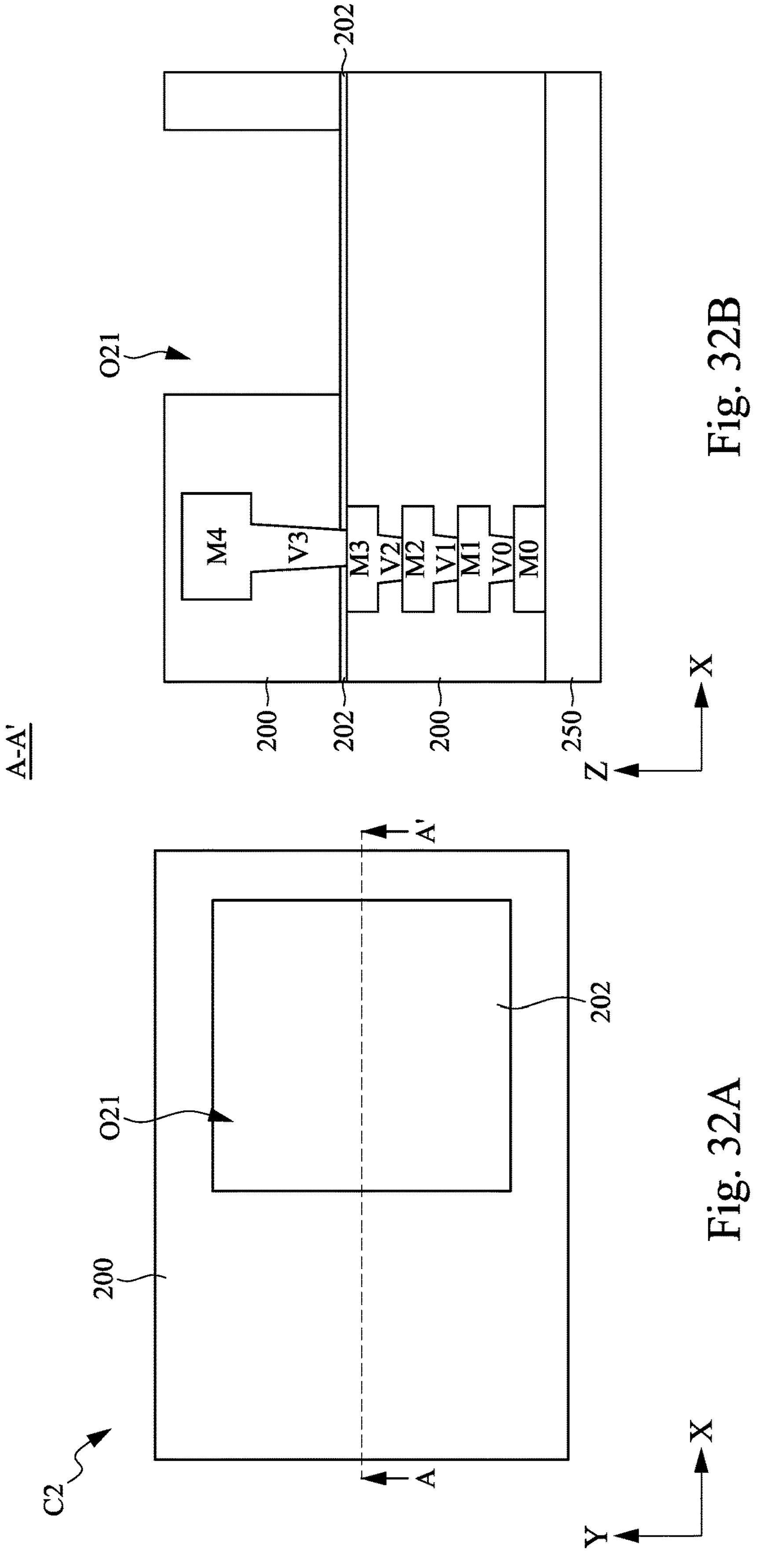

Reference is made to FIGS. 32A and 32B. A capacitor opening O21 where a vertically stacked multi-layer MIM capacitor C2 (see FIGS. 54A-54C) will be subsequently formed therein may be formed in the IMD structure 200. For example, a patterned mask (not shown) may be formed over the IMD structure 200 and used to etch the capacitor opening O21 that extend through the interconnect structure 222 by using photolithography and etching techniques until the etch stop layer 202 is exposed. In some embodiments, after the capacitor opening O21 is formed, the patterned mask can be removed by a suitable technique, such a wet clean process, an ashing process, or the like. In some embodiments, the capacitor opening O21 may expose the etch stop layer 202. In some embodiments, the capacitor opening O21 may downwardly extend to the etch stop layer 202 and terminate prior to reaching the etch stop layer 202.

Figures 33A, 33B:
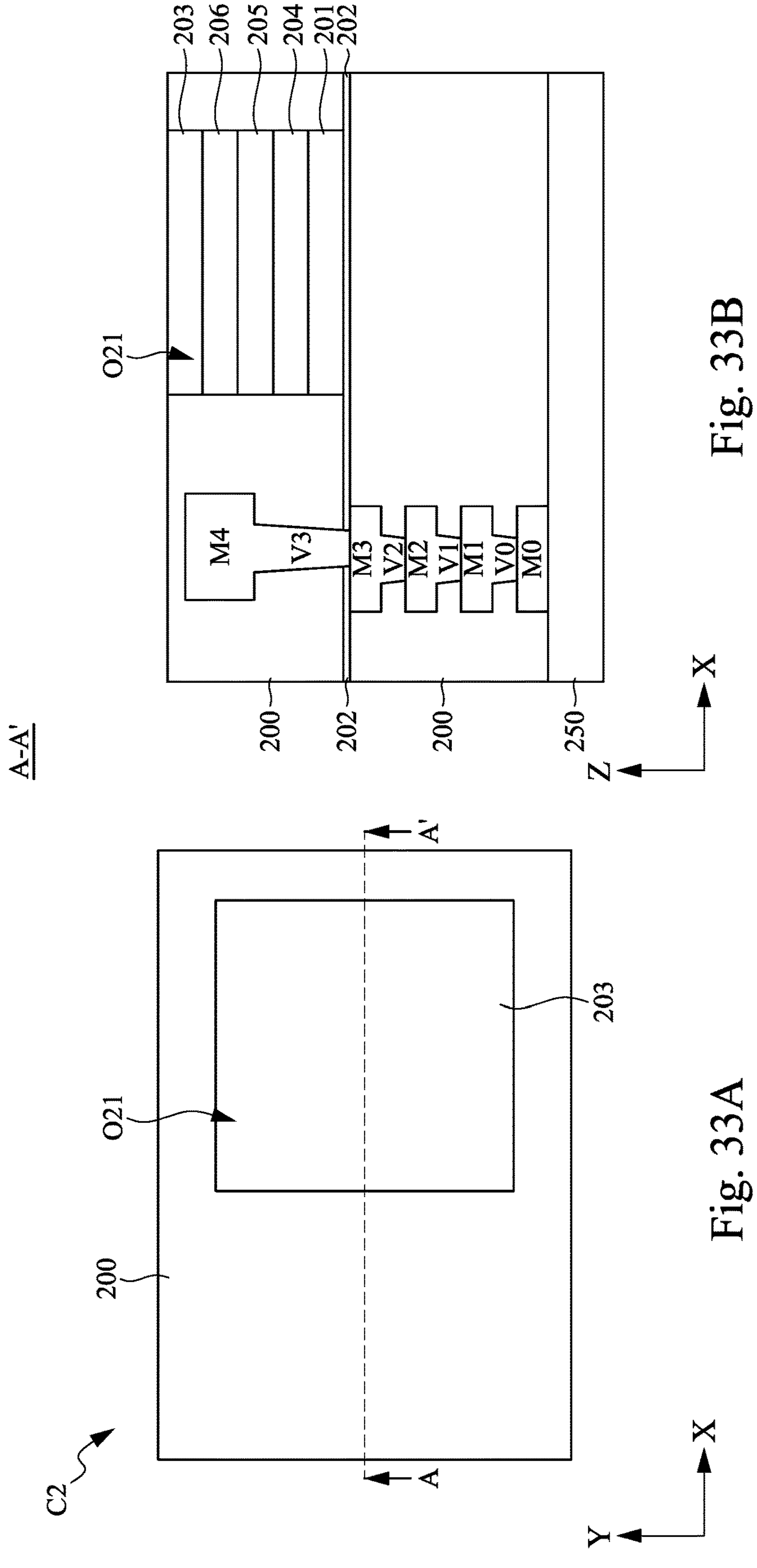

Reference is made to FIGS. 33A and 33B. A sacrificial multi-layer stack including sacrificial layers 201, 204, 205, 206, and 203 is formed in the capacitor opening O21 of the IMD structure 200. In some embodiments, as will be subsequently described in greater detail, the sacrificial layers 201, 204, 205, 206, and 203 will be removed in sequence as shown in FIGS. 35B, 41B, 46B, and 51B. In some embodiments, the sacrificial multi-layer stack includes five layers of the sacrificial layers. It should be appreciated that the sacrificial multi-layer stack may include any number of the sacrificial layer. By way of example but not limiting the present disclosure, a number of the sacrificial layers in the capacitor opening O21 may be in a range from about 3 to about 1000.

The semiconductor material of the sacrificial layer 201 may be a material that has a different etching selectivity than the etching of the sacrificial layers 204, 205, and 206, and substantially has a same etching selectivity as the etching of the sacrificial layer 203. In other words, the sacrificial layers 201 may be formed of a different material than the sacrificial layers 204, 205, and 206, and may be formed of a same material as the sacrificial layer 203. For example, the sacrificial layer 201 may be formed of a first semiconductor material, and the sacrificial layers 204, 205, and 206 may be formed of second, third, and fourth semiconductor materials different from the first sacrificial layers 201, and the sacrificial layer 203 may be formed of the first semiconductor material as the sacrificial layer 201. In some embodiments, the sacrificial layer 201, 204, 205, 206, and/or 203 may be made of semiconductor materials selected from, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, the sacrificial layer 201, 204, 205, 206, and/or 203 may be made of dielectric materials selected from, such as silicon oxide, silicon nitride, silicon oxynitride, silicon carbide, silicon oxycarbide (SiOC), or the like.

By way of example but not limiting the present disclosure, the sacrificial layers 201 and 203 may be made of silicon, the sacrificial layers 204 and 206 may be made of silicon germanium (e.g., $Si_xGe_{1-x}$) and have germanium atomic concentrations different from each other, and the sacrificial layer 205 may be made of a dielectric material, such as silicon oxide. In some embodiments, the sacrificial layer 204 may have a higher germanium atomic concentration than the sacrificial layer 201, and the sacrificial layer 206 may have a higher germanium atomic concentration than the sacrificial layer 204. For example, the sacrificial layer 201 may have a germanium atomic concentration less than about 25%, such as about 5, 10, 15, 20 or 25%, the sacrificial layer 204 may have a germanium atomic concentration in a range from about 25% to about 60%, such as about 25, 30, 35, 40, 45, 50, 55, or 60%, and the sacrificial layer 206 may have a germanium atomic concentration in a range from about 60% to about 95%, such as about 60, 65, 70, 75, 80, 85, 90, or 95%. In some embodiments, the sacrificial layer 201 may be free of germanium.

The sacrificial layers 201, 204, 205, 206, and 203 in the sacrificial multi-layer stack are formed by alternating deposition and etching processes in sequence. For example, each sacrificial layer is formed by depositing a sacrificial material in opening O21, followed by removing a portion of the sacrificial material from sidewalls of the opening 21 by a directional etching process, while leaving another portion of the sacrificial material at a bottom of the capacitor opening O21. In some embodiments, each of the sacrificial layers 201, 204, 205, 206, and 203 in the sacrificial multi-layer stack may be grown by a process such as vapor phase epitaxy (VPE) or molecular beam epitaxy (MBE), deposited by a process such as chemical vapor deposition (CVD) or atomic layer deposition (ALD), or the like. Subsequently, the sacrificial multi-layer stack is patterned by using suitable photolithography and etching techniques, resulting in a fin-like stack.

Figures 34A, 34B:
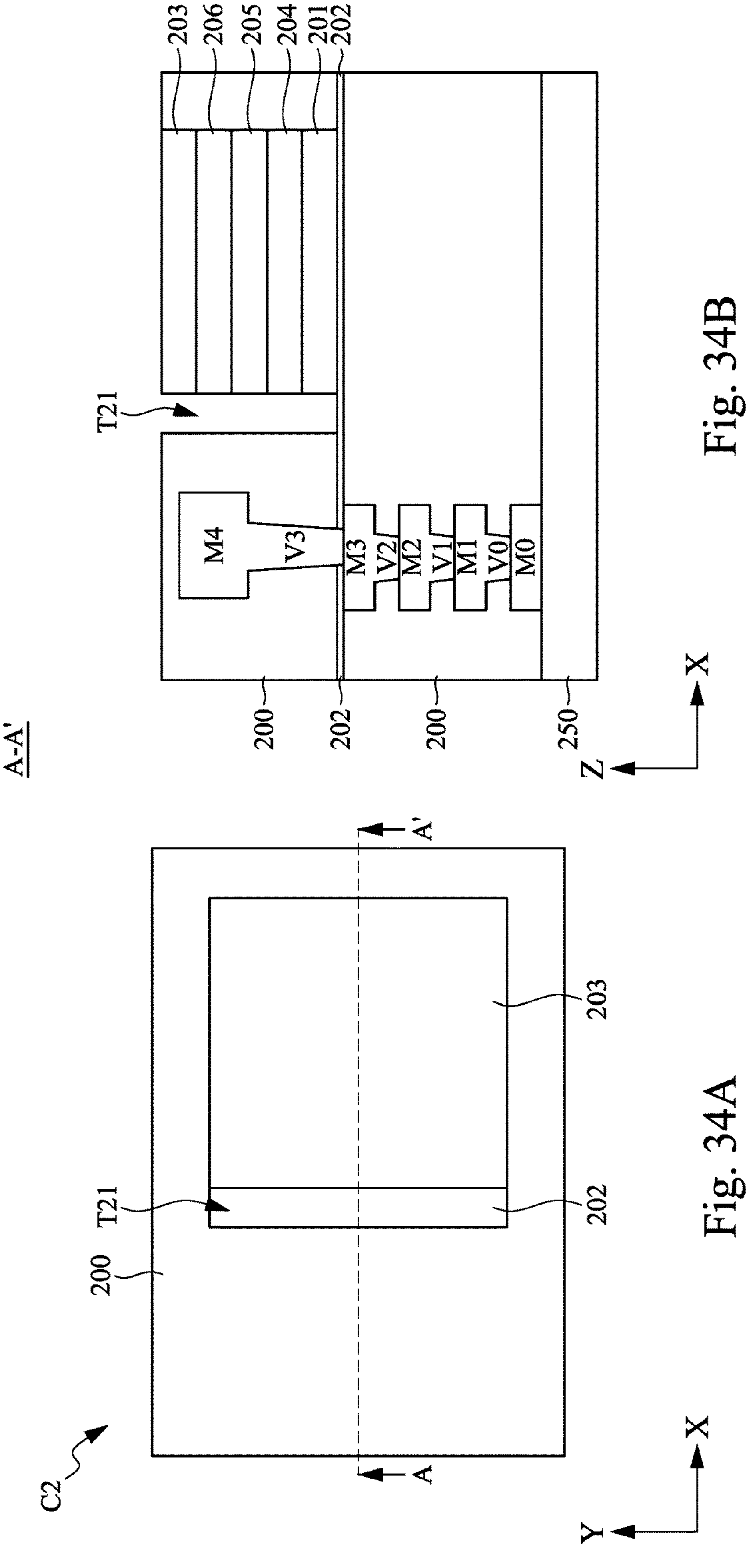

Reference is made to FIGS. 34A and 34B. A capacitor trench T21 is formed in the IMD structure 200 to expose a first sidewall of the sacrificial multi-layer stack. For example, a patterned mask (not shown) may be formed over the IMD structure 200 and used to etch the IMD structure 200 until the etch stop layer 202 is exposed to form the capacitor trench T21 that extends in the IMD structure 200 by using photolithography and etching techniques, such that the first sidewall of the sacrificial multi-layer stack is exposed from the capacitor trench T21. In some embodiments, the capacitor trench T21 may have a rectangular profile extending along Y-direction from the top view as shown in FIG. 34A. In some embodiments, after the capacitor trench T21 is formed, the patterned mask can be removed by a suitable technique, such as a planarization process, a wet clean process, an ashing process, or the like. In some embodiments, the capacitor trench T21 can be interchangeably referred to a first capacitor opening.

Figures 35A, 35B:
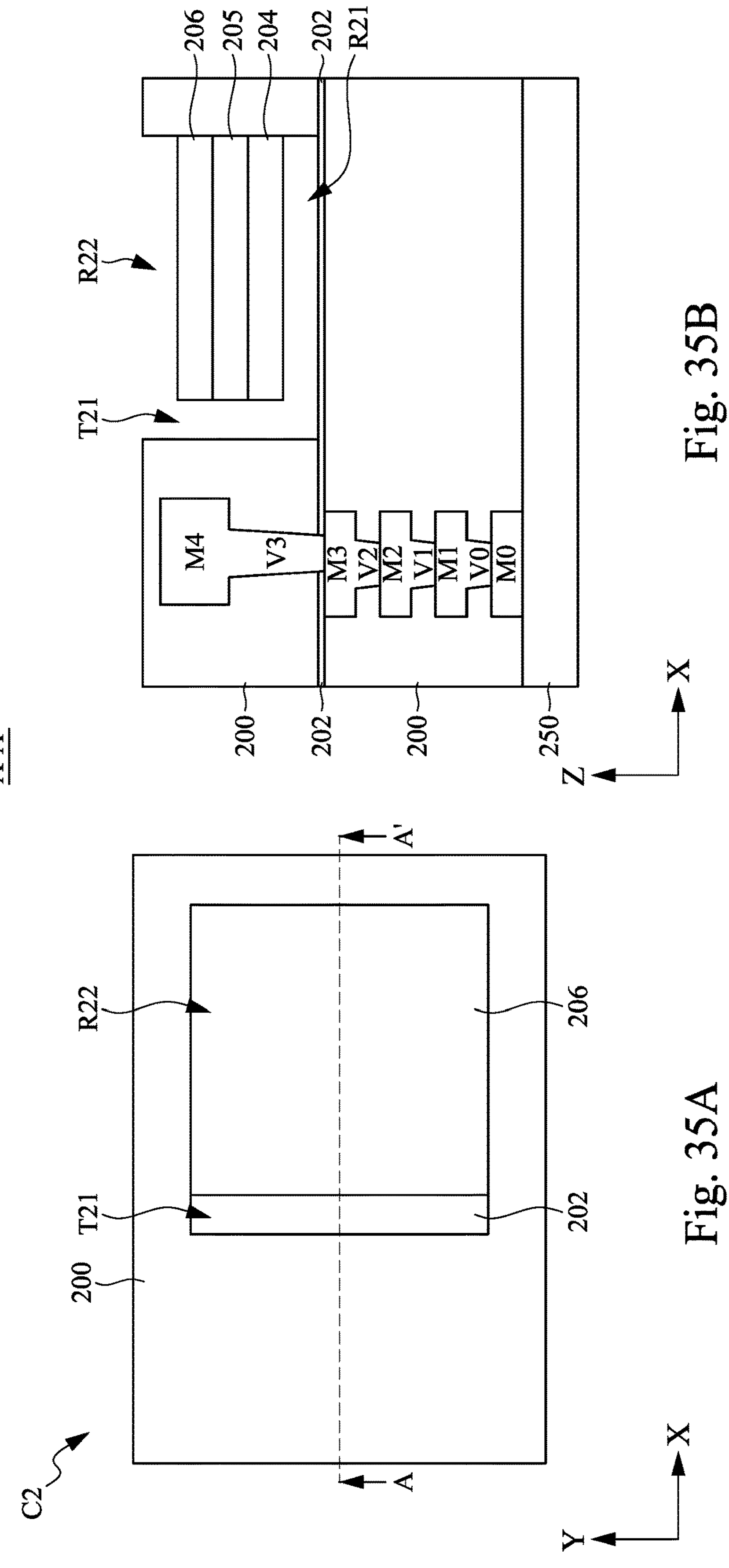

Reference is made to FIGS. 35A and 35B. The first sacrificial layers 201 and 203 (see FIG. 34B) in the sacrificial multi-layer stack are removed in one or more etching process, so that the capacitor recesses R21 and R22 (see FIG. 35B) are formed over the etch stop layer 202. The capacitor recesses R21 can expose a bottom surface of the sacrificial layer 204, and the capacitor recesses R22 can expose a top surface of the sacrificial layer 206. In some embodiments, the sacrificial layers 201 and 203 may be removed by an anisotropic dry etch process. For example, the etching process may include a dry etch process using reaction gas(es) that selectively etch the sacrificial layers 201 and 203 at faster rates than the etch stop layer 202, the IMD structure 200, and the sacrificial layers 204, 205, and 206. In some embodiments, when the sacrificial layers 201 and 203 as shown in FIG. 34B are formed of silicon, the sacrificial layers 204 and 206 may be formed of silicon germanium, and the sacrificial layer 205 may be formed of silicon oxide. In some embodiments, the capacitor recesses R21 and R22 can be interchangeably referred to capacitor electrode spaces that inherit the shapes of the sacrificial layers 201 and 203.

Figures 36A, 36B:
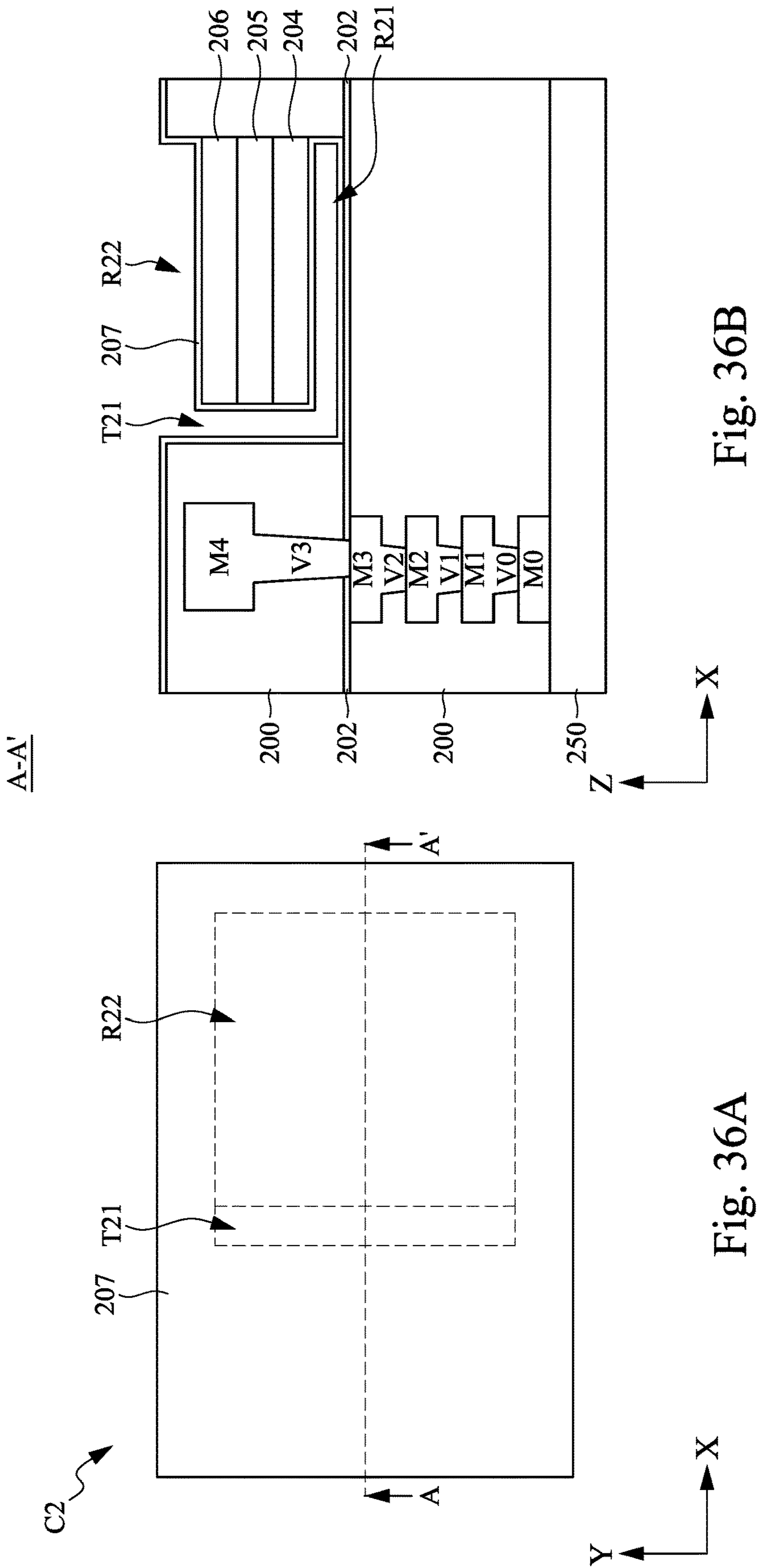

Reference is made to FIGS. 36A and 36B. A dielectric layer 207 is blanket formed over the IMD structure 200 and in the capacitor trench T21 and the capacitor recesses R21 and R22. In some embodiments, the dielectric layer 207 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 207 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 207 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 207 may be a multi-layer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 207 may be deposited using any suitable method, such as CVD, physical vapor deposition (PVD), ALD, PEALD, PECVD, SACVD, FCVD, spin-on, and/or the like, or a combination thereof.

Figures 37A, 37B:
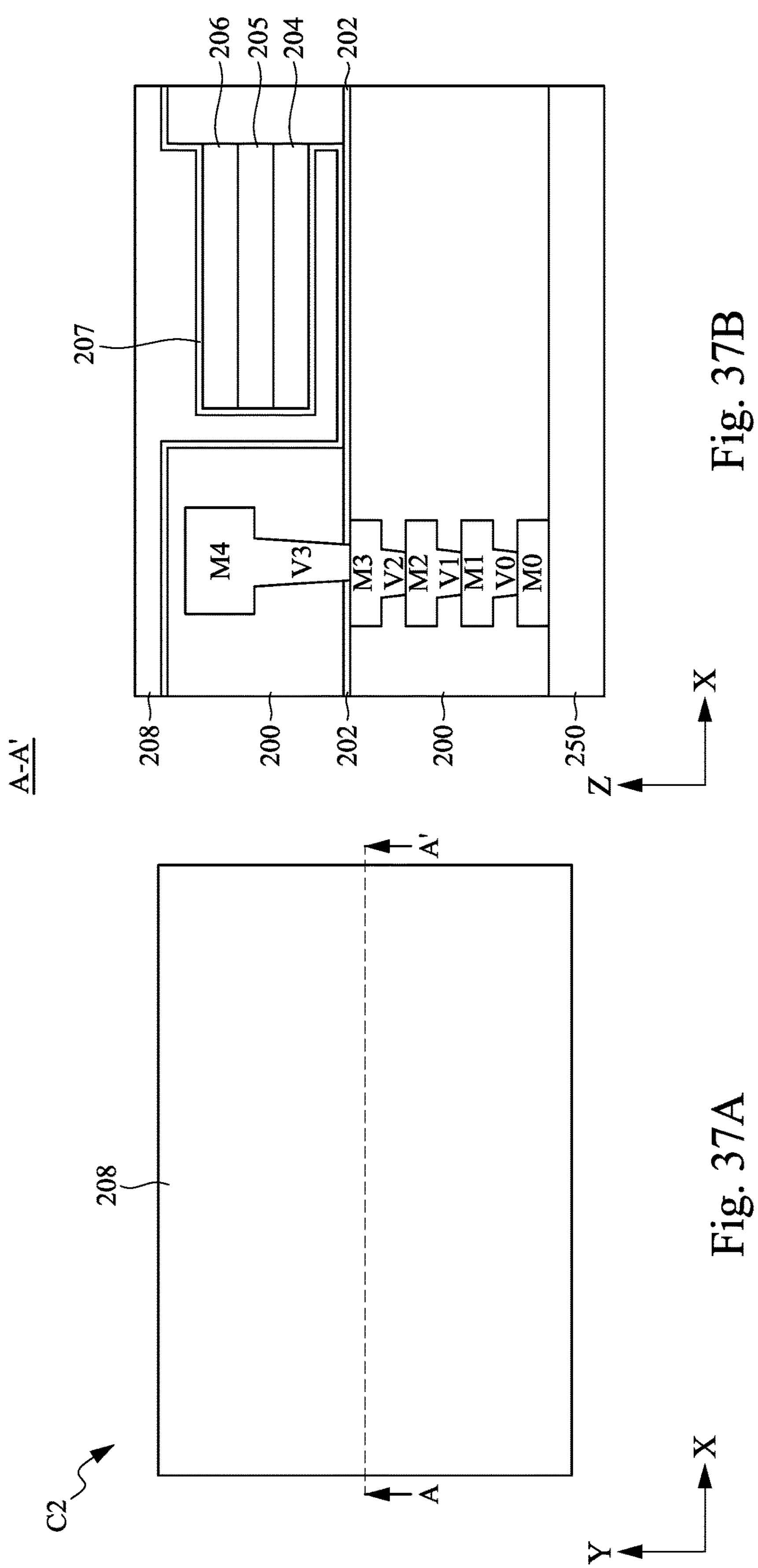

Reference is made to FIGS. 37A and 37B. A conductive material 208 is deposited over the dielectric layer 207. An interface between the dielectric layer 207 and the conductive material 208 can be smooth or rough. In some embodiments, the conductive material 208 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 208 may be made of a same material as the metallization layers, such as Cu. In some embodiments, the conductive material 208 may be deposited using any suitable method, such as CVD, physical vapor deposition (PVD), ALD, PEALD, PECVD, SACVD, FCVD, spin-on, and/or the like, or a combination thereof.

Figures 38A, 38B:
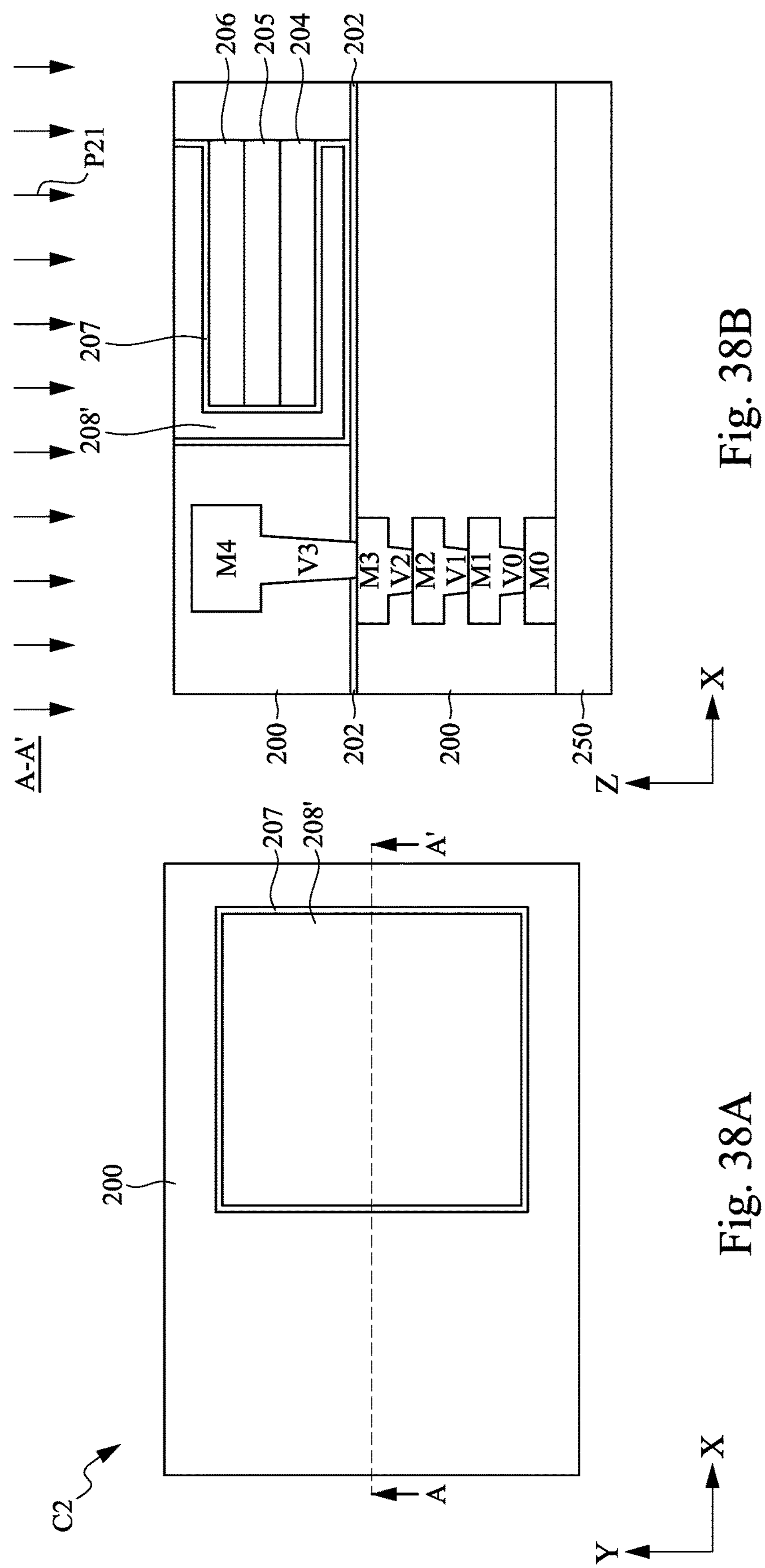

Reference is made to FIGS. 38A and 38B. A planarization process P21 (e.g., CMP) is performed to remove the excessive dielectric layer 207 and the conductive material 208 (see FIG. 8B) above the top surface of the IMD structure 200 to form an electrode 208' of a vertically stacked multi-layer MIM capacitor C2 (see FIGS. 54A-54C) in the capacitor trench T21 (see FIG. 37B) and the capacitor recesses R21 and R22 (see FIG. 37B). The IMD structure 200 may also act as an etch stop layer for etching the dielectric layer 207 and the conductive material 208.

Figures 39A, 39B:
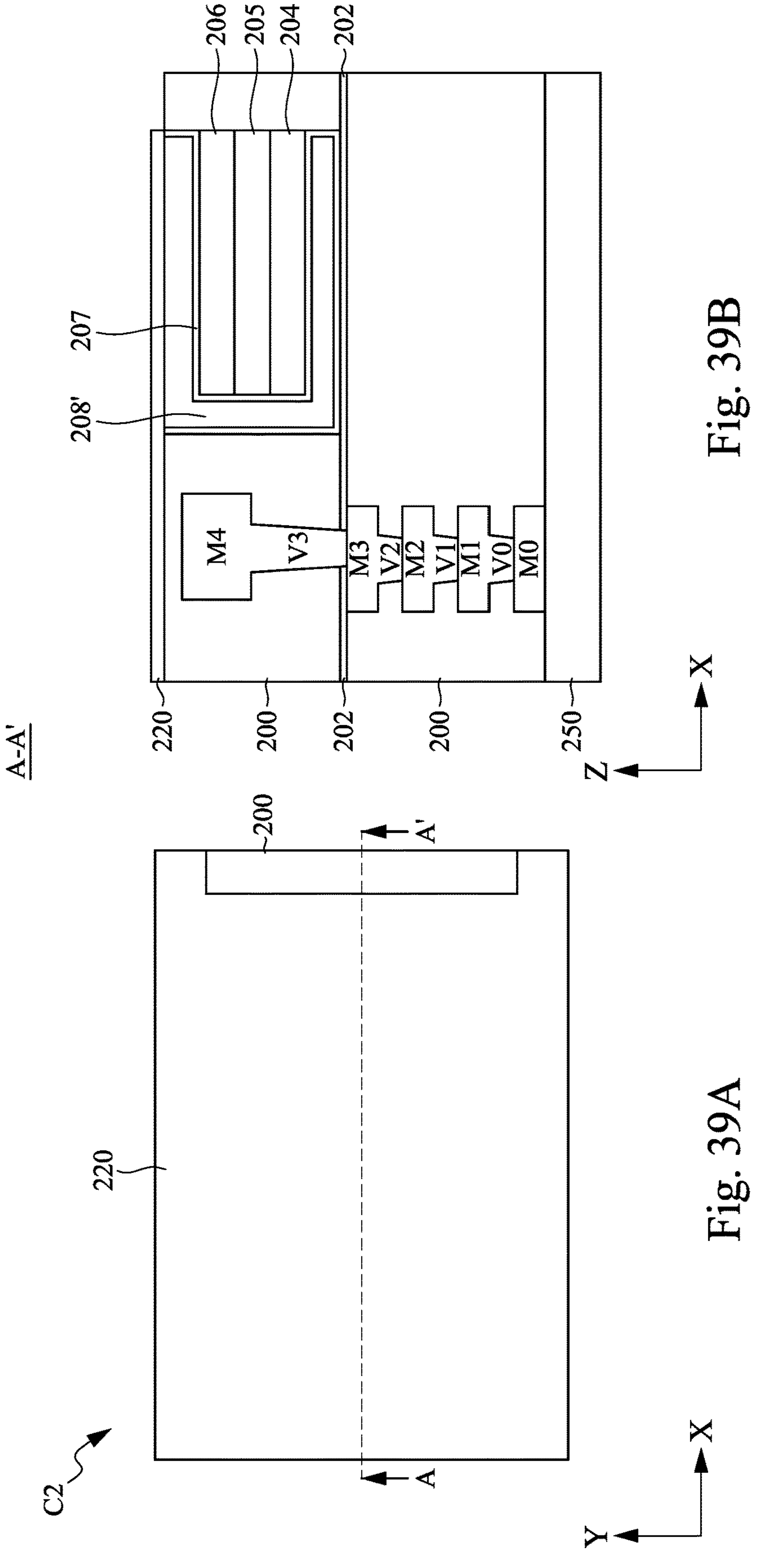

Reference is made to FIGS. 39A and 39B. The patterned hard mask layer 220 may be formed over the IMD structure 200 and then be used to etch the IMD structure 200. The hard mask layer 220 may be patterned by a lithography process including include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). In some embodiments, the hard mask layer 220 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the hard mask layer 220 may be made of the same material as the hard mask layer 220, thereby resulting in a substantially indistinguishable interface between the hard mask layer 220 and the IMD structure 200. In some embodiments, the hard mask layer 220 may be made of a different material than the IMD structure 200.

Figures 40A, 40B:
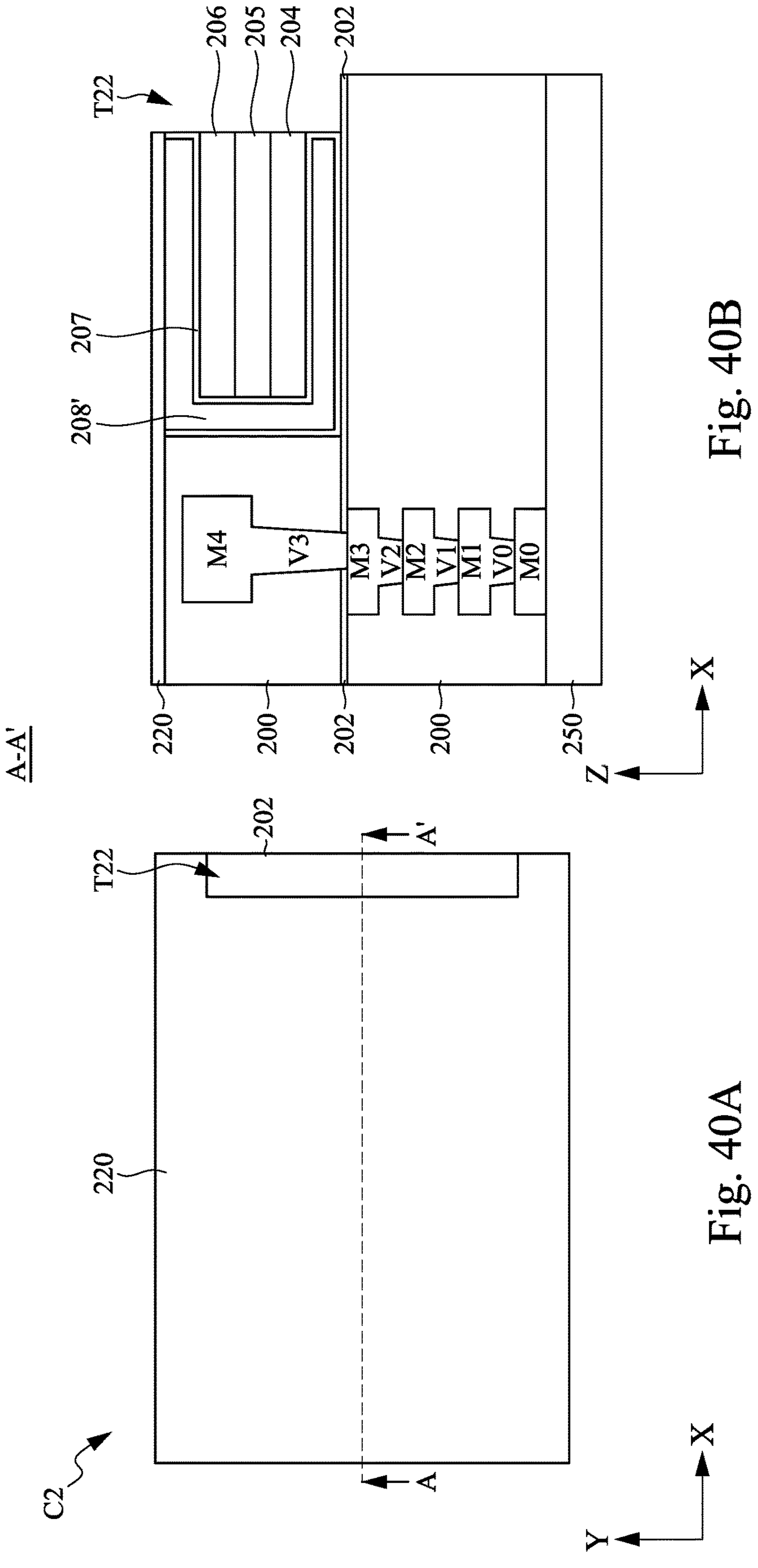

Reference is made to FIGS. 40A and 40B. The IMD structure 200 is etched through the patterned hard mask layer 220 to form the capacitor trench T22 that exposes the etch stop layer 202. The etching process may include dry etching, wet etching, and/or other etching methods (e.g., reactive ion etching).

For example, the etching process may include a dry etch process using reaction gas(es) that selectively etch the IMD structure 200 at a faster rate than the etch stop layer 202, the dielectric layer 207, and the electrodes 208', and the sacrificial layers 204, 205, and 206. That is, the capacitor trench T22 can expose a second sidewall of the sacrificial multi-layer stack opposite to or different from the first sidewall shown in FIG. 34B. That is, the sacrificial layers 204, 205, and 206 can be exposed from the capacitor trench T22. In some embodiments, the capacitor trench T22 may have a rectangular profile extending along Y-direction from the top view as shown in FIG. 40A. In some embodiments, the capacitor trench T22 can be interchangeably referred to a capacitor opening. In some embodiments, after the forming of the capacitor trench T22, the patterned hard mask layer 220 can be removed by a suitable technique, such as a wet clean process, an ashing process, or the like.

Figures 41A, 41B:
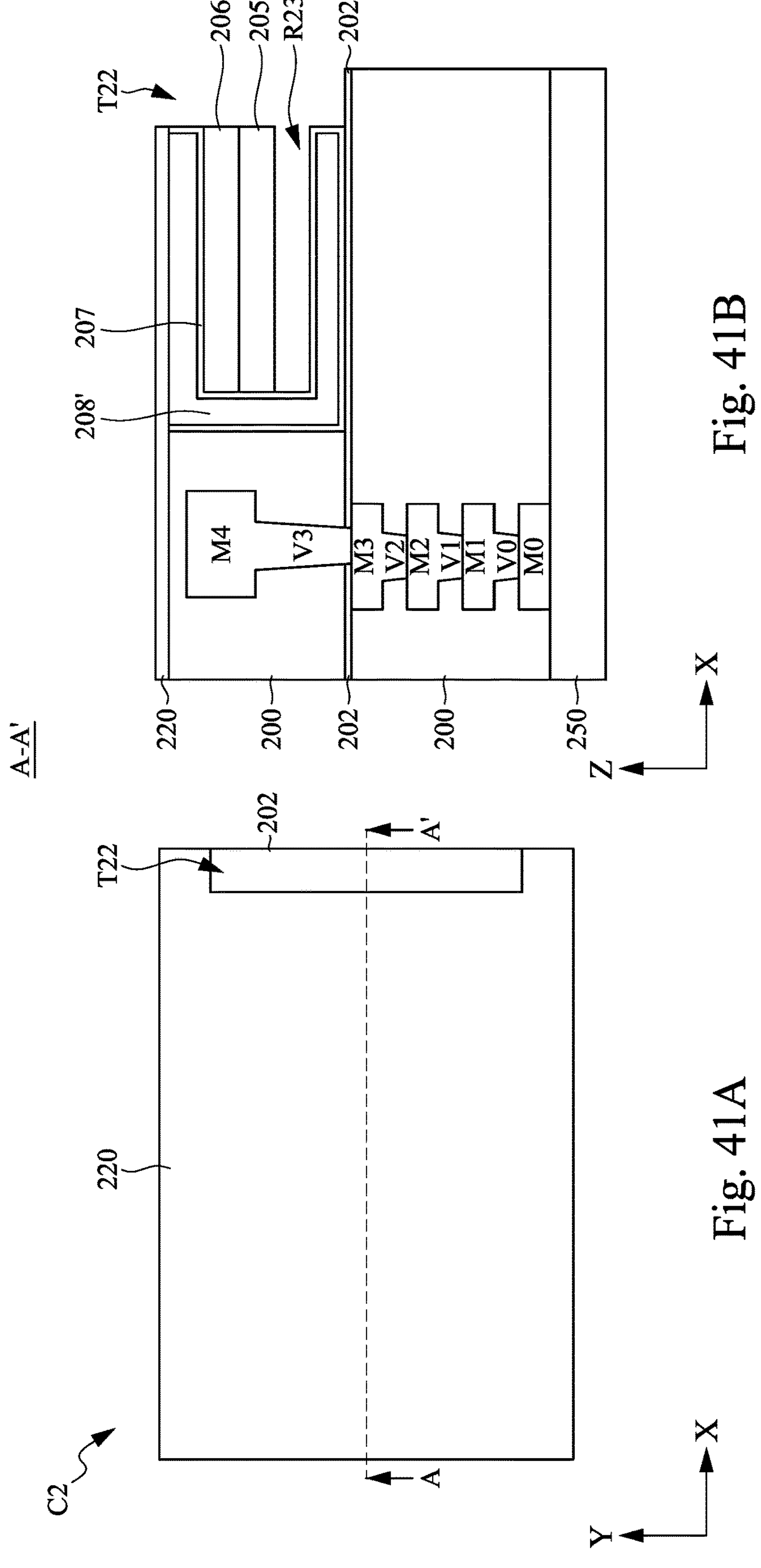

Reference is made to FIGS. 41A and 41B. The sacrificial layer 204 (see FIG. 40B) is moved in one or more etching process through the capacitor trench T22, so that a capacitor recess R23 (see FIG. 41B) is formed. The capacitor recess R23 can expose a bottom surface of the sacrificial layer 205. In some embodiments, the sacrificial layer 204 can be removed by suitable etching techniques, such as dry etching, wet etching, and/or other etching methods (e.g., reactive ion etching). In some embodiments, the sacrificial layer 204 can be removed by an anisotropic dry etch process. For example, the etching process may include a dry etch process using reaction gas(es) that selectively etch the sacrificial layer 204 at a faster rate than the etch stop layer 202, the dielectric layer 207, the electrode 208', and the sacrificial layers 205 and 206. In some embodiments, the capacitor recess R23 (see FIG. 41B) can be interchangeably referred to a capacitor electrode space that inherits the shape of the sacrificial layer 204.

Figures 42A, 42B:
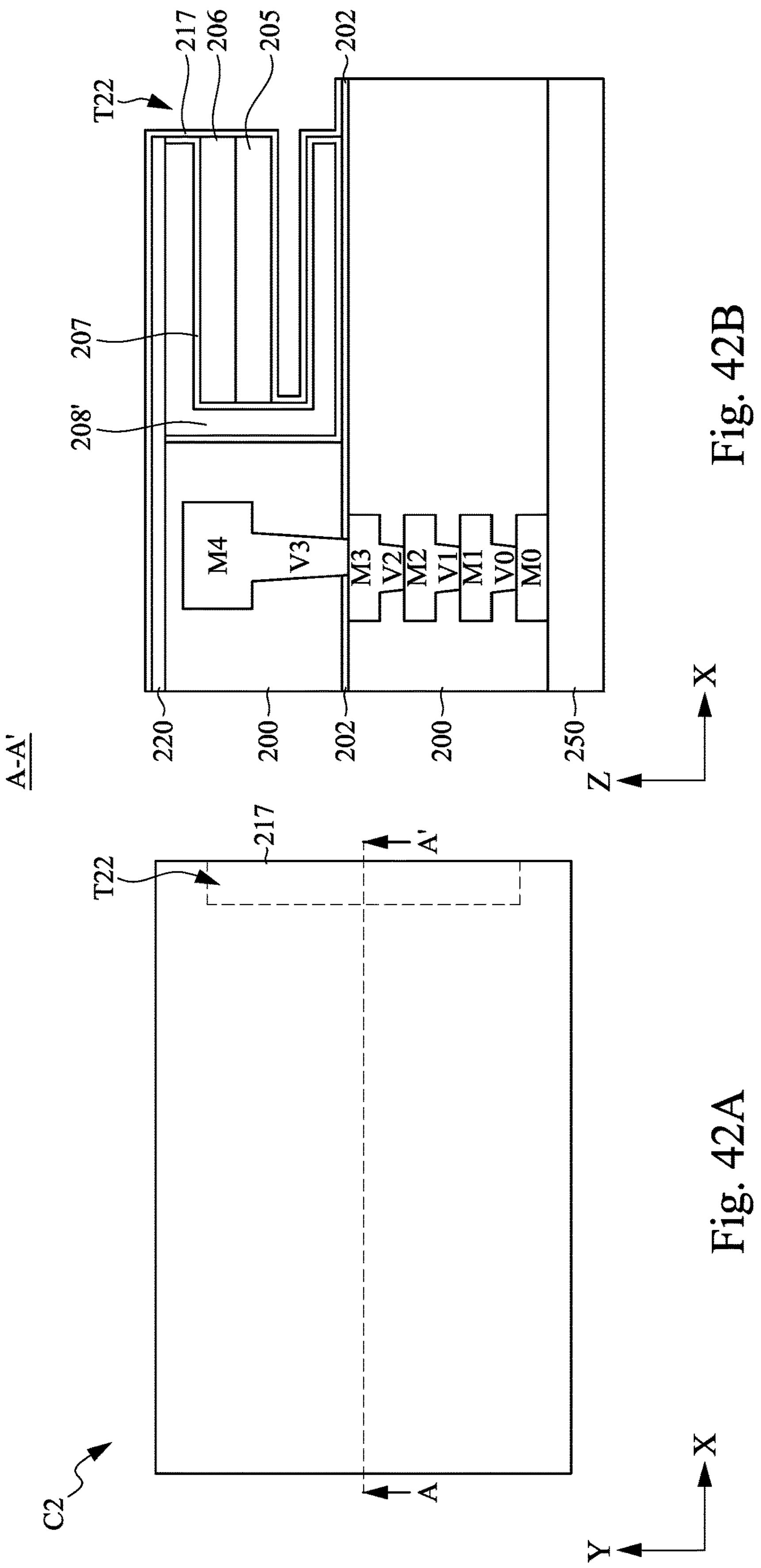

Reference is made to FIGS. 42A and 42B. A dielectric layer 217 is blanket formed over the hard mask layer 220 and in the capacitor trench T22 and the capacitor recess R23. In some embodiments, the dielectric layer 217 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 217 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 217 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 217 may be a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 217 may be made of the same material as the dielectric layer 207, thereby resulting in a substantially indistinguishable interface between the dielectric layers 207 and 217. In some embodiments, the dielectric layer 217 may be made of a different material than the dielectric layer 207. In some embodiments, the dielectric layer 217 may be deposited using any suitable method, such as CVD, physical vapor deposition (PVD), ALD, PEALD, PECVD, SACVD, FCVD, spin-on, and/or the like, or a combination thereof.

Figures 43A, 43B:
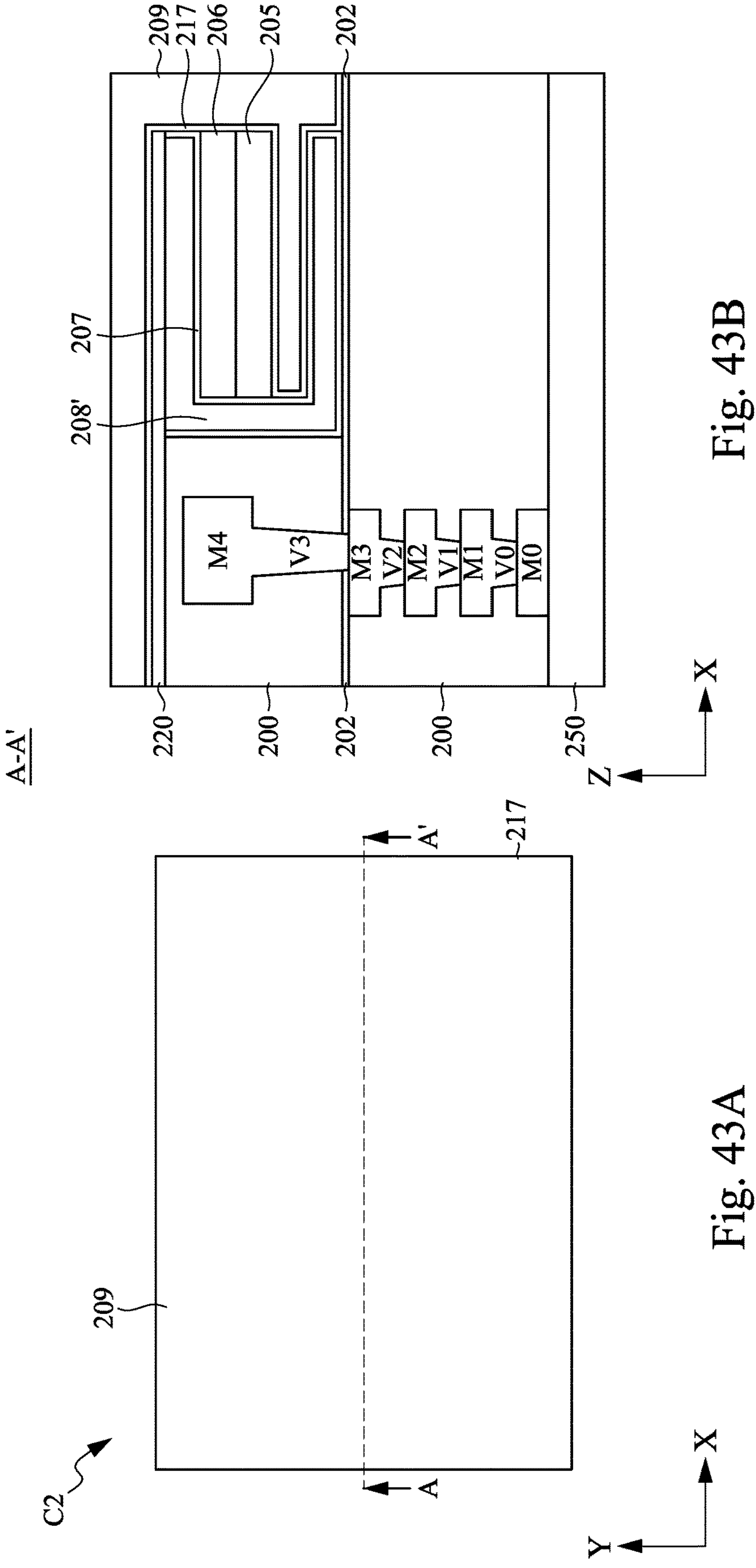

Reference is made to FIGS. 43A and 43B. A conductive material 209 is deposited over the dielectric layer 217. An interface between the dielectric layer 217 and the conductive material 209 can be smooth or rough. In some embodiments, the conductive material 209 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 209 may be made of the same material as the electrode 208'. In some embodiments, the conductive material 209 may be made of a different material than the electrode 208'. In some embodiments, the conductive material 209 may be made of a same material as the metallization layers, such as Cu. In some embodiments, the conductive material 209 may be deposited using any suitable method, such as CVD, physical vapor deposition (PVD), ALD, PEALD, PECVD, SACVD, FCVD, spin-on, and/or the like, or a combination thereof.

Figures 44A, 44B:
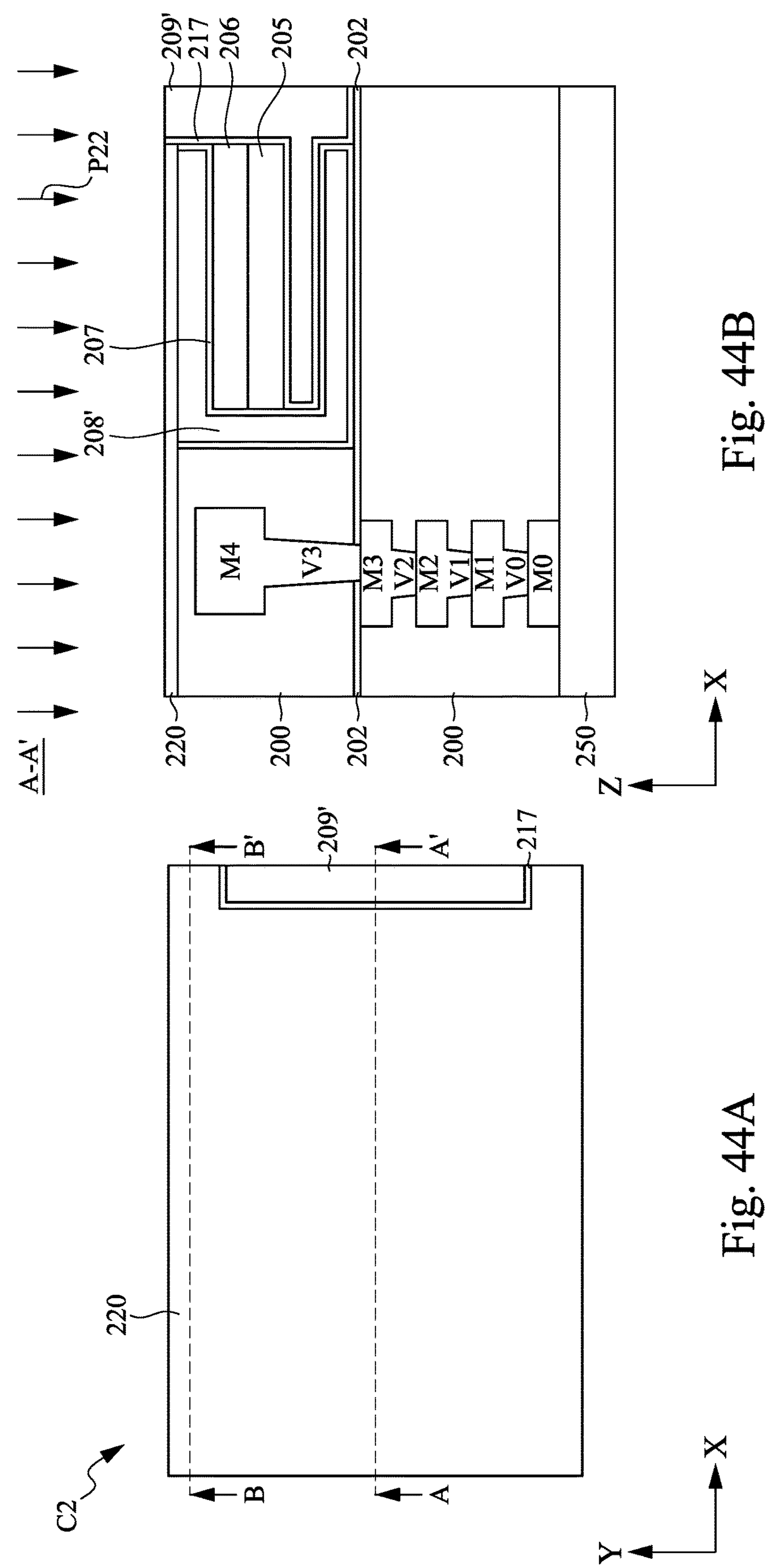
Figure 44C:
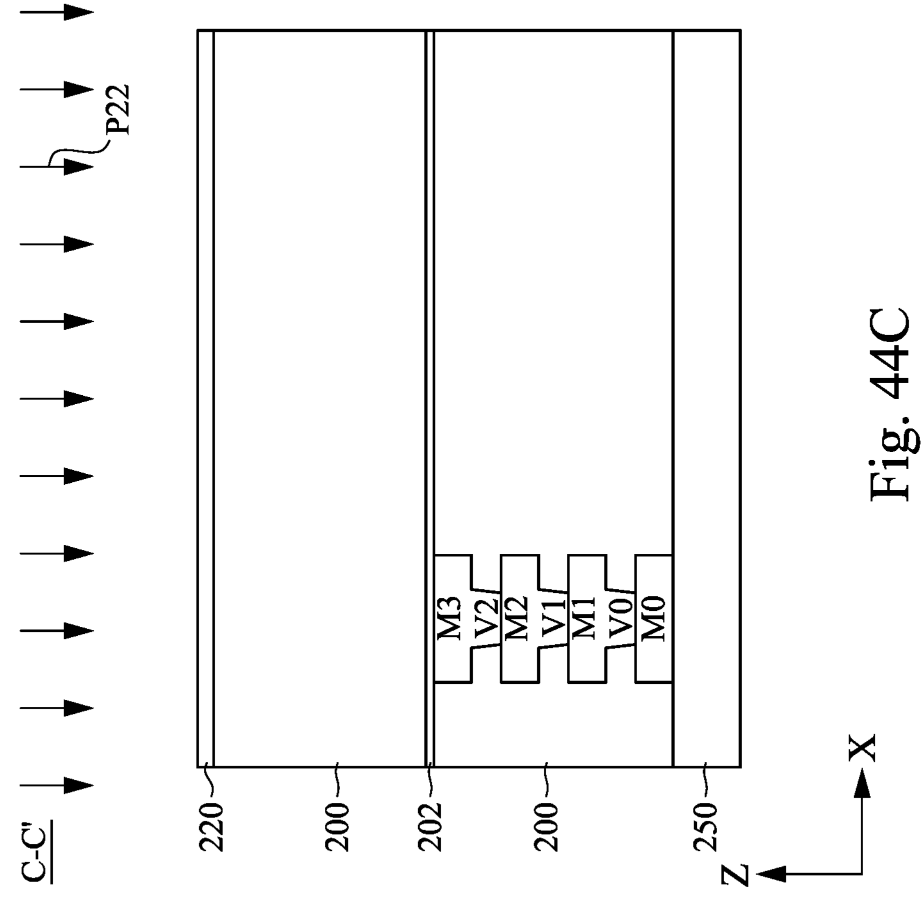

Reference is made to FIGS. 44A, 44B, and 44C. A planarization process P22 (e.g., CMP) is performed to remove the excessive dielectric layer 217 and the conductive material 209 (see FIG. 43B) above the hard mask layer 220 to form an electrode 209' of the vertically stacked multi-layer MIM capacitor C2 (see FIGS. 54A-54C) in the capacitor trench T22 (see FIG. 43B) and the capacitor recess R23 (see FIG. 43B). The hard mask layer 220 may also act as an etch stop layer for etching the dielectric layer 217 and the conductive material 209.

Figures 45A, 45B:
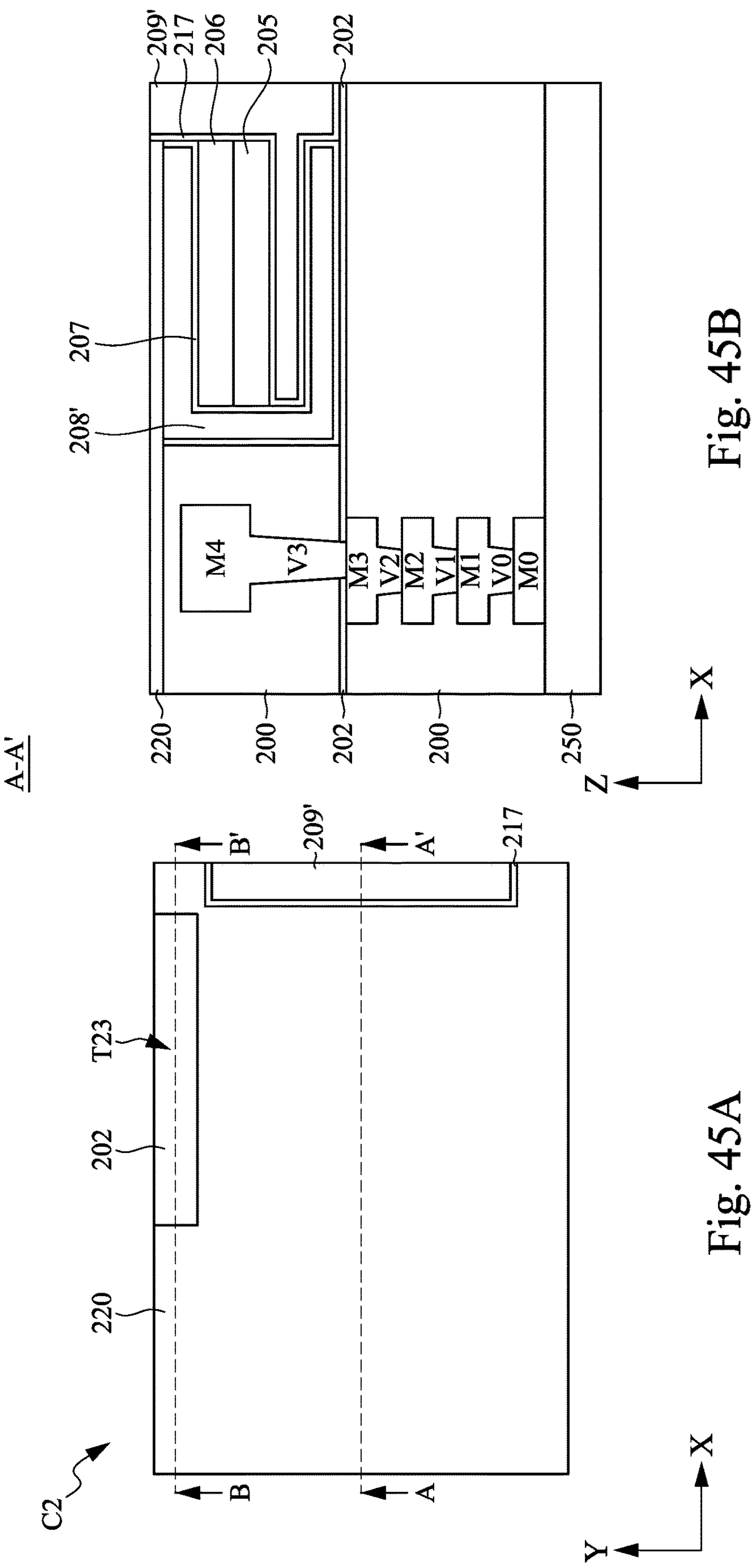
Figure 45C:
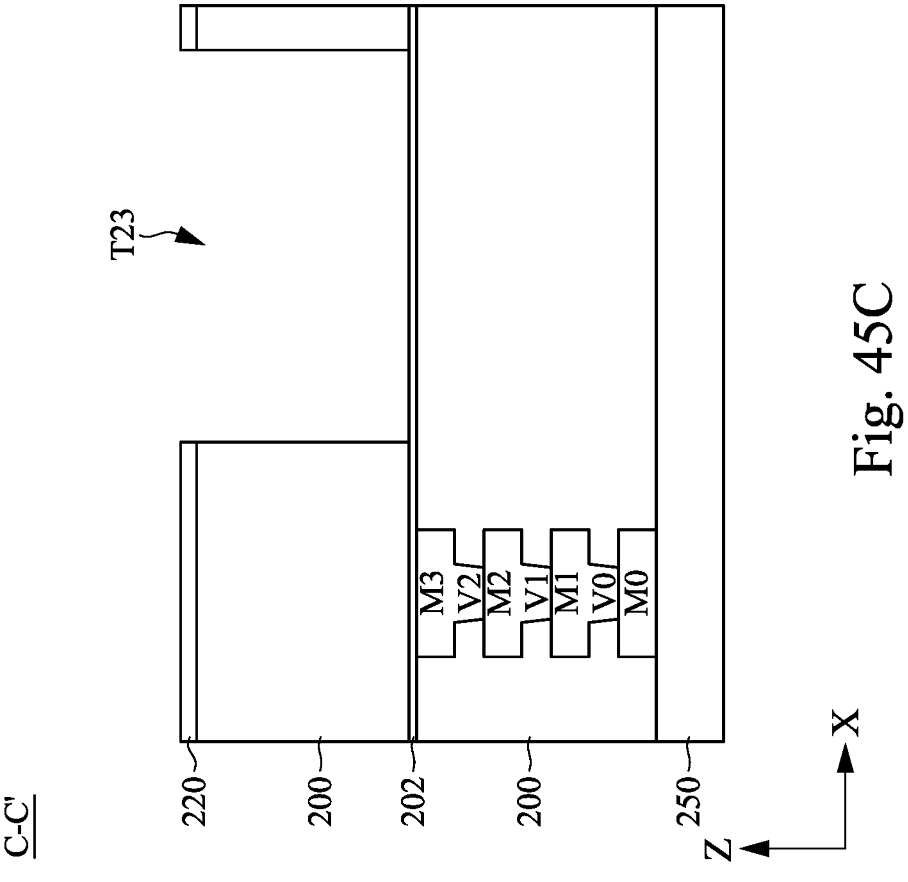

Reference is made to FIGS. 45A, 45B, and 45C. The hard mask layer 220 may be patterned and then be used to etch the IMD structure 200. The hard mask layer 220 may be patterned by a lithography process including include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

After the formation of the patterned hard mask layer 220, the IMD structure 200 can be etched through the patterned hard mask layer 220 to form the capacitor trench T23 (see FIG. 45C) that exposes the etch stop layer 202. The etching process may include dry etching, wet etching, and/or other etching methods (e.g., reactive ion etching). For example, the etching process may include a dry etch process using reaction gas(es) that selectively etch the IMD structure 200 at a faster rate than the etch stop layer 202, the dielectric layers 207 and 217, and the electrodes 208' and 209' (see FIG. 44B), and the sacrificial layers 205 and 206. The capacitor trench T23 (see FIG. 45C) can expose a third sidewall of the sacrificial multi-layer stack different from the first and second sidewalls shown in FIGS. 34B and 40B. That is, the sacrificial layers 205 and 206 can be exposed from the capacitor trench T23 (see FIG. 45C). In some embodiments, the capacitor trench T23 may have a rectangular profile extending along X-direction from the top view as shown in FIG. 45A. In some embodiments, the capacitor trench T23 (see FIG. 45C) can be interchangeably referred to a capacitor opening. In some embodiments, after the forming of the capacitor trench T23, the patterned hard mask layer 220 can be removed by a suitable technique, such as a wet clean process, an ashing process, or the like.

Figures 46A, 46B:
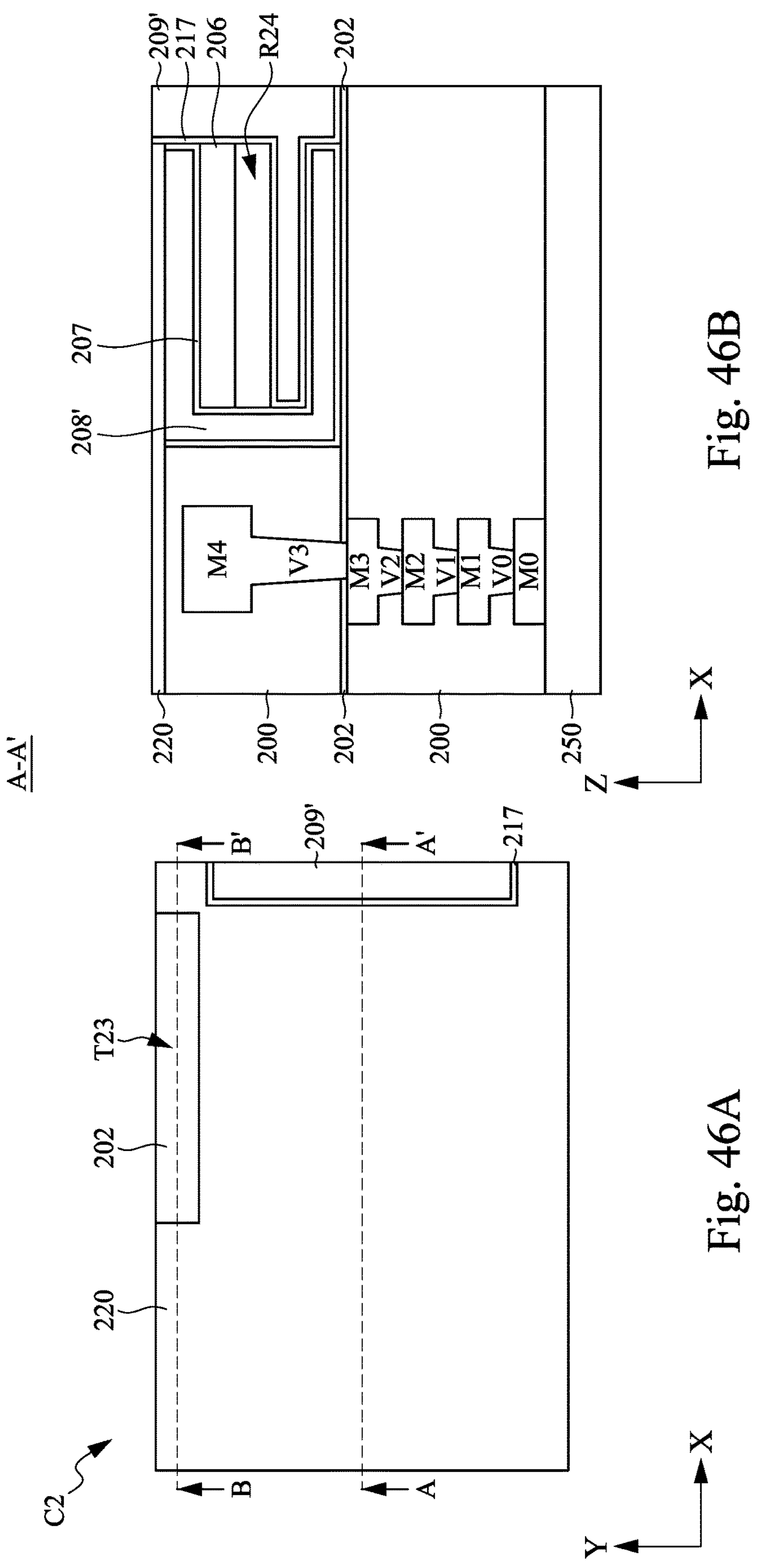
Figure 46C:
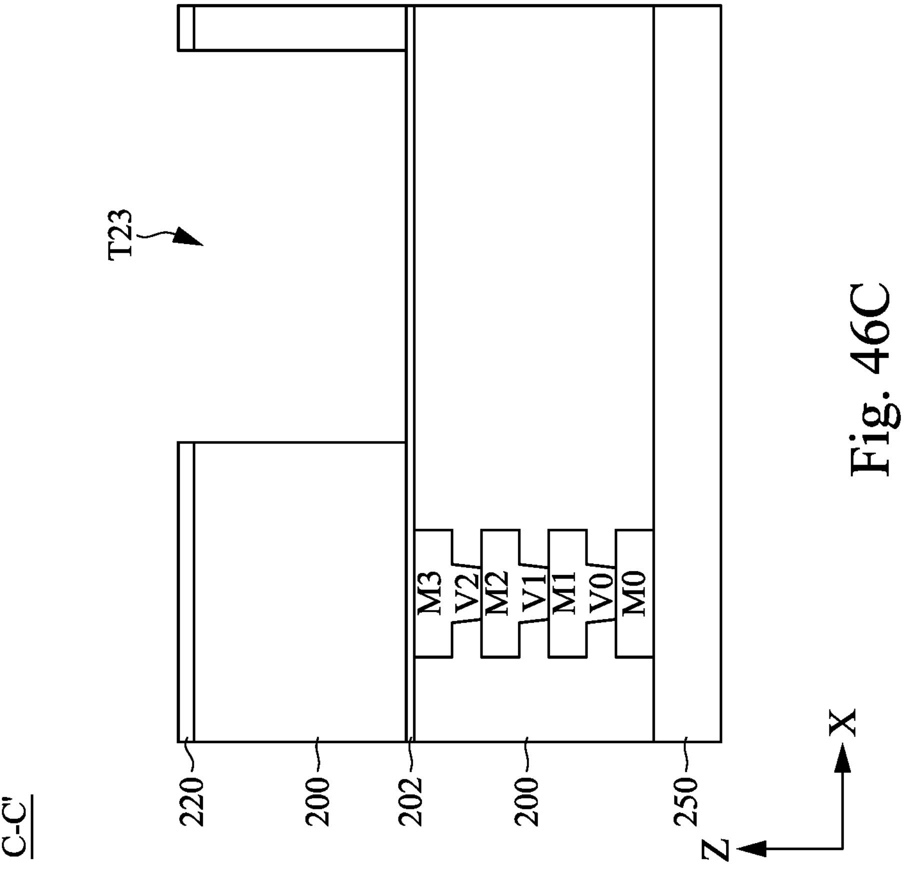

Reference is made to FIGS. 46A, 46B, and 46C. The sacrificial layer 205 (see FIG. 45B) is moved in one or more etching process through the capacitor trench T23 (see FIG. 46C), so that a capacitor recess R24 (see FIG. 46B) is formed. The capacitor recesses R24 (see FIG. 46B) can expose a bottom surface of the sacrificial layer 206. In some embodiments, the sacrificial layer 205 can be removed by suitable etching techniques, such as dry etching, wet etching, and/or other etching methods (e.g., reactive ion etching). In some embodiments, the sacrificial layer 205 can be removed by an anisotropic dry etch process. For example, the etching process may include a dry etch process using reaction gas(es) that selectively etch the sacrificial layer 205 at a faster rate than the IMD structure 200, the etch stop layer 202, the dielectric layers 207 and 217, the electrodes 208' and 209' (see FIGS. 46A and 46B), and the sacrificial layer 206. In some embodiments, the capacitor recesses R24 (see FIG. 46B) can be interchangeably referred to a capacitor electrode space that inherits the shape of the sacrificial layer 205.

Figures 47A, 47B:
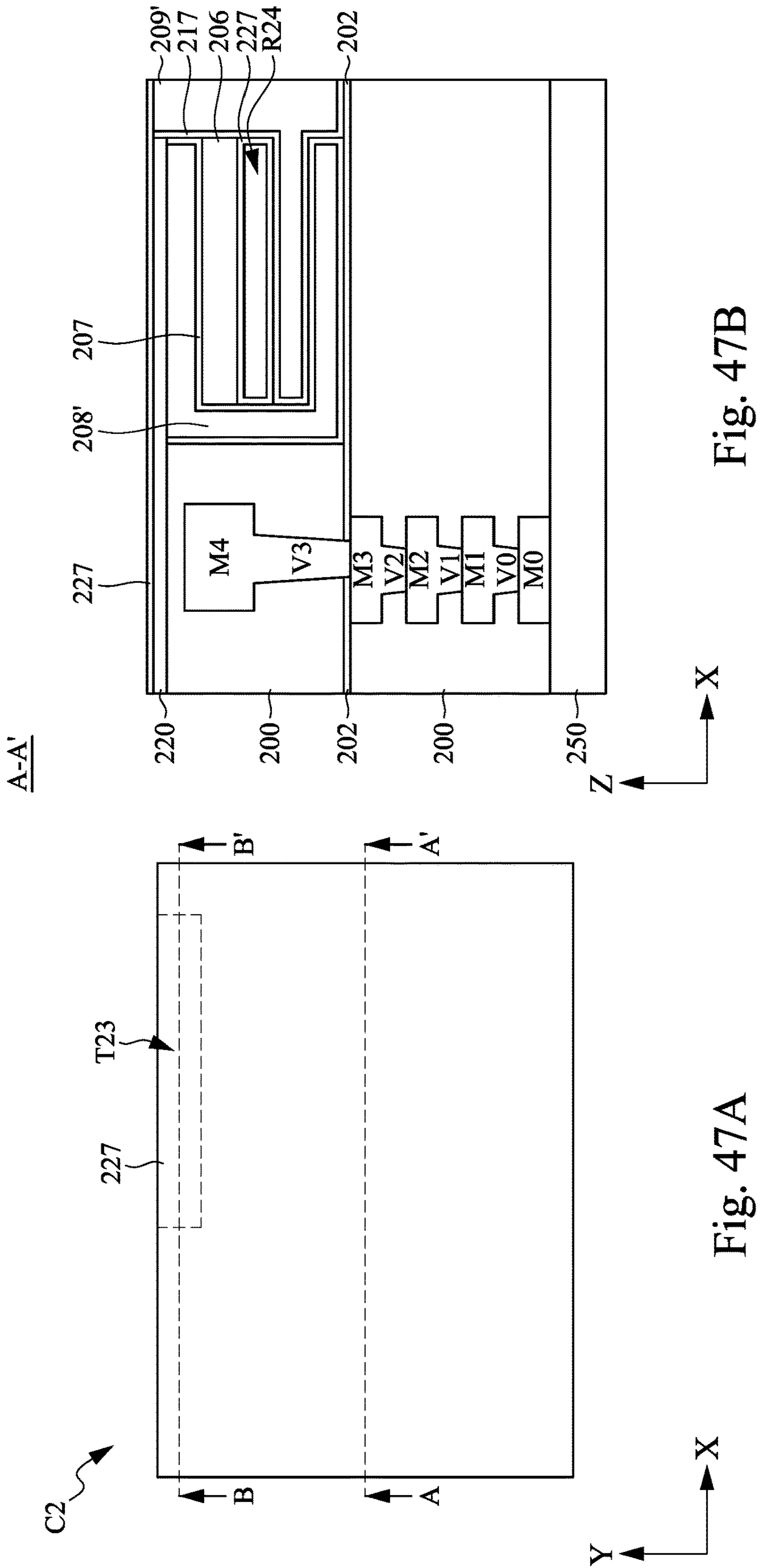
Figure 47C:
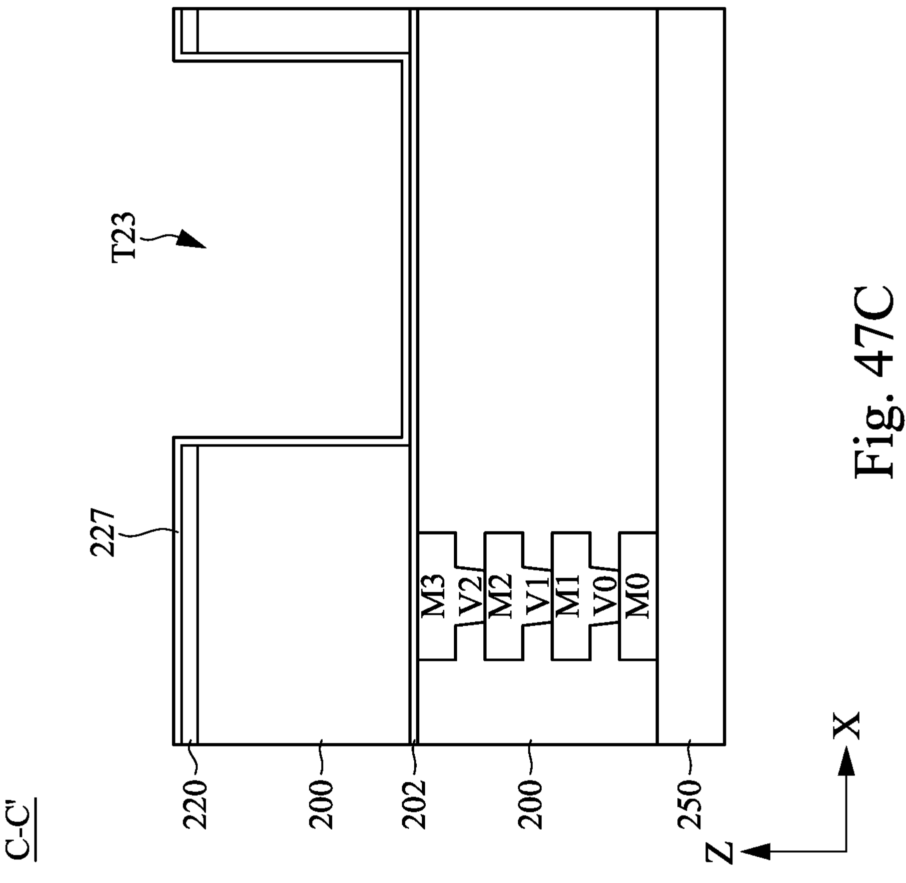

Reference is made to FIGS. 47A, 47B, and 47C. A dielectric layer 227 is blanket formed over the hard mask layer 220 and in the capacitor trench T23 (see FIG. 47C) and the capacitor recesses R24 (see FIG. 47B). In some embodiments, the dielectric layer 227 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 227 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 227 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 227 may be a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 227 may be made of a same material as the dielectric layer 207 and/or the dielectric layer 217, thereby resulting in a substantially indistinguishable interface between at least two of the dielectric layers 207, 217, and 227. In some embodiments, the dielectric layer 227 may be made of a different material than the dielectric layer 106 and/or the dielectric layer 116. In some embodiments, the dielectric layer 227 may be deposited using any suitable method, such as CVD, physical vapor deposition (PVD), ALD, PEALD, PECVD, SACVD, FCVD, spin-on, and/or the like, or a combination thereof.

Figures 48A, 48B:
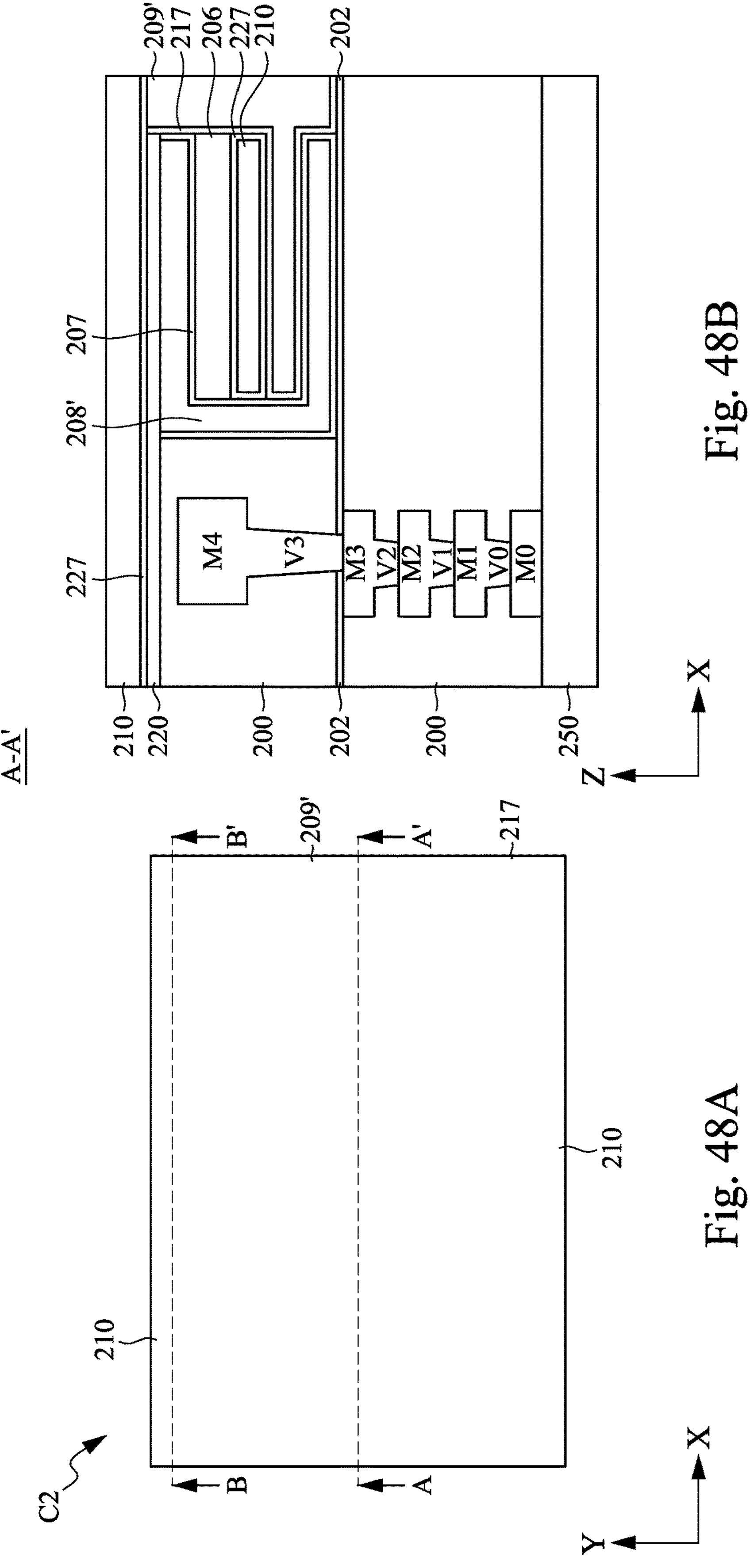
Figure 48C:
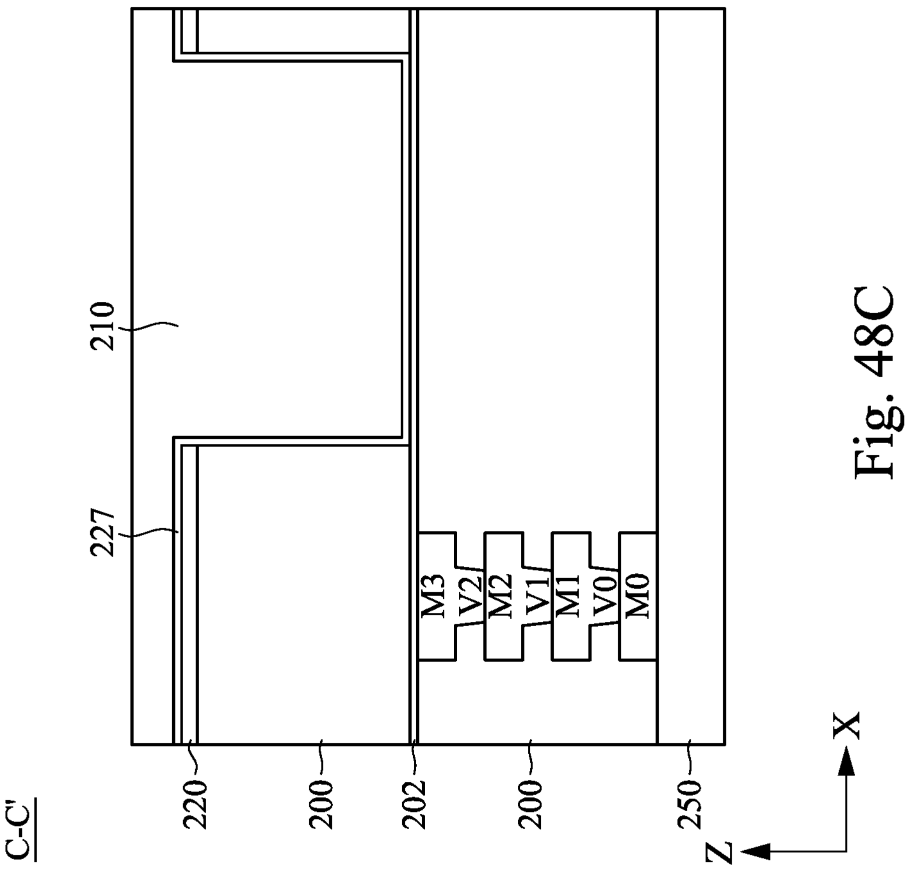
Figures 49A, 49B:
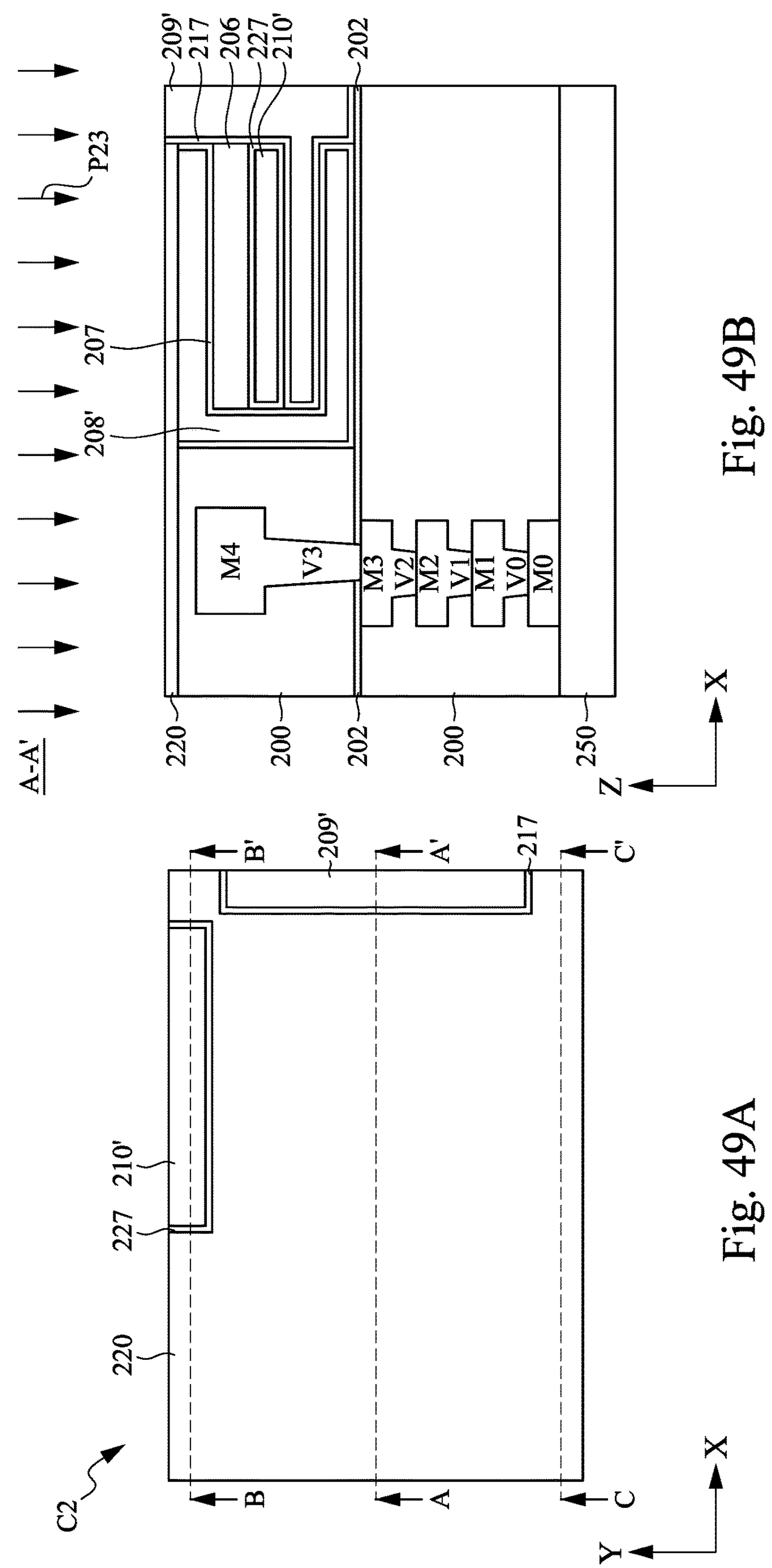
Figures 49C, 49D:
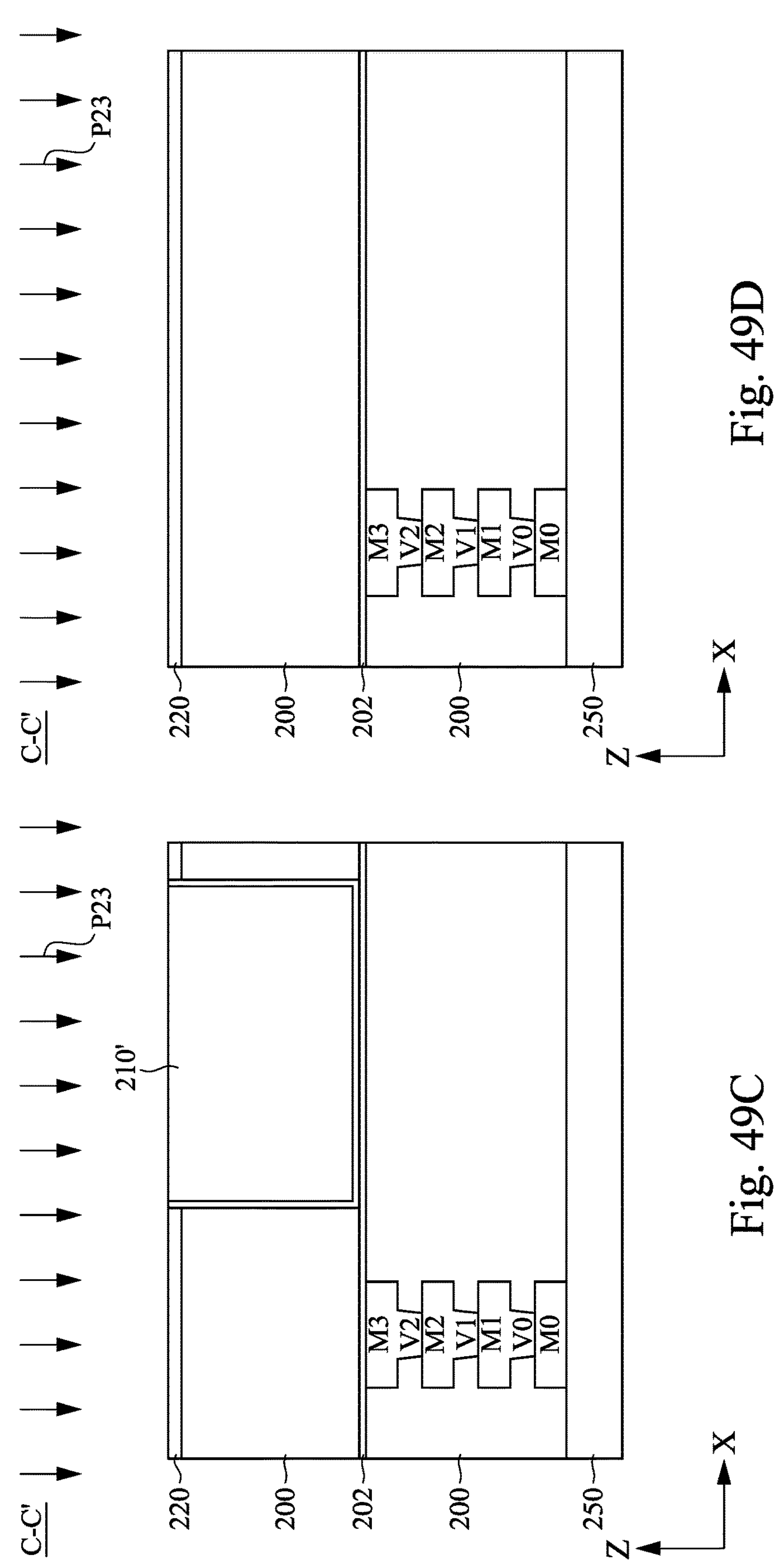

Reference is made to FIGS. 48A, 48B, and 48C. A conductive material 210 is deposited over the dielectric layer 227. An interface between the dielectric layer 227 and the conductive material 210 can be smooth or rough. In some embodiments, the conductive material 210 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 210 may be made of the same material as the electrodes 208' and/or the electrodes 209'. In some embodiments, the conductive material 210 may be made of a different material than the electrode 208' and/or the electrode 209'. In some embodiments, the conductive material 210 may be made of a same material as the metallization layers, such as Cu. In some embodiments, the conductive material 210 may be deposited using any suitable method, such as CVD, physical vapor deposition (PVD), ALD, PEALD, PECVD, SACVD, FCVD, spin-on, and/or the like, or a combination thereof.

Reference is made to FIGS. 49A, 49B, 49C, and 49D. A planarization process P23 (e.g., CMP) is performed to remove the excessive dielectric layer 227 and the conductive material 209 (see FIGS. 48B and 48C) above the hard mask layer 220 to form an electrode 210' of the vertically stacked multi-layer MIM capacitor C2 (see FIGS. 54A-54C) in the capacitor trench T23 (see FIG. 47C) and the capacitor recesses R24 (see FIG. 47B). The hard mask layer 220 may also act as an etch stop layer for etching the dielectric layer 227 and the conductive material 210.

Figures 50A, 50B:
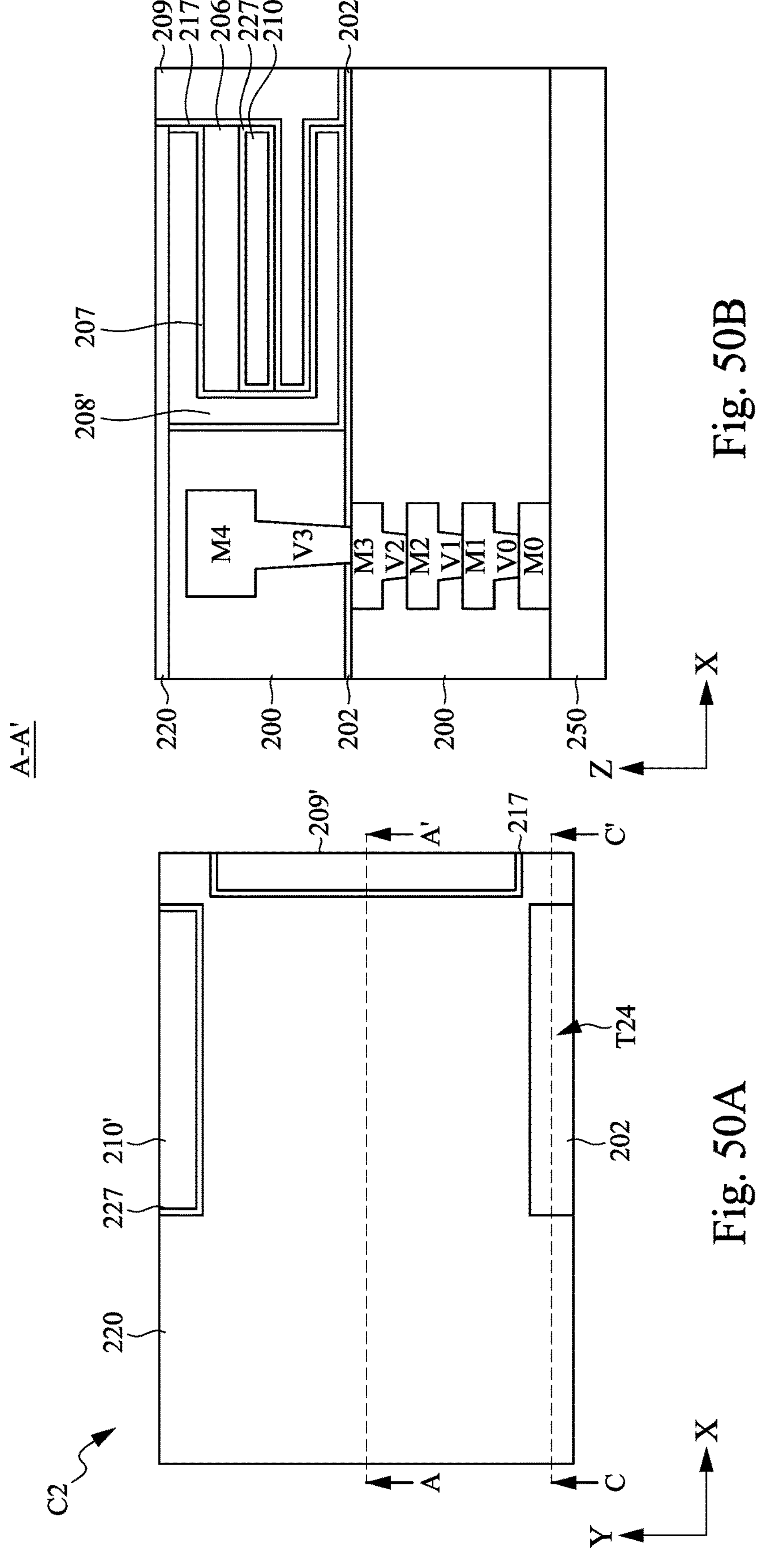
Figure 50C:
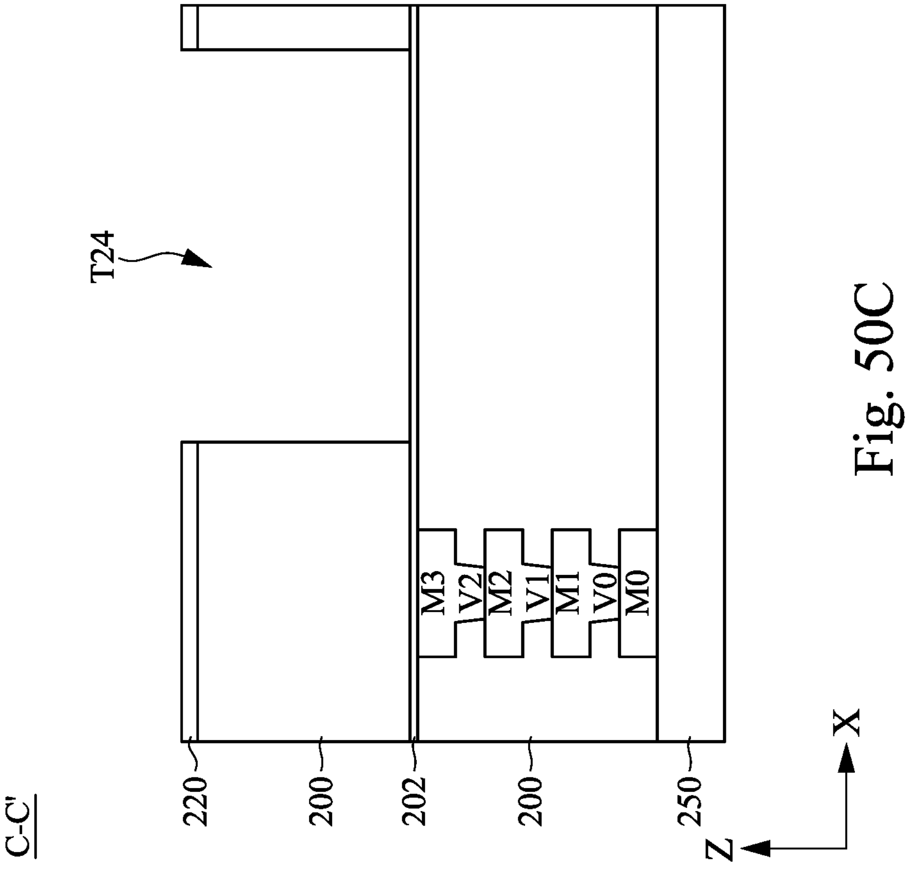

Reference is made to FIGS. 50A, 50B, and 50C. The hard mask layer 220 may be further patterned and then be used to etch the IMD structure 200 to form the capacitor trench T24 (see FIG. 50C) that exposes the etch stop layer 202. The etching process may include dry etching, wet etching, and/or other etching methods (e.g., reactive ion etching). For example, the etching process may include a dry etch process using reaction gas(es) that selectively etch the IMD structure 200 at a faster rate than the etch stop layer 202, the dielectric layers 207, 217, and 227, and the electrodes 208', 209', and 220' and the sacrificial layer 206. The capacitor trench T24 can expose a fourth sidewall of the sacrificial multi-layer stack different from the first, second, and third sidewalls shown in FIGS. 34B, 40B, and 45C. That is, the sacrificial layer 206 can be exposed from the capacitor trench T24 (see FIG. 50C), and the fourth sidewall of the sacrificial multi-layer stack is opposite to the second third sidewall of the sacrificial multi-layer stack. In some embodiments, the capacitor trench T24 may have a rectangular profile extending along Y-direction from the top view as shown in FIG. 50A. In some embodiments, the capacitor trench T24 can be interchangeably referred to a capacitor opening. In some embodiments, after the forming of the capacitor trench T24, the patterned hard mask layer 220 can be removed by a suitable technique, such as a wet clean process, an ashing process, or the like.

Figures 51A, 51B:
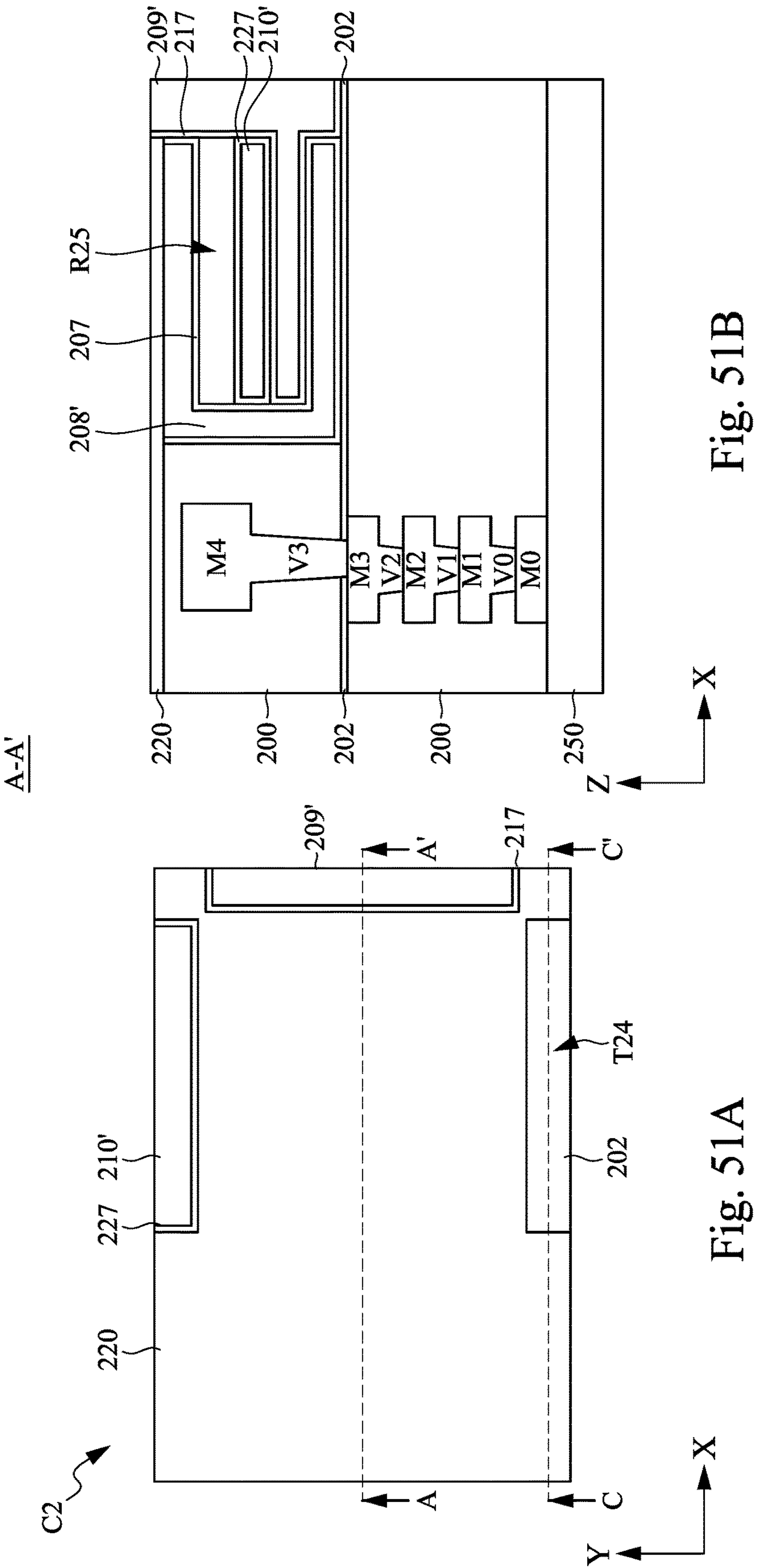
Figure 51C:
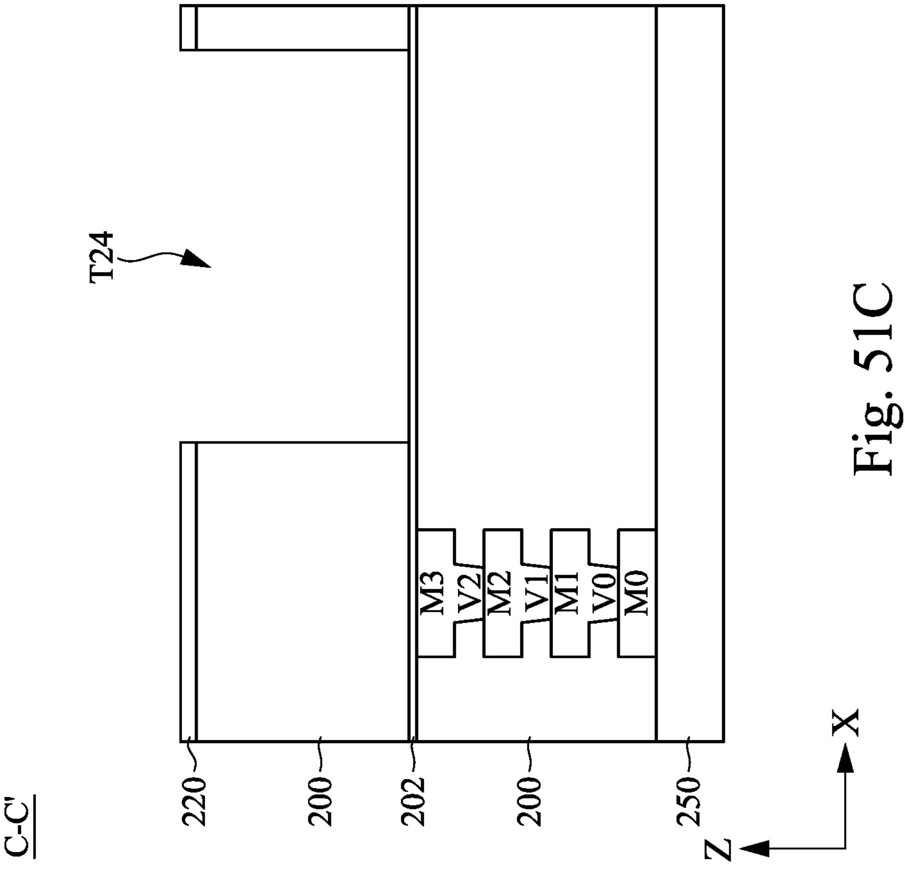

Reference is made to FIGS. 51A, 51B, and 51C. The sacrificial layer 206 (see FIG. 50B) is moved in one or more etching process through the capacitor trench T24 (see FIG. 51C), so that a capacitor recess R25 (see FIG. 51B) is formed. In some embodiments, the sacrificial layer 206 can be removed by suitable etching techniques, such as dry etching, wet etching, and/or other etching methods (e.g., reactive ion etching). In some embodiments, the sacrificial layer 206 can be removed by an anisotropic dry etch process. For example, the etching process may include a dry etch process using reaction gas(es) that selectively etch the sacrificial layer 206 at a faster rate than the IMD structure 200, the etch stop layer 202, the dielectric layers 207, 217, and 227, and the electrodes 208', 209', and 210'. In some embodiments, the capacitor recesses R25 can be interchangeably referred to a capacitor electrode space that inherits the shape of the sacrificial layer 206.

Figures 52A, 52B:
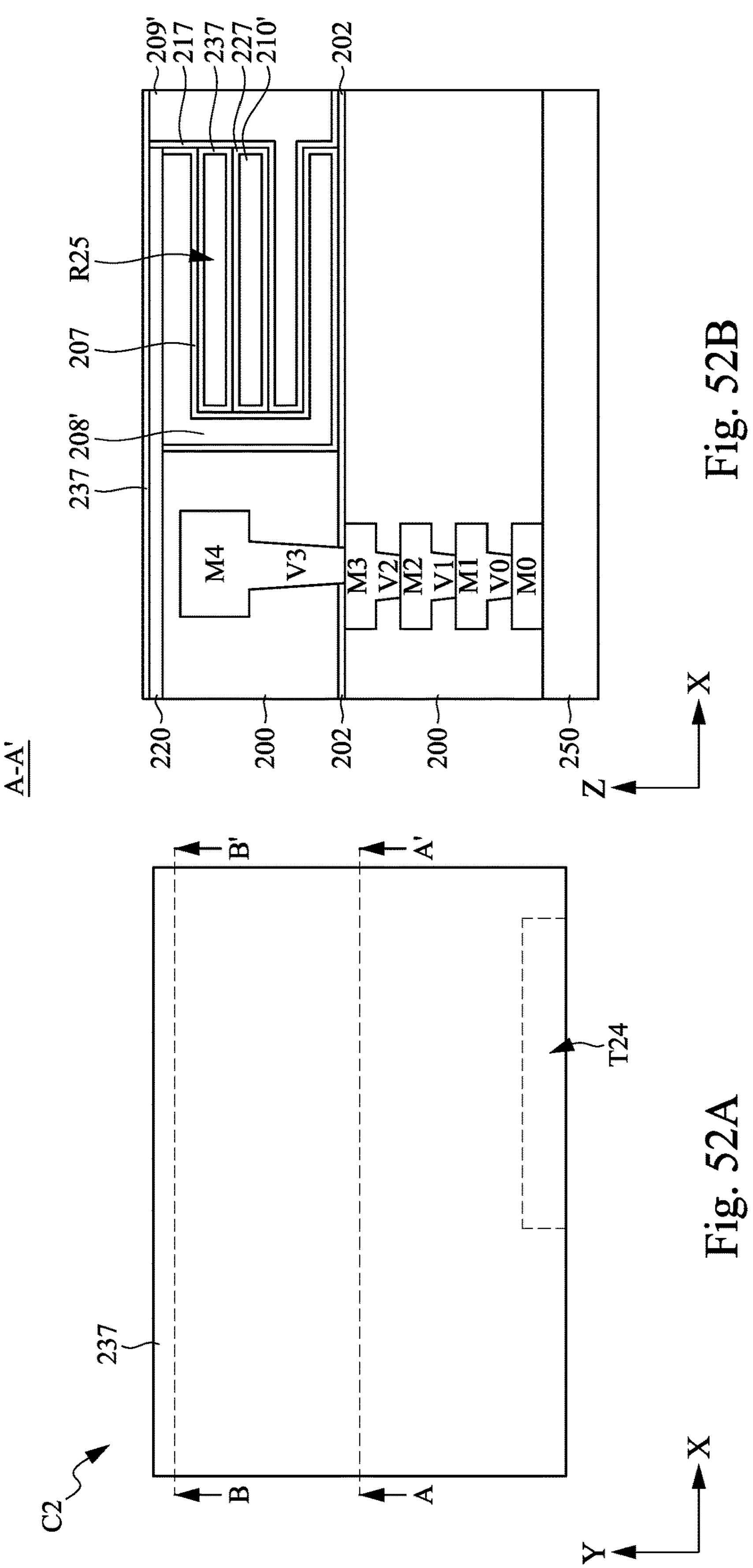
Figure 52C:
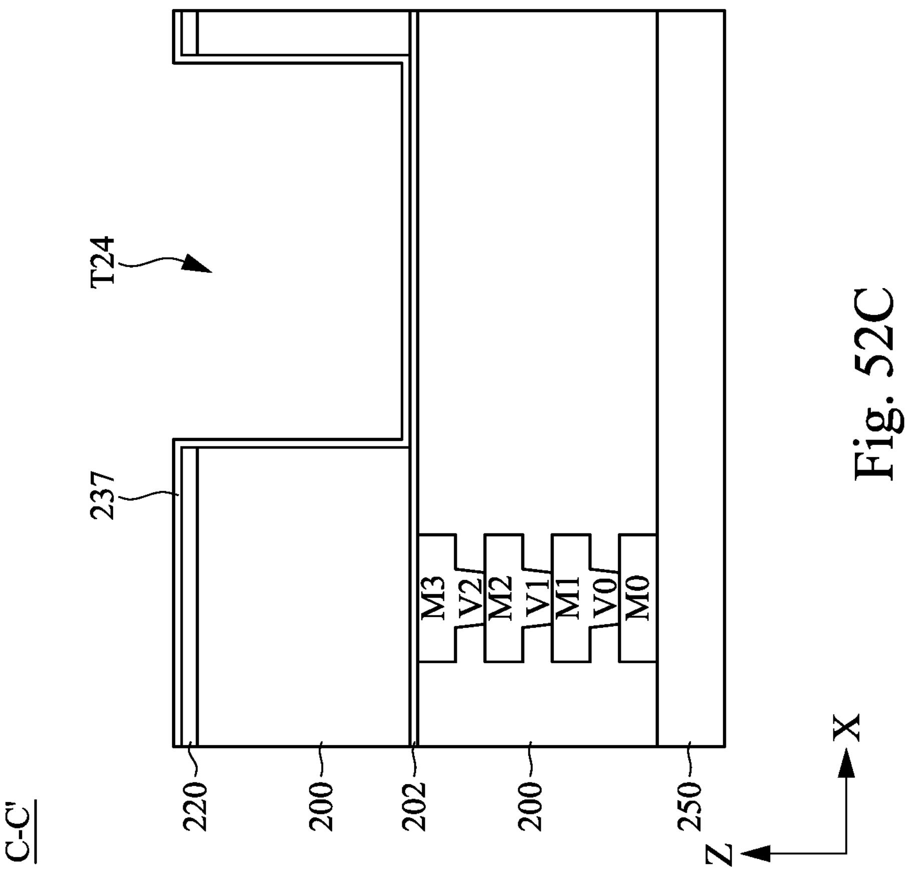

Reference is made to FIGS. 52A, 52B, and 52C. A dielectric layer 237 is blanket formed over the hard mask layer 220 and in the capacitor trench T24 (see FIG. 52C) and the capacitor recesses R25 (see FIG. 51B). In some embodiments, the dielectric layer 237 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 237 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 237 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the dielectric layer 237 may be a multilayer structure including, such as a silicon oxide layer (e.g., $SiO_2$layer), a first high-k material layer (e.g., $HfO_2$ layer), and a second high-k material layer (e.g., $ZrO_2$ layer). In some embodiments, the dielectric layer 237 may be made of a same material as the dielectric layer 207, the dielectric layer 217, and/or the dielectric layer 227, thereby resulting in a substantially indistinguishable interface between at least two of the dielectric layers 207, 217, 227, and 237. In some embodiments, the dielectric layer 237 may be made of a different material than the dielectric layer 207, the dielectric layer 217, and/or the dielectric layer 227. In some embodiments, the dielectric layer 237 may be deposited using any suitable method, such as CVD, physical vapor deposition (PVD), ALD, PEALD, PECVD, SACVD, FCVD, spin-on, and/or the like, or a combination thereof.

Figures 53A, 53B:
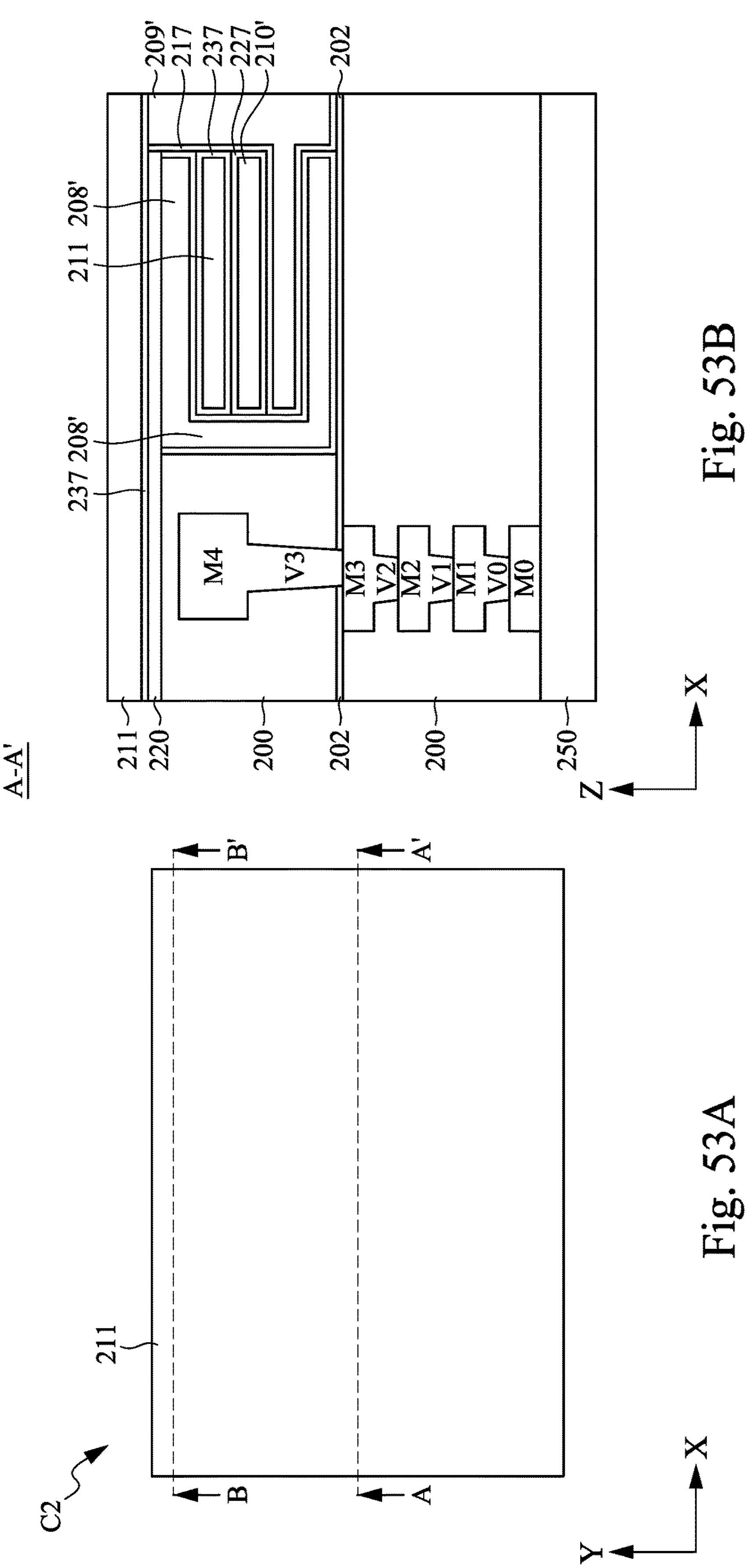
Figure 53C:
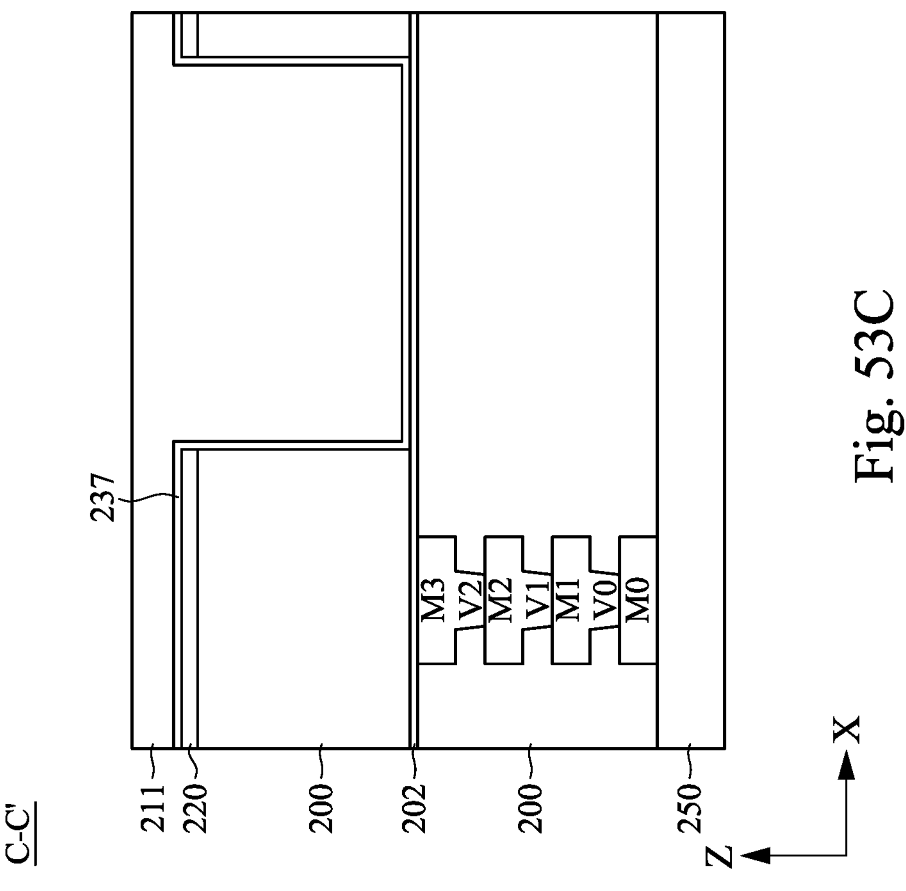

Reference is made to FIGS. 53A, 53B, and 53C. A conductive material 211 is deposited over the dielectric layer 237. An interface between the dielectric layer 237 and the conductive material 211 can be smooth or rough. In some embodiments, the conductive material 211 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof. In some embodiments, the conductive material 110 may be made of the same material as the electrodes 208', the electrodes 209', and/or the electrodes 210'. In some embodiments, the conductive material 211 may be made of a different material than the electrode 208', the electrode 209', and/or the electrode 210'. In some embodiments, the conductive material 211 may be made of a same material as the metallization layers, such as Cu. In some embodiments, the conductive material 211 may be deposited using any suitable method, such as CVD, physical vapor deposition (PVD), ALD, PEALD, PECVD, SACVD, FCVD, spin-on, and/or the like, or a combination thereof.

Figures 54A, 54B:
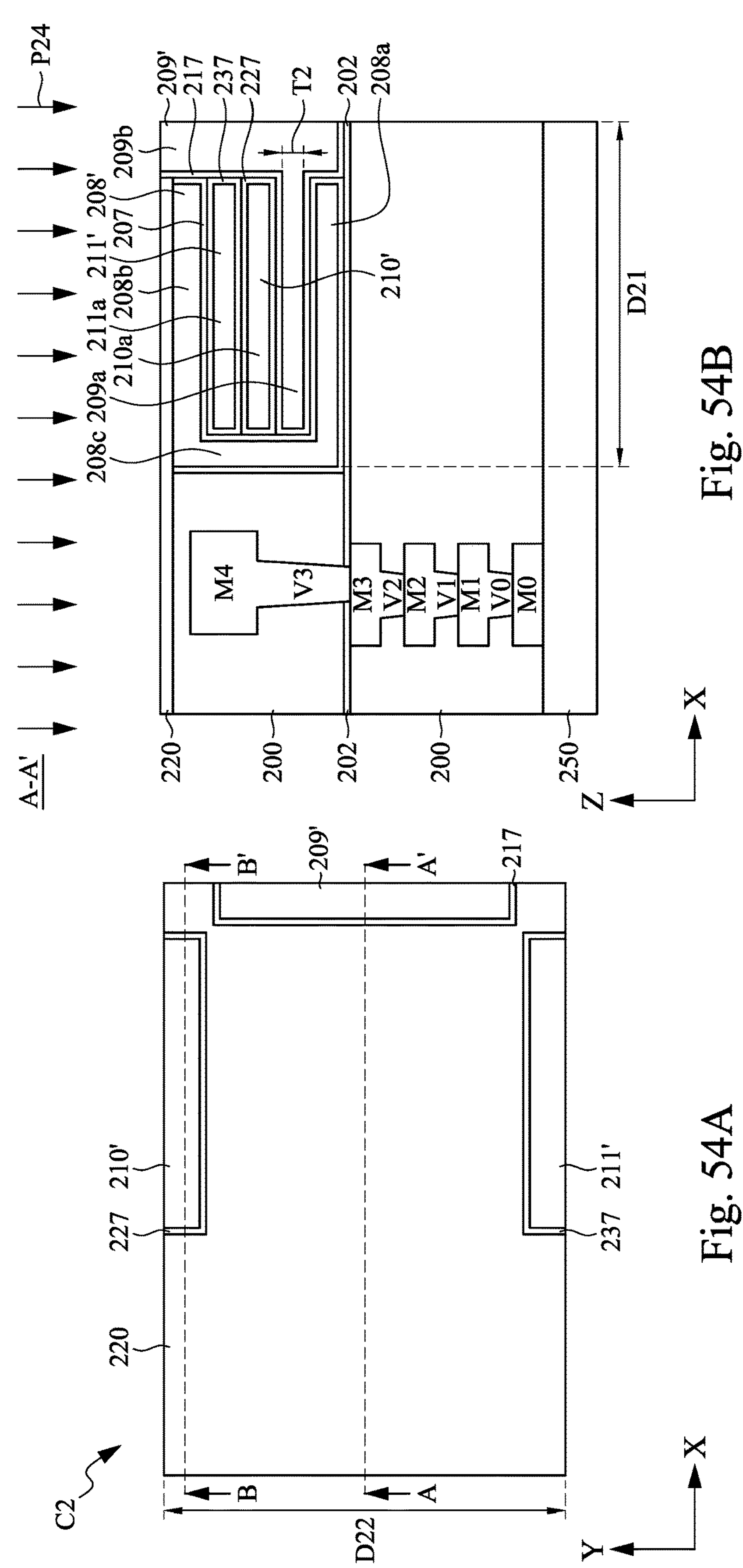
Figure 54C:
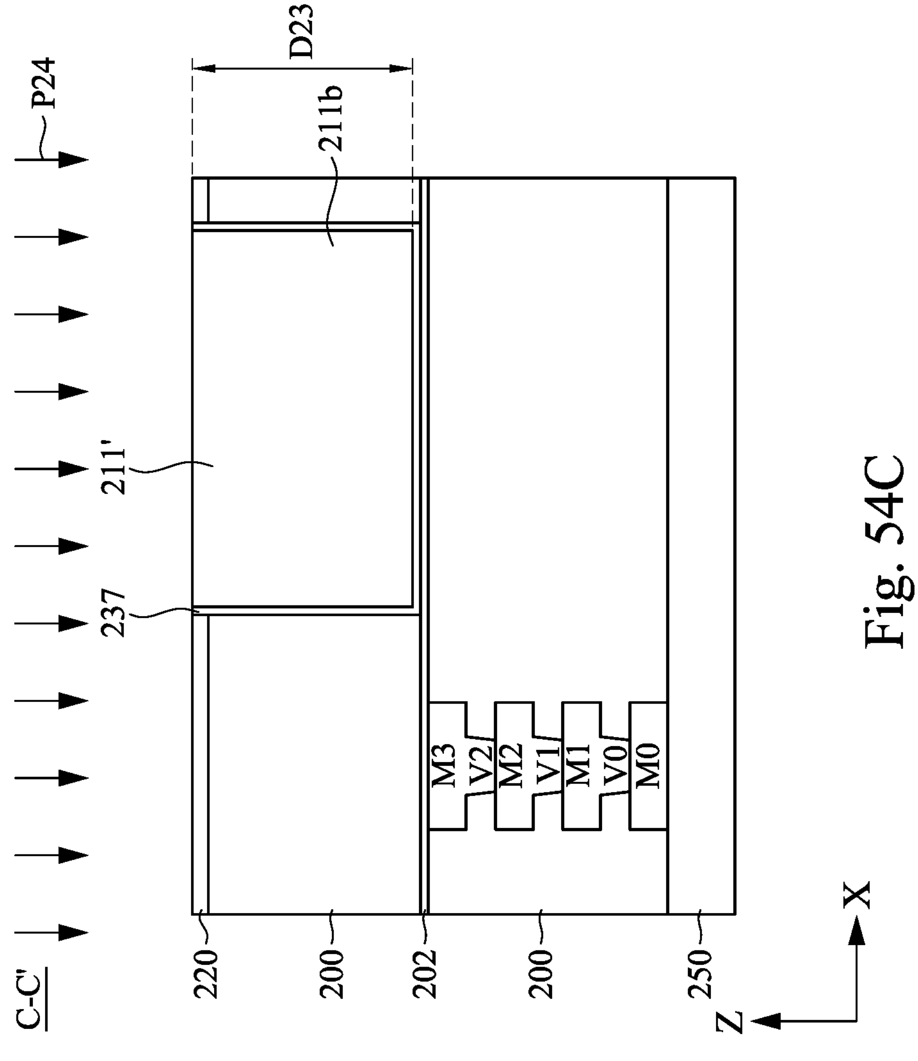
Figures 55A, 55B:
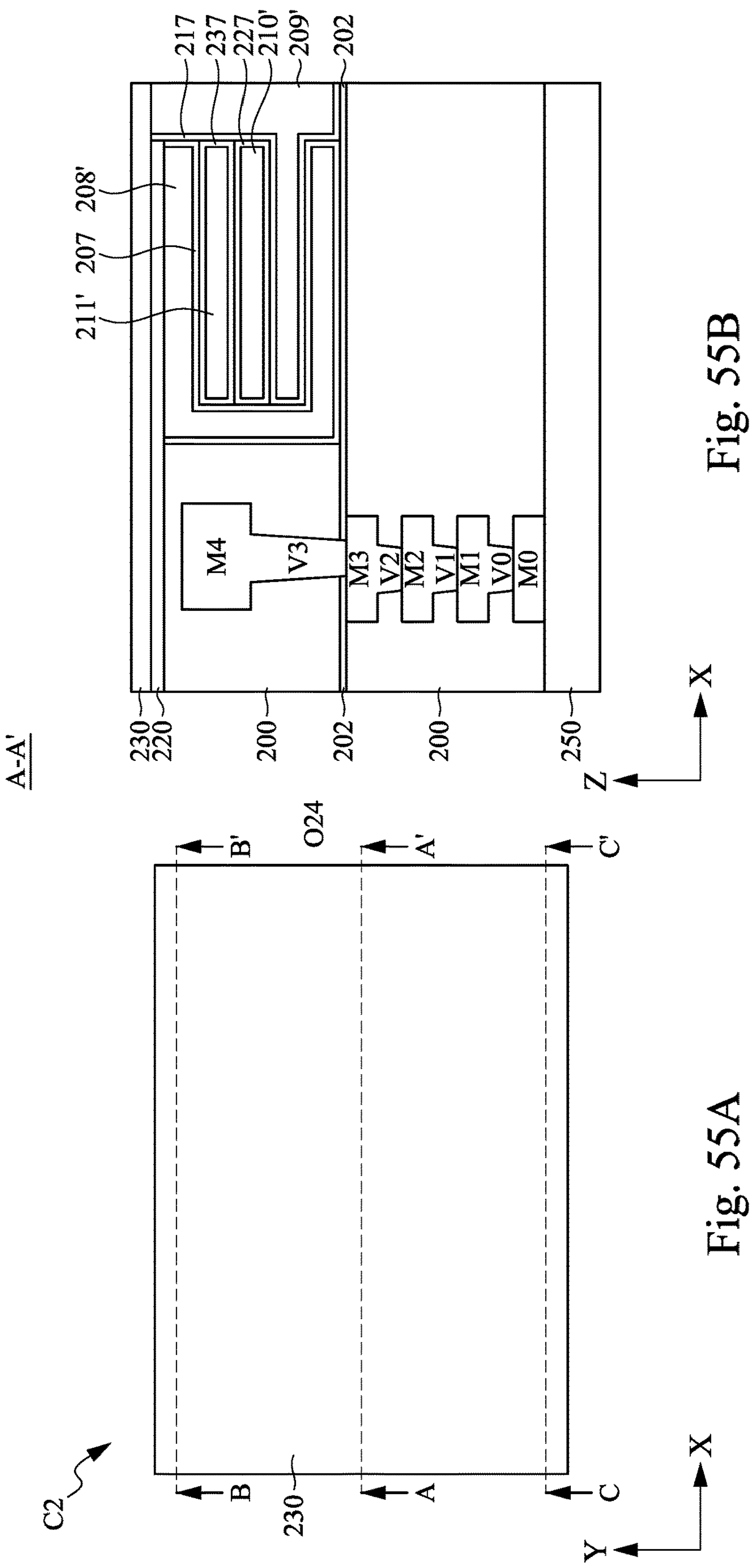
Figures 55C, 55D:
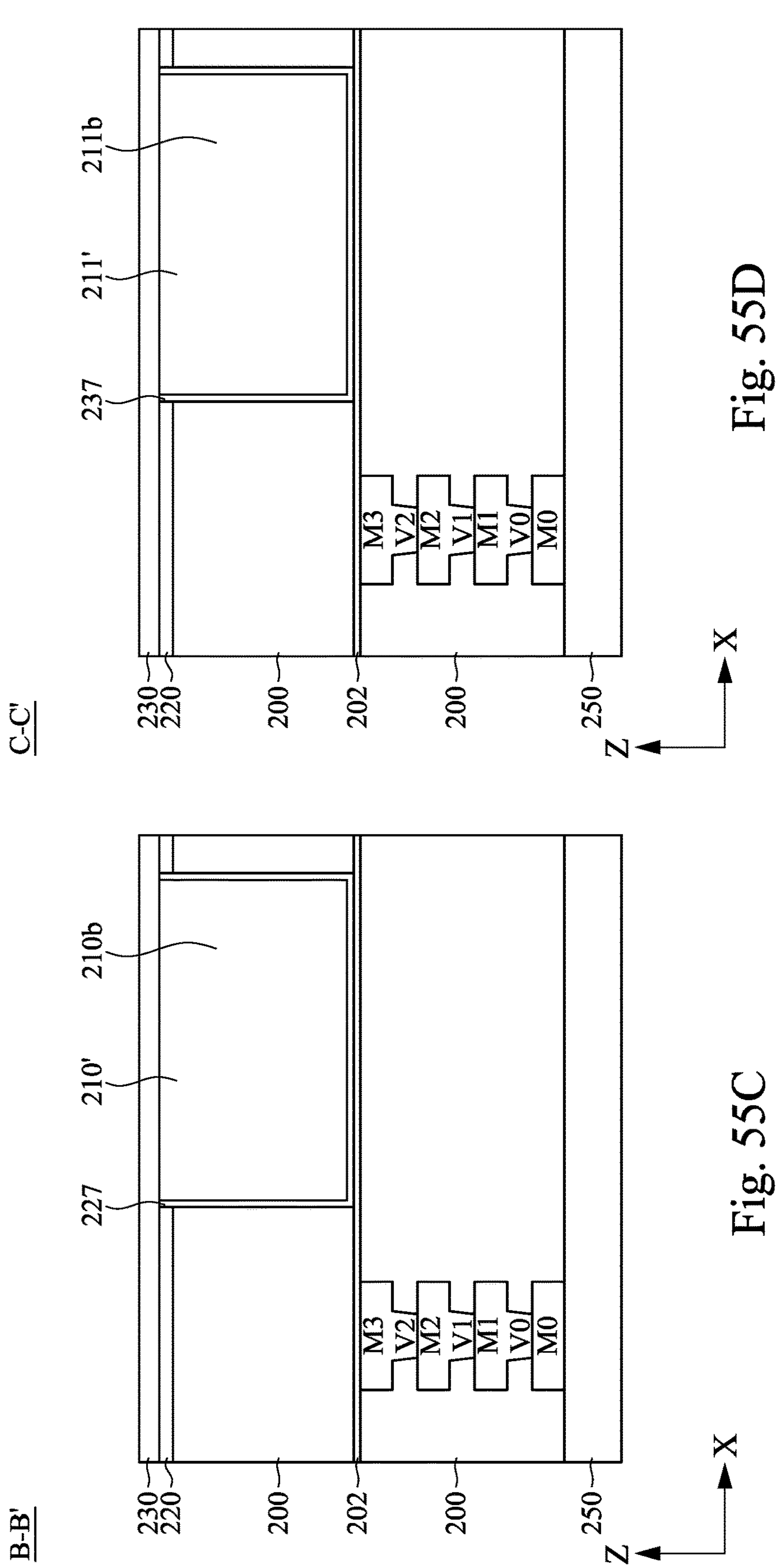
Figures 56A, 56B:
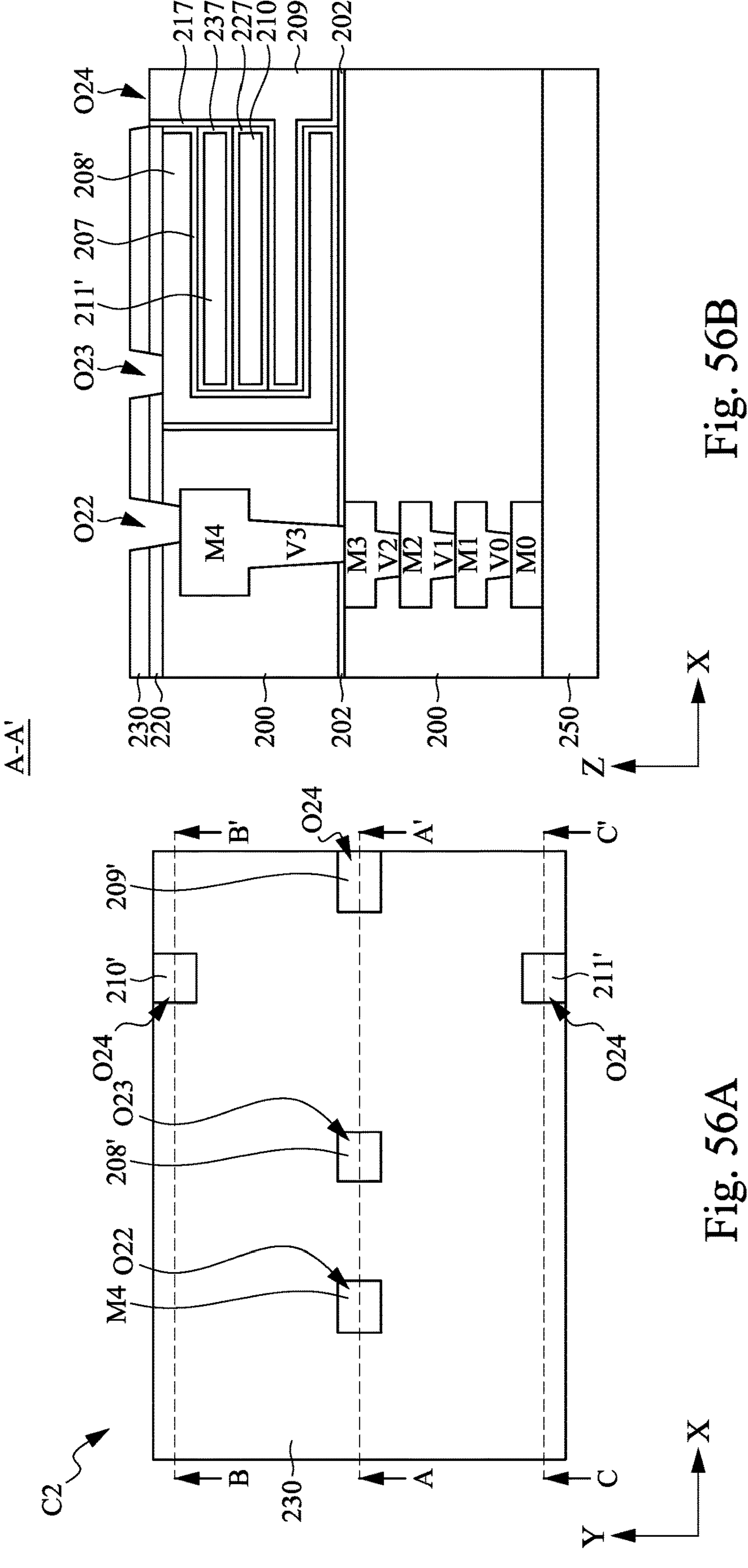
Figures 56C, 56D:
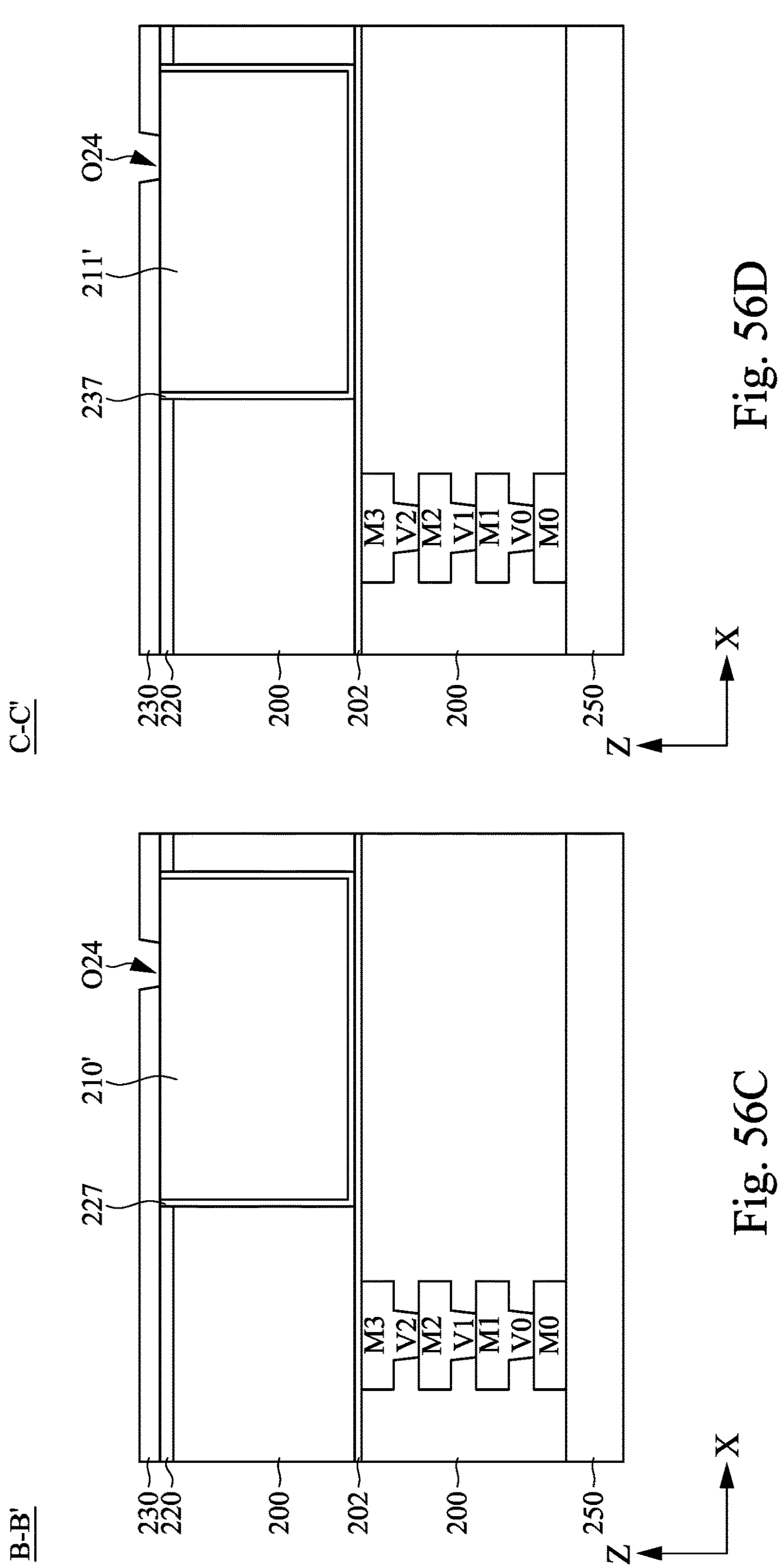

Reference is made to FIGS. 54A, 54B, and 54C. A planarization process P24 (e.g., CMP) is performed to remove the excessive dielectric layer 237 and the conductive material 211 (see FIGS. 53B and 53C) above the hard mask layer 220 to form an electrode 211' of the vertically stacked multi-layer MIM capacitor C2 in the capacitor trench T24 (see FIG. 52C) and the capacitor recesses R25 (see FIG. 52B). The hard mask layer 220 may also act as an etch stop layer for etching the dielectric layer 237 and the conductive material 211. In some embodiments, the dielectric layers 207, 217, 227, and 237 can be collectively referred to as an insulator 207' of the vertically stacked multi-layer MIM capacitor C2. As a result of this method, the vertically stacked multi-layer MIM capacitor C2 may include the electrodes 208', 209', 210', and 211' and the insulator 207' sandwiched between any two of the electrodes 208', 209', 210', and 211'. In other words, any two of the electrodes 208', 209', 210', and 211' can be spaced apart from each other by the insulator 207'. In some embodiments, the insulator 207' may have a thickness in a range from about 0.1 nm to about 100 nm, such as about 0.1, 1, 10, or 100 nm. In some embodiments, the vertically stacked multi-layer MIM capacitor C2 may have a lateral dimension D21 (see FIG. 54B) in X-direction and in a range from about 1 nm to about 10 mm, such as about 1 nm, 10 nm, 100 nm, 1 μm, 10 μm, 100 μm, 1 mm, or 10 mm. In some embodiments, the vertically stacked multi-layer MIM capacitor C2 may have a lateral dimension D22 (see FIG. 54A) in Y-direction and in a range from about 1 nm to about 10 mm, such as about 1 nm, 10 nm, 100 nm, 1 μm, 10 μm, 100 μm, 1 mm, or 10 mm. In some embodiments, the vertically stacked multi-layer MIM capacitor C2 may have a vertical dimension D23 (see FIG. 54C) in Z-direction and in a range from about 1 nm to about 10 mm, such as about 1 nm, 10 nm, 100 nm, 1 μm, 10 μm, 100 μm, 1 mm, or 10 mm. In some embodiments, from a top view, the vertically stacked multi-layer MIM capacitor C2 may be a cylinder, cuboid, thin film, or any suitable geometry, with or without rounded corners.

This is described in greater detail with reference to FIG. 54B, after the planarization process P24, the electrode 208' can include two lateral portions 208*a* and 208*b* formed in the capacitor recesses R21 and R22 (see FIG. 36B) and one vertical portion 208*c* formed in the capacitor trench T21 (see FIG. 36B). The lateral portions 208*a* and 208*b* can laterally extend from the vertical portion 208*c* in X-direction from the cross-sectional view, and the vertical portion 208*c* can laterally extend in Y-direction. The electrode 209' can include one lateral portion 209*a* formed in the capacitor recess R23 (see FIG. 42B) and interposing the lateral portions 208*a*, 208*b* and one vertical portion 209*c* formed in the capacitor trench T22 (see FIG. 42B). The lateral portion 209*a* can laterally extend from the vertical portion 209*b* in X-direction and toward the vertical portion 208*c* of the electrode 208' from the cross-sectional view, and the vertical portion 209*b* can laterally extend in Y-direction from the top view as shown in FIG. 54A. The electrode 210' can include one lateral portion 210*a* formed in the capacitor recesses R24 (see FIG. 47B) and interposing the lateral portion 209*a* of the electrode 209' and the lateral portions 208*b* of the electrode 208' and one vertical portion 210*b* formed in the capacitor trench T23 (see FIG. 47C). The lateral portion 210*a* can laterally extend from the vertical portion 210*b* in Y-direction, and the vertical portion 210*b* can laterally extend in X-direction from the top view as shown in FIG. 54A. The electrode 211' can include one lateral portion 211*a* formed in the capacitor recesses R25 (see FIG. 52B) and interposing the lateral portion 210*a* of the electrode 210' and the lateral portions 208*b* of the electrode 208' and one vertical portion 211*b* formed in the capacitor trench T24 (see FIG. 52C). The lateral portion 210*a* can laterally extend from the vertical portion 210*b* in Y-direction and toward the vertical portion 209*b* of the electrode 209', and the vertical portion 210*b* can laterally extend in X-direction from the top view as shown in FIG. 54A. In some embodiments, at least two of the lateral portions 208*a*, 208*b*, 209*a*, 209*b*, 210*a*, and 211*a* may have different thicknesses. In some embodiments, at least two of the lateral portions 208*a*, 208*b*, 209*a*, 209*b*, 210*a*, and 211*a* may have a same thickness. By way of example and not limitation, the lateral portions 208*a*, 208*b*, 209*a*, 209*b*, 210*a*, and/or 211*a* may have a thickness T2 in a range from about 0.1 nm to about 1 μm, such as about 0.1, 1, 10, 100, or 1000 nm.

Therefore, the present disclosure in various embodiments provides a vertically stacked multi-layer MIM capacitor C2 that includes vertically stacked interleaved lateral portions 208*a*, 208*b*, 209*a*, 209*b*, 210*a*, and 211*a*. An advantage is that the capacitor C2 including vertically stacked interleaved electrodes can increase the overlap area therebetween, such that the capacitance of the capacitor C2 can be improved. In addition, the capacitor C2 may include multiple electrodes that can adjust capacitance depending on providing different voltage potentials to the electrodes.

Reference is made to FIGS. 55A, 55B, 55C, and 55D. A dielectric layer 230 is deposited over the capacitance of the capacitor C2 and the IMD structure 200. In some embodiments, the dielectric layer 230 may be made of silicon oxide, silicon nitride, silicon oxynitride, silicon carbide, silicon oxycarbide (SiOC), tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric layer 230 may be deposited using any suitable method, such as CVD, physical vapor deposition (PVD), ALD, PEALD, PECVD, SACVD, FCVD, spin-on, and/or the like, or a combination thereof. In some embodiments, the dielectric layer 230 may be made of the same material as the hard mask layer 220, thereby resulting in a substantially indistinguishable interface between the dielectric layer 23 and the hard mask layer 220. In some embodiments, the dielectric layer 230 may be made of a different material than the hard mask layer 220.

Reference is made to FIGS. 56A, 56B, 56C, and 56D. A contact opening O22 are formed down through the dielectric layer 230, the hard mask layer 220, and the IMD 200 to expose the full metallization stack, and a capacitor contact openings O23 are formed down through the dielectric layer 230 and the hard mask layer 220 to expose the electrode 208', and a plurality of capacitor contact openings O24 are formed down through the dielectric layer 230 to expose the electrodes 209', 210', and 211'.

Reference is made to FIGS. 57A, 57B, 57C, and 57D. A conductive material is deposited over the dielectric layer 230 to fill the contact opening O22 and the capacitor contact openings O23 and O24. Subsequently, a planarization process (e.g., CMP) is performed to remove the excess conductive material from above a top surface of the dielectric layer 230. The remaining conductive material fills the contact opening O22 to serve as the contacts 240*a* and fills the capacitor contact openings O23, O24 to serve as capacitor contacts 240*b*, 210*c*, 240*d*, and 240*e*. Therefore, the contact 240*a* may land on the full metallization stack, the capacitor contact 240*b* may land on the electrode 208', the capacitor contact 240*c* may land on the electrode 209', the capacitor contact 240*d* may land on the electrode 210', and the capacitor contact 240*e* may land on the electrode 211'. The capacitor contact 240*b* may be used to provide the first voltage potential to the electrode 208', the capacitor contact 240*c* may be used to provide the second voltage potential to the electrode 209', the capacitor contact 240*d* may be used to provide the third voltage potential to the electrode 210', and the capacitor contact 240*e* may be used to provide the fourth voltage potential to the electrode 211'. In some embodiments, at least two of the first, second, third, and fourth voltage potential can be different from each other. In some embodiments, the conductive material may be deposited using any suitable method, such as CVD, physical vapor deposition (PVD), ALD, PEALD, PECVD, SACVD, FCVD, spin-on, and/or the like, or a combination thereof. In some embodiments, the conductive material may include TiN, TaN, Ti, Ta, Cu, Al, Ag, W, Ir, Ru, Pt, combinations thereof, or other suitable conductive materials.

Figures 57A, 57B:
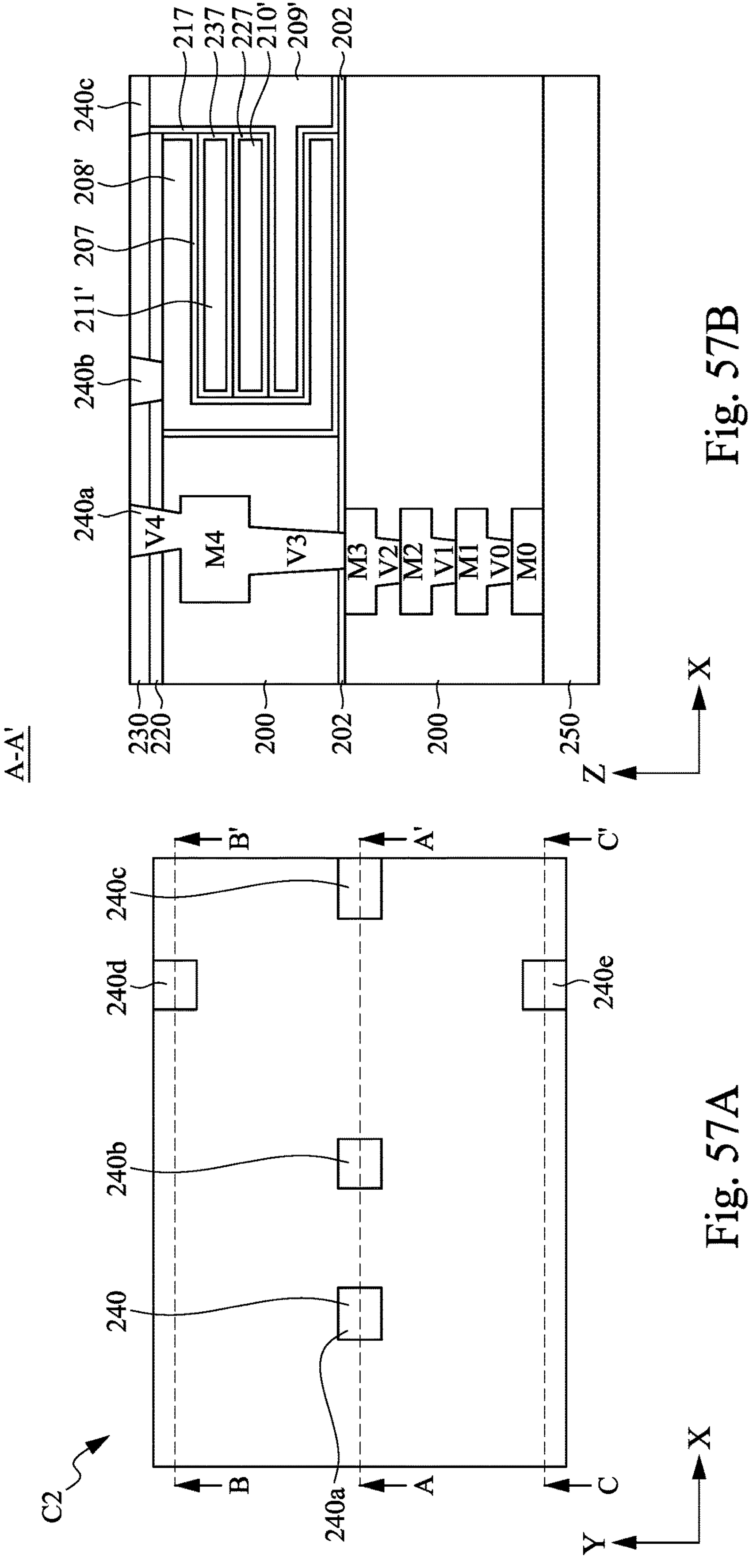
Figures 57C, 57D:
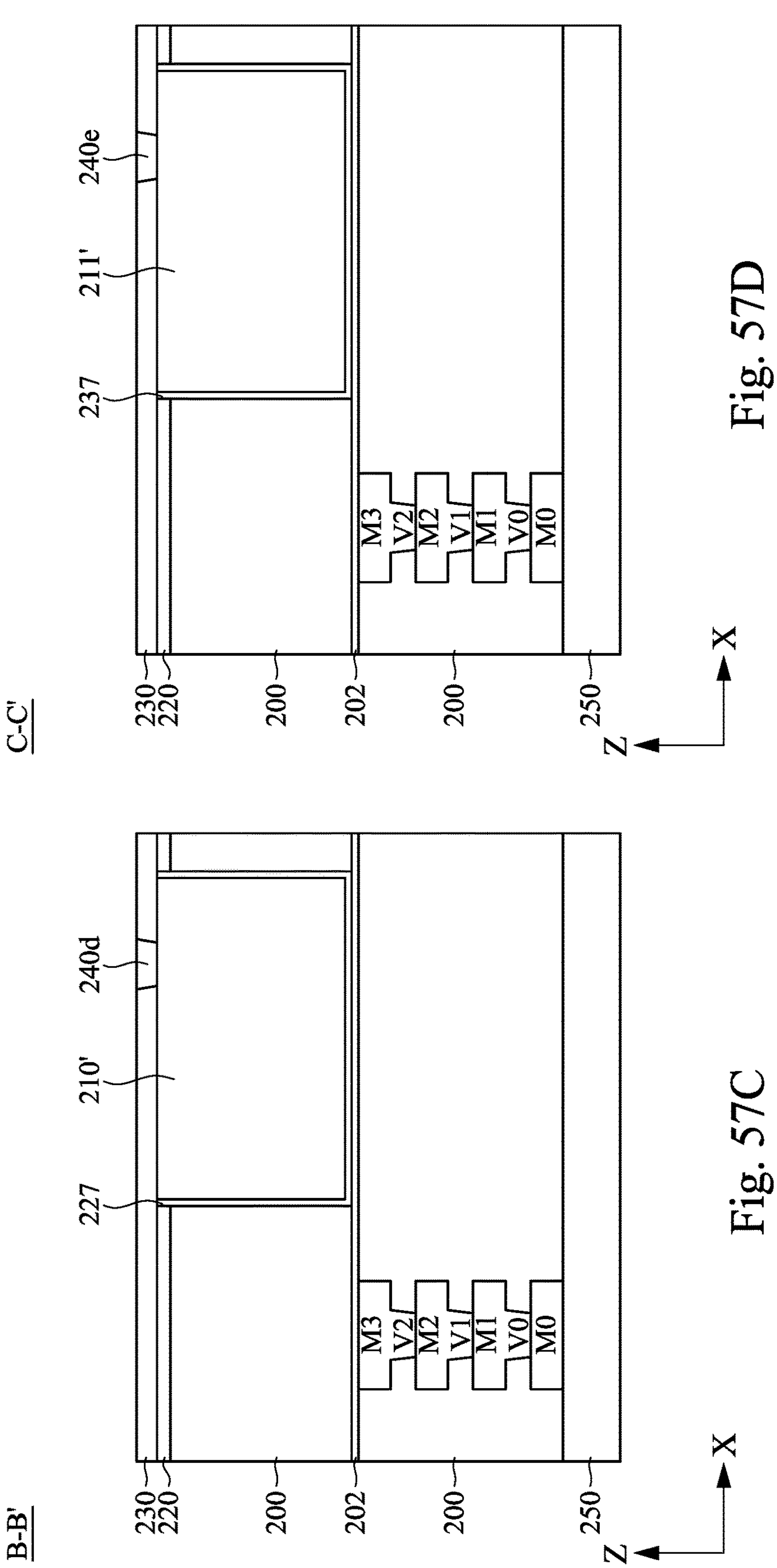
Figure 57E:
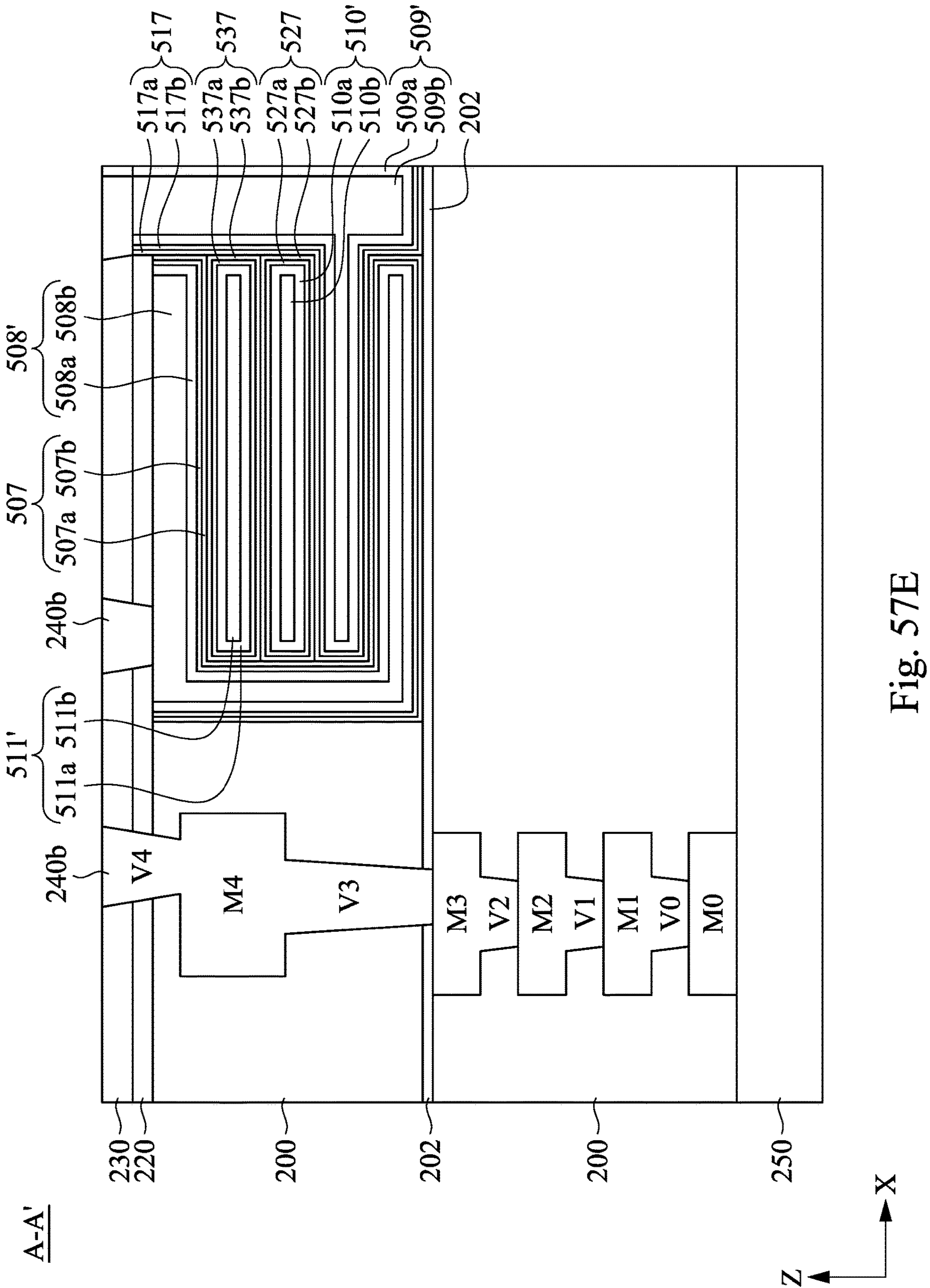
FIGS. 57E, 57F, and 57G illustrate schematic views of a vertically stacked multi-layer MIM capacitor corresponding to FIGS. 57B, 57C, and 57D.
Figure 57F:
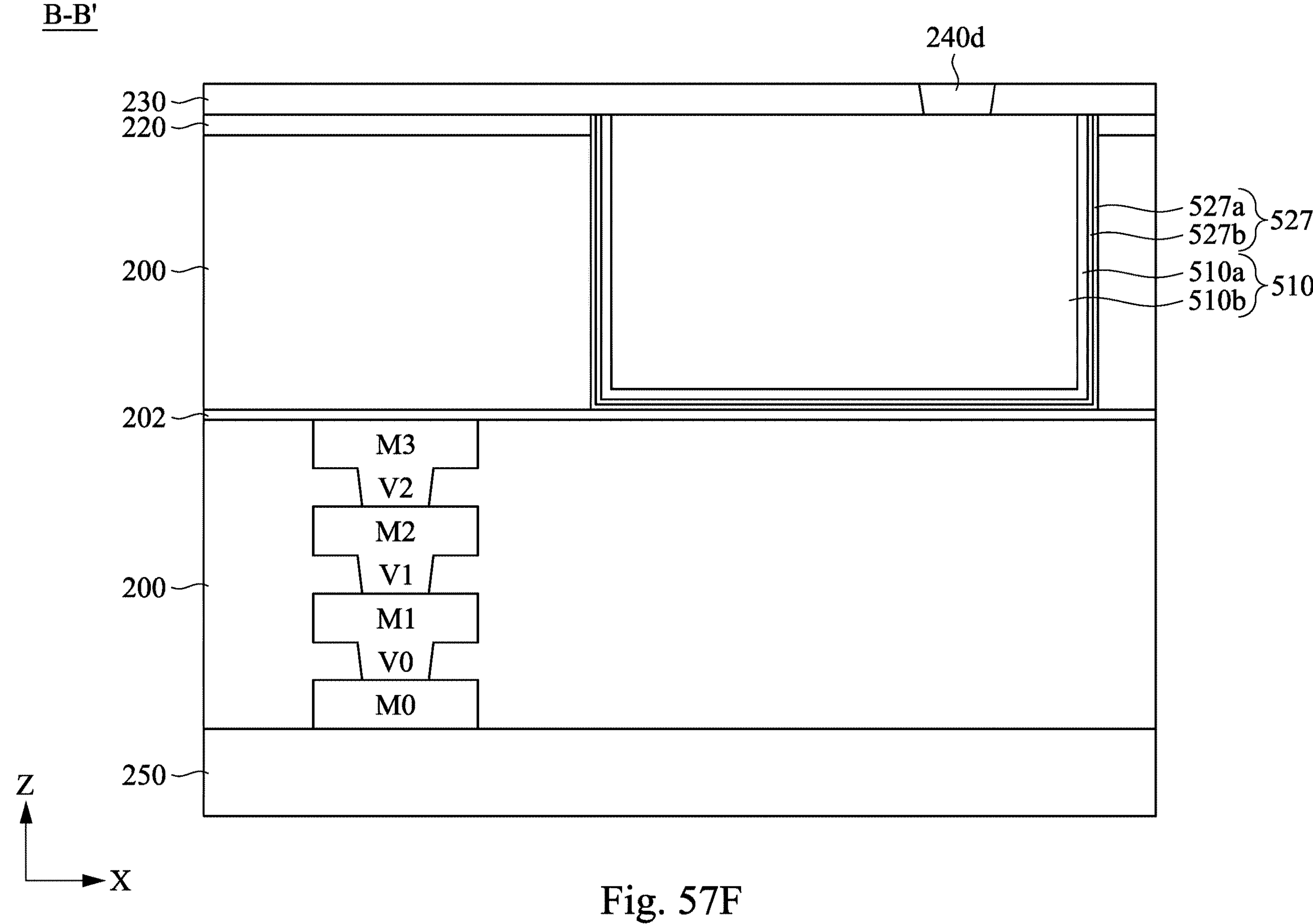
Figure 57G:
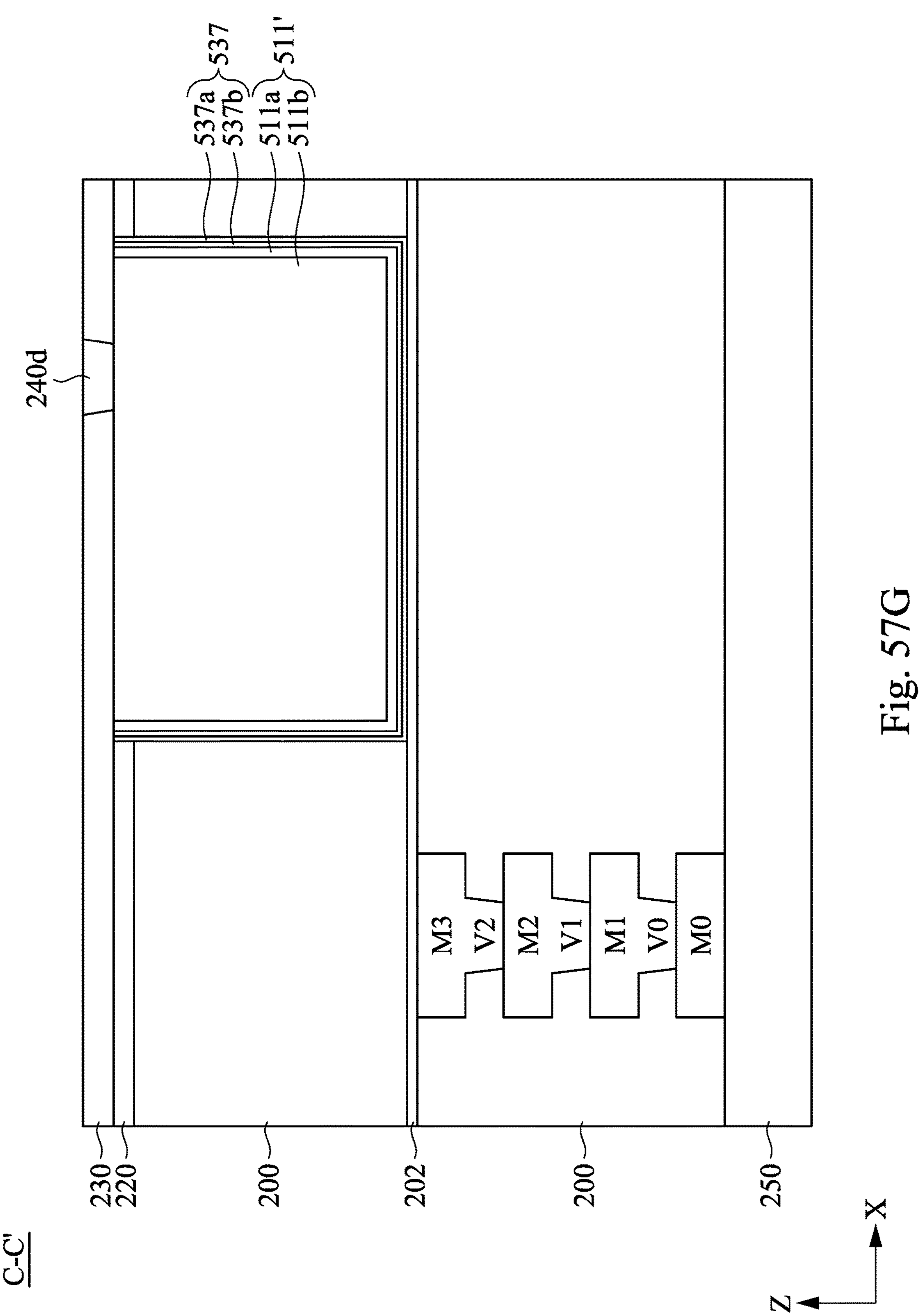

Reference is made to FIGS. 57E, 57F, and 57G. FIGS. 57E, 57F, and 57G illustrate schematic views of a vertically stacked multi-layer MIM capacitor corresponding to FIGS. 57B, 57C, and 57D. The structure and function of the components and their relationships in the semiconductor structure are substantially the same as the semiconductor structure shown in FIGS. 57B, 57C, and 57D, and the related detailed descriptions may refer to the foregoing paragraphs, and are not described again herein. It is noted that, the difference between the present embodiment and the embodiment in FIGS. 57B, 57C, and 57D is in that the dielectric layers 507, 517, 527, and 537 which can be a multilayer structure, and the electrodes 508', 509', 510', and 511' which can be a multilayer structure. For example, the dielectric layer 507 may include layers 507*a* and 507*b* having different materials from each other, the dielectric layer 517 may include layers 517*a* and 517*b* having different materials from each other, the dielectric layer 527 may include layers 527*a* and 527*b* having different materials from each other, and the dielectric layer 537 may include layers 537*a* and 537*b* having different materials from each other. The electrodes 508' may include layers 508*a* and 508*b* having different materials from each other, the electrodes 509' may include layers 509*a* and 509*b* having different materials from each other, the electrodes 510' may include layers 510*a* and 510*b* having different materials from each other, and the electrodes 511' may include layers 511*a* and 511*b* having different materials from each other. Other embodiments may contain more layers in at least one of the dielectric layers 507, 517, 527, and 537 and the electrodes 508', 509', 510', and 511'.

In some embodiments, the layers 507*a*, 507*b*, 517*a*, 517*b*, 527*a*, 527*b*, 537*a*, and/or 537*b* may be made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 136 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In some embodiments, the layers 508*a* 508*b*, 509*a*, 509*b*, 510*a*, 510*b*, 511*a*, and/or 511*b* may be made of, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten nitride (WN), copper (Cu), tungsten (W), ruthenium (Ru), ruthenium oxide (RuO), palladium (Pd), platinum (Pt), cobalt (Co), nickel (Ni), argentum (Ag), Aurum (Au), conductive metal oxides, other suitable materials, or combinations thereof.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a vertically stacked multi-layer MIM capacitor that includes vertically stacked interleaved electrodes. An advantage is that the vertically stacked interleaved electrodes of the capacitor can increase the overlap area therebetween, such that the capacitance of the capacitor can be improved. Another advantage is that vertically stacked multi-layer MIM capacitor may include multiple electrodes that can adjust capacitance depending on providing different voltage potentials to the electrodes.

In some embodiments, a method includes forming a sacrificial multi-layer stack including first, second, and third sacrificial layers stacked in a vertical direction on a substrate; removing the first sacrificial layer to form a first space; depositing a first dielectric layer and a first electrode material in the first space; removing the second sacrificial layer to form a second space; depositing a second dielectric layer and a second electrode material in the second space; removing the third sacrificial layer to form a third space; depositing a third dielectric layer and a third electrode material in the third space. In some embodiments, forming the sacrificial multi-layer stack comprises: depositing first, second, and third sacrificial films on the substrate; patterning the first, second, and third sacrificial films to form a fin-like stack. In some embodiments, the second sacrificial layer is sandwiched between the first and third sacrificial layers. In some embodiments, the first sacrificial layer is made of a first material, the second sacrificial layer is made of a second material, and the third sacrificial layer is made of a third material, the first, second, and third materials are different from each other. In some embodiments, the first sacrificial layer is made of a semiconductor material comprising silicon, germanium, silicon germanium, silicon carbide, silicon germanium carbide, germanium-tin, silicon-tin, silicon germanium-tin, gallium arsenide, indium gallium arsenide, indium arsenide, indium phosphide, indium antimonide, gallium arsenic phosphide, or gallium indium phosphide, or combinations thereof. In some embodiments, the first sacrificial layer is made of a dielectric material comprising silicon oxide, silicon nitride, silicon oxynitride, silicon carbide, silicon oxycarbide, or combinations thereof. In some embodiments, the first dielectric layer is made of a high-k dielectric material. In some embodiments, the first dielectric layer, the second dielectric layer, or the third dielectric layer is a multilayer structure, and the first electrode material, the second electrode material, or the third electrode material is a multilayer structure. In some embodiments, the method further includes forming a fourth sacrificial layer vertically stacked on the third sacrificial layer; removing the fourth sacrificial layer to form a fourth space; depositing a fourth dielectric layer and a fourth electrode material in the fourth space. In some embodiments, the method further includes forming metallization layers on the substrate prior to forming the sacrificial multi-layer stack.

In some embodiments, a method includes forming a sacrificial multi-layer stack including a plurality of sacrificial layers stacked in a vertical direction on a substrate;

depositing a dielectric material over the sacrificial multi-layer stack; etching the dielectric material to form a first trench exposing a first side of the sacrificial multi-layer stack and extending in a first direction from a top view; removing a first one of the sacrificial layers exposed by the first trench to form a first space communicating with the first trench; depositing a first high-k dielectric layer and a first electrode material in the first trench and the first space; etching the dielectric material to form a second trench exposing a second side of the sacrificial multi-layer stack and extending in a second direction perpendicular to the first direction from the top view; removing a second one of the sacrificial layers exposed by the second trench to form a second space communicating with the second trench; forming a second electrode material in the second trench and the second space. In some embodiments, the method further includes before forming the second electrode material, conformally depositing a second high-k dielectric layer in the second trench and the second space. In some embodiments, the method further includes etching the dielectric material to form a third trench exposing a third side of the sacrificial multi-layer stack opposite to the first side of the sacrificial multi-layer stack; removing a third one of the sacrificial layers exposed by the third trench to form a third space communicating with the third trench; forming a third electrode material in the third trench and the third space. In some embodiments, the first high-k dielectric layer includes hafnium oxide, hafnium silicon oxide, hafnium silicon oxynitride, hafnium tantalum oxide, hafnium titanium oxide, hafnium zirconium oxide, lanthanum oxide, zirconium oxide, titanium oxide, tantalum oxide, yttrium oxide, strontium titanium oxide, barium titanium oxide, barium zirconium oxide, hafnium lanthanum oxide, lanthanum silicon oxide, aluminum silicon oxide, aluminum oxide, silicon nitride, oxynitride, or combinations thereof. In some embodiments, the first electrode material comprises tungsten, titanium aluminide, titanium aluminium nitride, carbonitride tantalum, hafnium, zirconium, titanium, tantalum, aluminum, hafnium carbide, zirconium carbide, titanium carbide, aluminum carbide, aluminides, titanium nitride, tungsten nitride, copper, ruthenium, ruthenium oxide, palladium, platinum, cobalt, nickel, argentum, Aurum, or combinations thereof.

In some embodiments, the semiconductor structure includes a first capacitor and a second capacitor. The first capacitor includes first and second electrodes. The first electrode of the first capacitor includes a first vertical portion on a substrate and a first lateral portion laterally extending from the first vertical portion. The second electrode of the first capacitor is spaced apart from the first electrode and includes a second vertical portion on the substrate and a second lateral portion laterally extending from the second vertical portion. The second capacitor includes the second electrode and a third electrode. The third electrode of the second capacitor is spaced apart from the first and second electrodes and includes a third vertical portion on the substrate and a third lateral portion laterally extending from the third vertical portion. The second lateral portion of the second electrode is sandwiched between the first lateral portion of the first electrode and the third lateral portion of the third electrode. In some embodiments, the semiconductor structure further includes a third capacitor. The third capacitor includes the third electrode and a fourth electrode. The fourth electrode of the third capacitor is spaced apart from the first, second, and third electrodes and includes a fourth vertical portion on the substrate and a fourth lateral portion laterally extending from the fourth vertical portion and vertically stacked with the first, second, and third lateral portions of the first, second, and third electrodes. In some embodiments, the semiconductor structure further includes an insulator interposing the first, second, and third electrodes. In some embodiments, the insulator is made of a high-k dielectric material. In some embodiments, the semiconductor structure further includes a plurality of metal lines and a plurality of metal vias alternating arranged in a direction perpendicular to a top surface of the substrate. The metal lines and the metal vias are arranged in a position above a bottom surface of the first electrode and below a top surface of the first electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a sacrificial multi-layer stack including first, second, and third sacrificial layers stacked in a vertical direction on a substrate;

removing the first sacrificial layer to form a first space;

depositing a first dielectric layer and a first electrode material in the first space;

removing the second sacrificial layer to form a second space;

after depositing the first dielectric layer and the first electrode material, depositing a second dielectric layer and a second electrode material in the second space;

removing the third sacrificial layer to form a third space; and after depositing the second dielectric layer and the second electrode material, depositing a third dielectric layer and a third electrode material in the third space.

2. The method of claim 1, wherein forming the sacrificial multi-layer stack comprises:

depositing first, second, and third sacrificial films on the substrate; and patterning the first, second, and third sacrificial films to form a fin-like stack.

3. The method of claim 1, wherein the second sacrificial layer is sandwiched between the first and third sacrificial layers.

4. The method of claim 1, wherein the first sacrificial layer is made of a first material, the second sacrificial layer is made of a second material, and the third sacrificial layer is made of a third material, the first, second, and third materials are different from each other.

5. The method of claim 1, wherein the first sacrificial layer is made of a semiconductor material comprising silicon, germanium, silicon germanium, silicon carbide, silicon germanium carbide, germanium-tin, silicon-tin, silicon germanium-tin, gallium arsenide, indium gallium arsenide, indium arsenide, indium phosphide, indium antimonide, gallium arsenic phosphide, gallium indium phosphide, or combinations thereof.

6. The method of claim 5, wherein the first sacrificial layer is made of a dielectric material comprising silicon oxide, silicon nitride, silicon oxynitride, silicon carbide, silicon oxycarbide, or combinations thereof.

7. The method of claim 1, wherein the first dielectric layer is made of a high-k dielectric material.

8. The method of claim 1, wherein the first dielectric layer, the second dielectric layer, or the third dielectric layer is a multilayer structure, and the first electrode material, the second electrode material, or the third electrode material is a multilayer structure.

9. The method of claim 1, further comprises:

forming a fourth sacrificial layer vertically stacked on the third sacrificial layer;

removing the fourth sacrificial layer to form a fourth space; and depositing a fourth dielectric layer and a fourth electrode material in the fourth space.

10. The method of claim 1, further comprises:

forming metallization layers on the substrate prior to forming the sacrificial multi-layer stack.

11. A method, comprising:

forming a sacrificial multi-layer stack including a plurality of sacrificial layers stacked in a vertical direction on a substrate;

depositing a dielectric material over the sacrificial multi-layer stack;

etching the dielectric material to form a first trench exposing a first side of the sacrificial multi-layer stack, wherein the first trench has a maximum dimension extending in a first direction from a top view;

removing a first one of the sacrificial layers exposed by the first trench to form a first space communicating with the first trench;

depositing a first high-k dielectric layer and a first electrode material in the first trench and the first space;

etching the dielectric material to form a second trench exposing a second side of the sacrificial multi-layer stack, wherein the second trench has a maximum dimension extending in a second direction perpendicular to the first direction from the top view;

removing a second one of the sacrificial layers exposed by the second trench to form a second space communicating with the second trench; and forming a second electrode material in the second trench and the second space.

12. The method of claim 11, further comprising:

before forming the second electrode material, conformally depositing a second high-k dielectric layer in the second trench and the second space.

13. The method of claim 11, further comprising:

etching the dielectric material to form a third trench exposing a third side of the sacrificial multi-layer stack opposite to the first side of the sacrificial multi-layer stack;

removing a third one of the sacrificial layers exposed by the third trench to form a third space communicating with the third trench; and forming a third electrode material in the third trench and the third space.

14. The method of claim 11, wherein the first high-k dielectric layer comprises hafnium oxide, hafnium silicon oxide, hafnium silicon oxynitride, hafnium tantalum oxide, hafnium titanium oxide, hafnium zirconium oxide, lanthanum oxide, zirconium oxide, titanium oxide, tantalum oxide, yttrium oxide, strontium titanium oxide, barium titanium oxide, barium zirconium oxide, hafnium lanthanum oxide, lanthanum silicon oxide, aluminum silicon oxide, aluminum oxide, silicon nitride, oxynitride, or combinations thereof.

15. The method of claim 11, wherein the first electrode material comprises tungsten, titanium aluminide, titanium aluminium nitride, carbo-nitride tantalum, hafnium, zirconium, titanium, tantalum, aluminum, hafnium carbide, zirconium carbide, titanium carbide, aluminum carbide, aluminide, titanium nitride, tungsten nitride, copper, ruthenium, ruthenium oxide, palladium, platinum, cobalt, nickel, argentum, Aurum, or combinations thereof.

16. A method, comprising:

forming a first capacitor over a substrate, the first capacitor comprising:

a first electrode comprising a first vertical portion and a first lateral portion laterally extending from the first vertical portion; and a second electrode spaced apart from the first electrode and comprising a second vertical portion and a second lateral portion laterally extending from the second vertical portion, wherein a bottom surface of the second vertical portion of the second electrode is lower than a bottom surface of the first lateral portion of the first electrode; and forming a second capacitor over the substrate, the second capacitor comprising:

the second electrode; and a third electrode spaced apart from the first and second electrodes and comprising a third vertical portion and a third lateral portion laterally extending from the third vertical portion, wherein the second lateral portion of the second electrode is sandwiched between the first lateral portion of the first electrode and the third lateral portion of the third electrode.

17. The method of claim 16, further comprising:

forming a third capacitor over the substrate, the third capacitor comprising the third electrode and a fourth electrode, the fourth electrode spaced apart from the first, second, and third electrodes, and comprising:

a fourth vertical portion on the substrate; and a fourth lateral portion laterally extending from the fourth vertical portion and vertically stacked with the first, second, and third lateral portions of the first, second, and third electrodes.

18. The method of claim 16, further comprising:

forming an insulator such that the insulator interposes the first, second, and third electrodes.

19. The method of claim 18, wherein the insulator is made of a high-k dielectric material.

20. The method of claim 16, further comprising:

forming a plurality of metal lines and a plurality of metal vias alternating arranged in a direction perpendicular to a top surface of the substrate, wherein the metal lines and the metal vias are arranged in a position above a bottom surface of the first electrode and below a top surface of the first electrode.

* * * * *